(12) United States Patent
Fujii et al.

(10) Patent No.: US 8,749,019 B2
(45) Date of Patent: *Jun. 10, 2014

(54) REGION-DIVIDED SUBSTRATE, SEMICONDUCTOR DEVICE HAVING REGION-DIVIDED SUBSTRATE, AND METHOD FOR MANUFACTURING THE SAME

(75) Inventors: Tetsuo Fujii, Toyohashi (JP); Keisuke Gotoh, Obu (JP); Masaya Tanaka, Gifu (JP)

(73) Assignee: DENSO CORPORATION, Kariya (JP)

( * ) Notice: Subject to any disclaimer, the term of this patent is extended or adjusted under 35 U.S.C. 154(b) by 39 days.

This patent is subject to a terminal disclaimer.

(21) Appl. No.: 13/410,455

(22) Filed: Mar. 2, 2012

(65) Prior Publication Data

US 2012/0223410 A1 Sep. 6, 2012

(30) Foreign Application Priority Data

Mar. 4, 2011 (JP) .................................. 2011-48074

(51) Int. Cl.
*H01L 21/70* (2006.01)
*H01L 21/8238* (2006.01)

(52) U.S. Cl.
USPC ......................................... 257/502; 438/219

(58) Field of Classification Search
USPC ........... 257/499, 521, 502–507; 438/107, 456
See application file for complete search history.

(56) References Cited

U.S. PATENT DOCUMENTS

| 6,936,491 | B2 | 8/2005 | Partridge et al. |
| 7,560,802 | B2 | 7/2009 | Kalvesten et al. |
| 7,859,091 | B2 * | 12/2010 | Fujii et al. ..................... 257/684 |
| 8,455,973 | B2 * | 6/2013 | Fuji et al. ...................... 257/502 |
| 2004/0031973 | A1 * | 2/2004 | Cognetti et al. .............. 257/202 |
| 2004/0245586 | A1 | 12/2004 | Partridge et al. |
| 2008/0290490 | A1 | 11/2008 | Fujii et al. |
| 2010/0283130 | A1 * | 11/2010 | Nishio et al. .................. 257/621 |
| 2011/0133295 | A1 | 6/2011 | Fujii et al. |

FOREIGN PATENT DOCUMENTS

| JP | A-H10-92702 | 4/1998 |
| JP | A-2002-043502 | 2/2002 |
| JP | A-2002-299372 | 10/2002 |
| JP | A-2004-333133 | 11/2004 |

OTHER PUBLICATIONS

Office Action mailed Oct. 11, 2012 in corresponding U.S. Appl. No. 12/902,696.

* cited by examiner

*Primary Examiner* — Calvin Lee
(74) *Attorney, Agent, or Firm* — Posz Law Group, PLC

(57) ABSTRACT

A region-divided substrate includes: a substrate having a first surface and a second surface opposite to the first surface and having a plurality of partial regions, which are divided by a plurality of trenches, wherein each trench penetrates the substrate from the first surface to the second surface; a conductive layer having an electrical conductivity higher than the substrate and disposed on a sidewall of one of the plurality of partial regions from the first surface to the second surface; and an insulator embedded in each trench.

21 Claims, 30 Drawing Sheets

REGION-DIVIDED SUBSTRATE, SEMICONDUCTOR DEVICE HAVING REGION-DIVIDED SUBSTRATE, AND METHOD FOR MANUFACTURING THE SAME

CROSS REFERENCE TO RELATED APPLICATION

This application is a continuation of U.S. patent application Ser. No. 12/902,696, filed Oct. 12, 2010, now U.S. Pat. No. 8,455,973 issued May 26, 2013, and claims priority from and the benefit of Japan Patent Application No. 2011-048074, filed on Mar. 4, 2011, the disclosure of which is incorporated herein by reference.

TECHNICAL FIELD

The present disclosure relates to a region-divided substrate, in which a substrate is divided into a plurality of regions by a trench and the regions are usable as extraction conductive regions, a semiconductor device having the same, and a manufacturing method of the same.

BACKGROUND

In Japanese Unexamined Patent Application Publication No. 2006-521022 (Patent Document 1), a substrate is disclosed in which a conductive or semi-conductive substrate is divided into a plurality of partial regions by a trench extending through the substrate and the foregoing partial regions are used as electrically connecting members. In Japanese Unexamined Patent Publication No. 2008-229833 (Patent Document 2), a semiconductor device is disclosed in which the same substrate as described above is used as a cap substrate opposing a base substrate and bonded thereto and a predetermined one of the partial regions mentioned above functions as a conductive region extracted from the base substrate.

FIGS. 32A and 32B show an example of the semiconductor device disclosed in Patent Document 2, of which FIG. 32A is a schematic cross-sectional view of a semiconductor device 91 and FIG. 32B is a schematic top view of the semiconductor device 91. The cross-sectional view of FIG. 32A shows a cross section along a dash-dot line XXXIIA-XXXIIA of FIG. 32B, which is arbitrarily extended/contracted along the section line and simplified for clear illustration. Note that, in FIG. 32B, a movable electrode Em and a stationary electrode Es in the semiconductor device 91 are shown in a simplified manner, but actually have comb-like shapes to be interdigitated.

FIGS. 33A and 33B are views showing a base substrate B2 of the semiconductor device 91 of FIGS. 32A and 32B, of which FIG. 33A is a cross-sectional view of the base substrate B2 and FIG. 33B is a top view of the base substrate B2. FIGS. 34A and 34B are views showing a cap substrate C2 of the semiconductor device 91 of FIGS. 32A and 32B, of which FIG. 34A is a cross-sectional view of the cap substrate C2 and FIG. 34B is a top view of the cap substrate C2. Note that, in FIGS. 32A to 34B, the cross-sectional views of FIGS. 32A, 33A, and 34A correspond to each other, and the top views of FIGS. 32B, 33B, and 34B correspond to each other. Also, in FIGS. 32A to 34B, the section lines shown by the dash-dot lines XXXIIA-XXXIIA correspond to each other.

The semiconductor device 91 shown in FIGS. 32A and 32B has the base substrate B2 made of a semiconductor, and the cap substrate C2 having electrical conductivity to be bonded to the base substrate B2.

As shown in FIGS. 33A and 33B, the base substrate B2 in the semiconductor device 91 of FIGS. 32A and 32B is a SOI (Silicon On Insulator) substrate having a buried oxide film 20, and includes a SOI layer 21 and a support substrate 22 between which the buried oxide film 20 is interposed. In the surface layer portion of the base substrate B2, a plurality of dielectrically isolated base semiconductor regions Bs are formed. That is, the base semiconductor regions Bs of the semiconductor device 91 are each formed of the SOI layer 21, and dielectrically isolated from the surroundings by trenches 23 reaching the buried oxide film 20.

The semiconductor device 91 has dynamic quantity sensor elements each using an inertial force, and the dynamic quantity sensor elements each for measuring an acceleration or an angular velocity are formed of the plurality of base semiconductor regions Bs formed in the surface layer portion of the base substrate B2 in a predetermined region R1 of the base substrate B2. That is, of the plurality of base semiconductor regions Bs in the base substrate B2, base semiconductor regions Bs1 shown in the drawings serve as movable semiconductor regions having movable electrodes Em formed to be displaceable by sacrificially etching part of the buried oxide film 20. On the other hand, the other base semiconductor regions Bs2 shown in the drawings serve as stationary semiconductor regions having stationary electrodes Es opposing the movable electrodes Em. Note that the two movable semiconductor regions Bs1 and the two stationary semiconductor regions Bs2 which are shown in the cross-sectional view of FIG. 33A form respective integrally coupled regions in a two-dimensional configuration, as shown in FIG. 33B. In the semiconductor device 91, the opposing surfaces of the movable electrode Em of the movable semiconductor regions Bs1 and the stationary electrode Es of the stationary semiconductor regions Bs form an electrostatic capacitance. The movable electrode Em is displaced in a direction perpendicular to the opposing surfaces in accordance with a dynamic quantity applied thereto to measure a change in the electrostatic capacitance resulting from a distance change between the movable electrode Em and the stationary electrode Es, and detect the applied dynamic quantity.

As shown in FIGS. 34A and 34B, the cap substrate C2 in the semiconductor device 91 of FIGS. 32A and 32B is formed of a single-crystal silicon substrate 30, and a plurality of cap conductive regions (partial regions) Ce are formed therein. That is, the cap conductive regions Ce in the semiconductor device 91 result from the division of the cap substrate C2 (single-crystal silicon substrate 30) by dielectric isolation trenches 31 extending therethrough. Note that, in the cap substrate C2, the portion denoted by a reference numeral 33 is a surface protective layer formed of a silicon dioxide ($SiO_2$) film or the like, and the portions each denoted by a reference numeral 34 are electrode pads made of aluminum (Al) or the like.

As shown in FIGS. 32A and 32B, in the semiconductor device 91, a projecting portion T1 formed of a conductive film 50 of conductive polysilicon containing an impurity at a high concentration, metal, or the like is formed on the base semiconductor region Bs in the predetermined region R1. The cap substrate C2 is bonded to the projecting portion T1 of the base substrate B2 to form a junction surface D1. The junction surface D1 between the base substrate B2 and the cap substrate C2 is set to be annular in the predetermined region R1 of the base substrate B2. The space formed by the surface of the predetermined region R1 in the base substrate B2 and the surface of the cap substrate C2 as a result of the bonding together of the base substrate B2 and the cap substrate C2 described above is sealed in a high-vacuum state or in a predetermined atmosphere (such as $N_2$) under pressure. By the bonding together described above, predetermined cap conductive regions Ce1 and Ce2 illustrated in the drawing function as extraction conductive regions electrically connected to the predetermined base semiconductor regions Bs2 and Bs2. That is, to the movable semiconductor region Bs1 and the stationary semiconductor region Bs2 in the base substrate B2, the extraction conductive regions Ce1 and Ce2 are connected respectively via the conductive film 50.

The semiconductor device 91 shown in FIGS. 32A and 32B uses the single-crystal silicon substrate 30 as the cap substrate C2 to be bonded in opposing relation to the base substrate B2, and the predetermined cap conductive regions (partial regions) Ce1 and Ce2 function as the conductive regions extracted from the base substrates B1 and B2. The foregoing semiconductor device 91 can be formed as a semiconductor device having reduced mounting restrictions which can be manufactured in a small size at low cost and which allows the dynamic quantity sensor elements formed in the surface layer portion of the base substrate B2 to be sealed and protected by the foregoing cap substrate C2.

Meanwhile, in the foregoing semiconductor device 91, the single-crystal silicon substrate 30 is used as the mother substrate forming the cap substrate C2. Single-crystal silicon is lower in cost than other substrate materials and easier in trench formation. However, since single-crystal silicon has a relatively high specific resistance, it shows a large resistance value when used in an extraction conductive region so that the range of application thereof as an extraction conductive region is limited.

[Patent Document 1] Japanese Unexamined Patent Application Publication No. 2006-521022, corresponding to US 2008/029049

[Patent Document 2] Japanese Unexamined Patent Publication No. 2008-229833, corresponding to U.S. Pat. No. 7,560,802

SUMMARY

It is an object of the present disclosure to provide a region-divided substrate, in which a substrate is divided into a plurality of regions by a trench and the regions are usable as extraction conductive regions, a semiconductor device having the same, and a manufacturing method of the same. The region-divided substrate according to the present disclosure only benefits from advantages provided by forming conductive layers on the side walls of the foregoing partial regions, while allowing removal of adverse effects resulting from the formation of the conductive layers.

According to a first aspect of the present disclosure, a region-divided substrate includes: a substrate having a first surface and a second surface opposite to the first surface and having a plurality of partial regions, which are divided by a plurality of trenches, wherein each trench penetrates the substrate from the first surface to the second surface; a conductive layer having an electrical conductivity higher than the substrate and disposed on a sidewall of one of the plurality of partial regions from the first surface to the second surface; and an insulator embedded in each trench.

The foregoing region-divided substrate is the region-divided substrate in which the substrate is divided into the plurality of partial regions by the trench extending through the substrate and the foregoing partial regions are usable as the extraction conductive regions and which only benefits from advantages provided by forming the conductive layers on the side walls of the foregoing partial regions, while allowing removal of adverse effects resulting from the formation of the conductive layers.

According to a second aspect of the present disclosure, a semiconductor device includes: the region-divided substrate according to the first aspect, which provides a cap substrate; and a base substrate made of semiconductor and having a plurality of base semiconductor regions, which are isolated from each other, and disposed in a surface portion of the base substrate. The cap substrate is bonded to the base substrate in such a manner that the cap substrate faces a predetermined region of the surface portion of the base substrate. Space between the predetermined region and the cap substrate is sealed, and the one of the plurality of partial regions is an extraction conductive region, which is electrically connected to a predetermined base semiconductor region.

The foregoing semiconductor device is the semiconductor device in which the substrate is divided into the plurality of partial regions by the trench extending through the substrate and the foregoing partial regions are usable as the extraction conductive regions. Accordingly, a small-size and low-cost semiconductor device can be provided in which various elements formed in the surface layer portion of the base substrate are protected by the cap substrate, the resistance value of the extraction conductive region in the cap substrate is small, face-down bonding is also possible, and mounting restrictions have been reduced. In addition, the foregoing semiconductor device only benefits from advantages provided by forming the conductive layers on the side walls of the foregoing partial regions in the cap substrate formed of the region-divided substrate, while allowing removal of adverse effects resulting from the formation of the conductive layers.

According to a third aspect of the present disclosure, a method of manufacturing the region-divided substrate according to the first aspect, includes: forming a first trench on the first surface of the substrate, wherein the first trench has a predetermined depth, and does not penetrates the substrate; forming the conductive layer to cover a sidewall of the trench; removing a part of the conductive layer on the sidewall of the first trench so that the conductive layer is patterned; filling the first trench with the insulator; grinding the first surface of the substrate to expose the substrate or the conductive layer on the substrate so that the first surface of the substrate is prepared; and grinding the second surface of the substrate after the filling of the first trench so that the second surface of the substrate is prepared, and the insulator is exposed so that the conductive layer and the insulator are prepared. Thus, the foregoing region-divided substrate recited in the first aspect can be manufactured.

According to a fourth aspect of the present disclosure, a method of manufacturing the semiconductor device according to the second aspect, includes: preparing the base substrate having the plurality of base semiconductor regions isolated from each other and disposed in the surface portion of the base substrate; preparing the cap substrate provided by the region-divided substrate, which is to be bonded to the base substrate, wherein the plurality of partial regions are divided by the trench penetrating the cap substrate; and bonding the cap substrate and the base substrate in such a manner that the cap substrate faces the predetermined region of the surface portion of the base substrate. Space between the predetermined region and the cap substrate is sealed, and the extraction conductive region is electrically connected to the predetermined base semiconductor region. This allows the foregoing semiconductor device recited in the second aspect to be manufactured.

BRIEF DESCRIPTION OF THE DRAWINGS

The above and other objects, features and advantages of the present disclosure will become more apparent from the following detailed description made with reference to the accompanying drawings. In the drawings:

FIGS. 1A and 1B are views showing an example of a region-divided substrate according to the present disclosure, of which FIG. 1A is a partial top view of a region-divided substrate and FIG. 1B is a cross-sectional view along a dash-dot line IIB-IIB in FIG. 1A;

FIGS. 2A and 2B are views showing an example of a semiconductor device according to the present disclosure using a region-divided substrate similar to the region-divided substrate shown in FIGS. 1A and 1B, of which FIG. 2A is a partial plan view schematically showing a semiconductor device and FIG. 2B is a cross-sectional view schematically showing the semiconductor device;

FIGS. 14A and 14B are views showing an example of another region-divided substrate, of which FIG. 14A is a partial plan view schematically showing a region-divided substrate and FIG. 14B is a cross-sectional view schematically showing the region-divided substrate;

FIGS. 20A and 20B are views showing another variation of the semiconductor device shown in FIGS. 2A and 2B, of which FIG. 20A is a partial plan view schematically showing a semiconductor device and FIG. 20B is a cross-sectional view schematically showing the semiconductor device;

FIGS. 29A and 29B are views showing another variation of the semiconductor device shown in FIGS. 20A and 20B, of which FIG. 29A is a partial plan view schematically showing a semiconductor device and FIG. 29B is a cross-sectional view schematically showing the semiconductor device;

FIGS. 32A and 32B show an example of the semiconductor device disclosed in Patent Document 2, of which FIG. 32A is a schematic cross-sectional view of the semiconductor device and FIG. 32B is a schematic top view of the semiconductor device;

FIGS. 33A and 33B show the base substrate of the semiconductor device of FIGS. 32A and 32B, of which FIG. 33A is a cross-sectional view of the base substrate and FIG. 33B is a top view of the base substrate;

FIGS. 34A and 34B are views showing the cap substrate of the semiconductor device of FIGS. 32A and 32B, of which FIG. 34A is a cross-sectional view of the cap substrate and FIG. 34B is a top view of the cap substrate; and FIGS. 35A and 35B are views showing an example according to a related art, of which FIG. 35A is a partial plan view of the semiconductor device and FIG. 35B is a cross-sectional view thereof along a dash-dot line XXXVB-XXXVB in FIG. 35A.

DETAILED DESCRIPTION

The present inventors have invented a region-divided substrate in which a substrate is divided into a plurality of partial regions by a trench extending through the substrate and the partial regions are usable as extraction conductive regions, a semiconductor device using the same, and manufacturing methods thereof, which are currently under patent pending (Japanese Patent Application No. 2010-176742) as a related art. The region-divided substrate invented by the present inventors is smaller in resistance value than a related-art region-divided substrate when the partial region is used as the extraction conductive region, can use any substrate material that is conductive, semi-conductive, or insulating, and has reduced application restrictions.

Figure 35A:
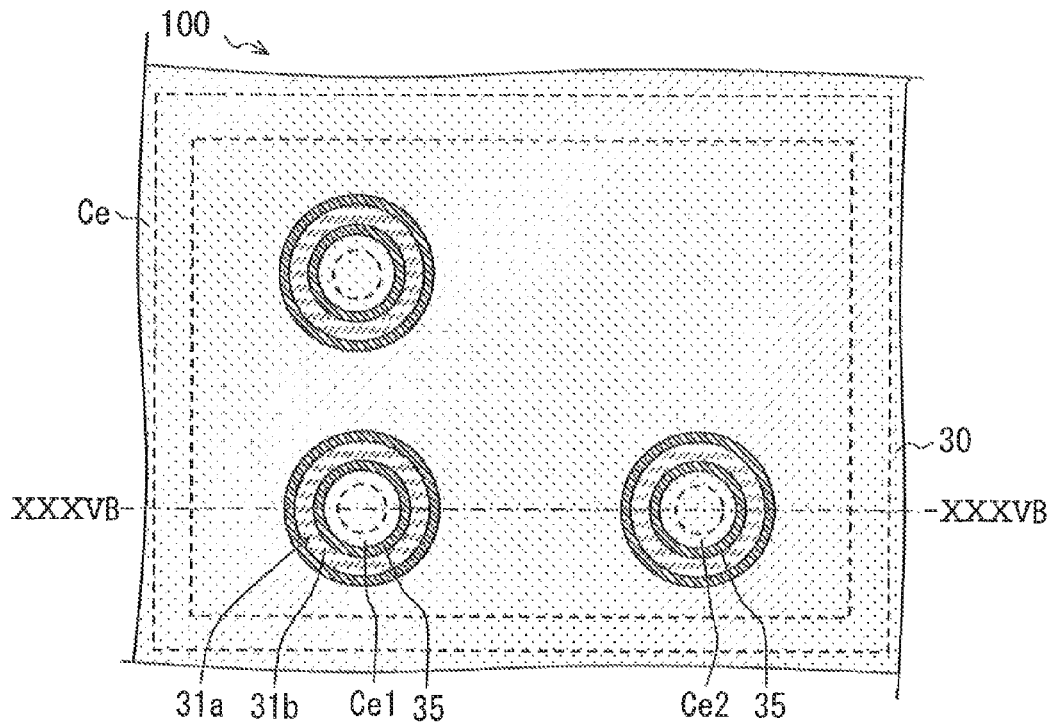
Figure 35B:
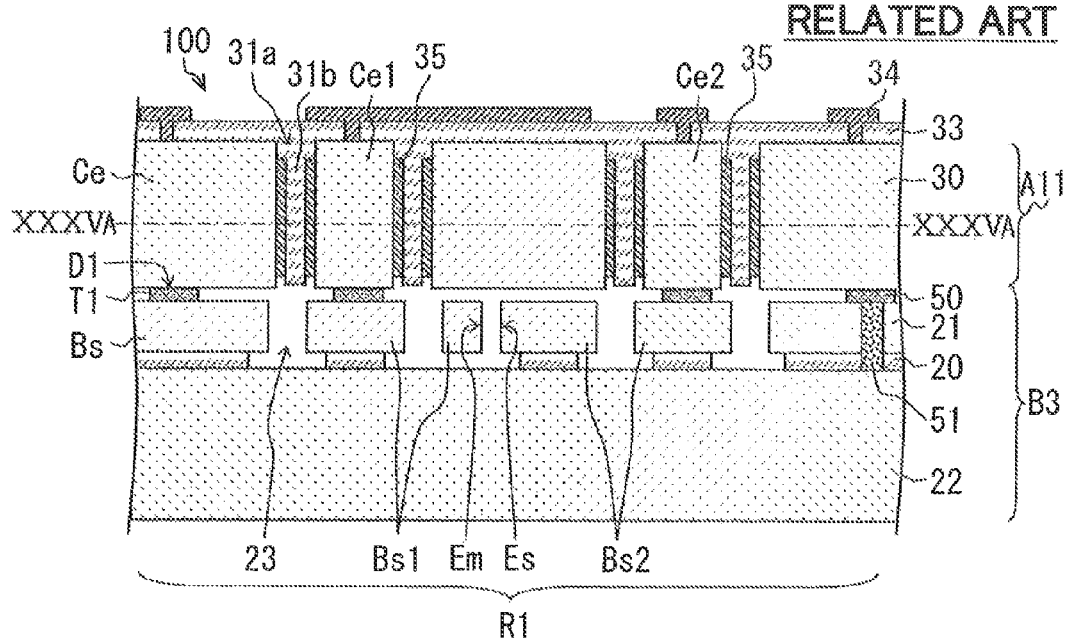

FIGS. 35A and 35B are views showing an example of the foregoing disclosure under patent pending, of which FIG. 35A is a partial plan view of a semiconductor device 100 and FIG. 35B is a cross-sectional view thereof along a dash-dot line XXXVB-XXXVB in FIG. 35A. Note that FIG. 35A is a view showing a cross section along a dash-dot line XXXVA-XXXVA in FIG. 35B. In the semiconductor device 100 shown in FIGS. 35A and 35B, the same portions as those of the semiconductor device 91 shown in FIGS. 32A and 32B are provided with the same reference numerals.

The semiconductor device 100 shown in FIGS. 35A and 35B has a base substrate B3 formed of a semiconductor, and a region-divided substrate A11 as a cap substrate to be bonded to the base substrate B3.

Figure 32A:
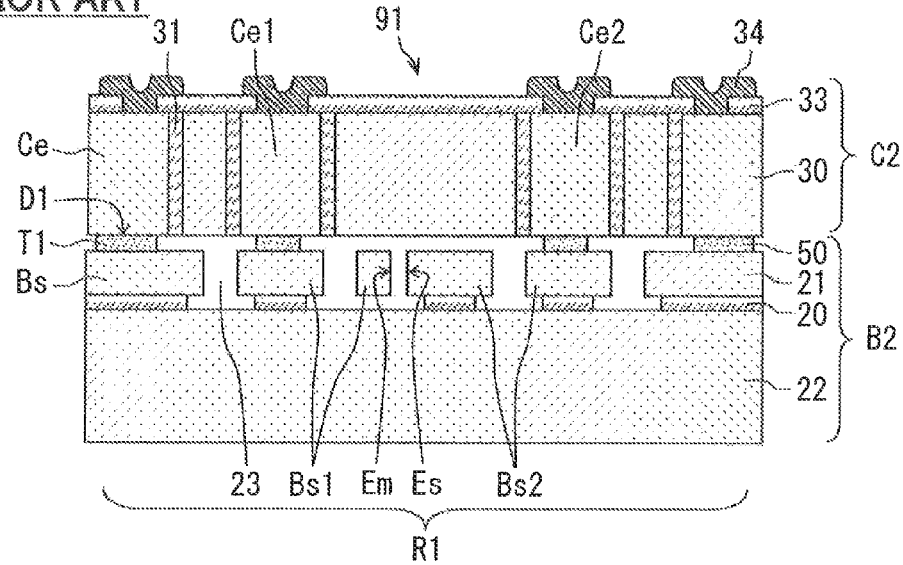
Figure 32B:
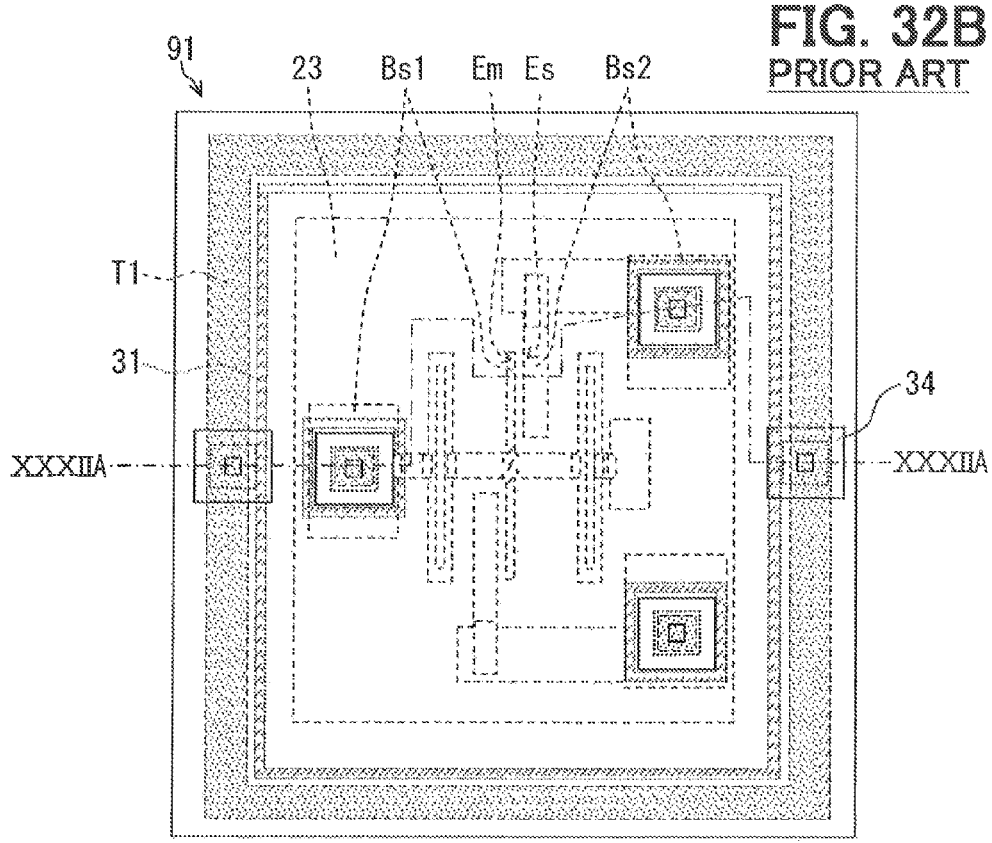

The base substrate B3 in the semiconductor device 100 of FIGS. 35A and 35B is the same as the base substrate B2 in the semiconductor device 91 shown in FIGS. 32A and 32B so that a description thereof is omitted. Note that, in the base substrate B3, the portion denoted by a reference numeral 51 and extending through the buried oxide film 20 and the base semiconductor region Bs is a contact layer formed to provide electrical contact with the support substrate 22 from the surface side of the SOI layer 21, which is made of polysilicon or the like and used for fixing the potential of the support substrate 22 or like purpose.

In the semiconductor device 100 of FIGS. 35A and 35B, the region-divided substrate A11 as the cap substrate is formed of the single-crystal silicon substrate 30, similarly to the cap substrate C2 in the semiconductor device 91 of FIGS. 32A and 32B, and the plurality of partial regions Ce are formed of trenches 31a and insulators 31b buried therein. However, unlike in the cap substrate C2 of FIGS. 32A and 32B, in the region-divided substrate A11 shown in FIGS. 35A and 35B, conductive layers 35 having electrical conductivity higher than that of the substrate 30 are formed on the respective side walls of the partial regions Ce formed by the trenches 31a.

In the semiconductor device 100 of FIGS. 35A and 35B, the predetermined partial regions Ce1 and Ce2 of the region-divided substrate A11 illustrated in the drawing are electrically connected to the respective base semiconductor regions Bs1 and Bs2 via the projecting portion T1 formed of the conductive film 50 to function as extraction conductive regions.

Unlike in the semiconductor device 91 using the cap substrate C2 which is merely divided into the plurality of partial regions Ce by the trenches (dielectric isolation trenches 31) shown in FIGS. 32A and 32B, in the semiconductor device 100 using the foregoing region-divided substrate A11, the conductive layers 35 each having high electrical conductivity are formed on the side walls of the plurality of partial regions Ce resulting from the division by the trenches 31a. Accordingly, in the extraction conductive regions Ce1 and Ce2 in the foregoing semiconductor device 100, a resistance value can be reduced to be smaller than that in the related-art semiconductor device 91.

The present disclosure provides further improvements in the region-divided substrate A11 and the semiconductor device 100 under patent pending, which are described above and illustrated in FIGS. 35A and 35B. An object of the present disclosure is to provide a region-divided substrate in which a substrate is divided into a plurality of partial regions by a trench extending through the substrate and the partial regions are usable as extraction conductive regions, a semiconductor device using the same, and manufacturing methods thereof. The region-divided substrate according to the present disclosure only benefits from advantages provided by forming conductive layers on the side walls of the foregoing partial regions, while allowing removal of adverse effects resulting from the formation of the conductive layers.

The present disclosure relates to a region-divided substrate in which a substrate is divided into a plurality of partial regions by a trench and the foregoing partial regions are usable as extraction conductive regions, a semiconductor device using the same, and manufacturing methods thereof. Embodiments for practicing the present disclosure will be described below based on the drawings.

Figure 1A:
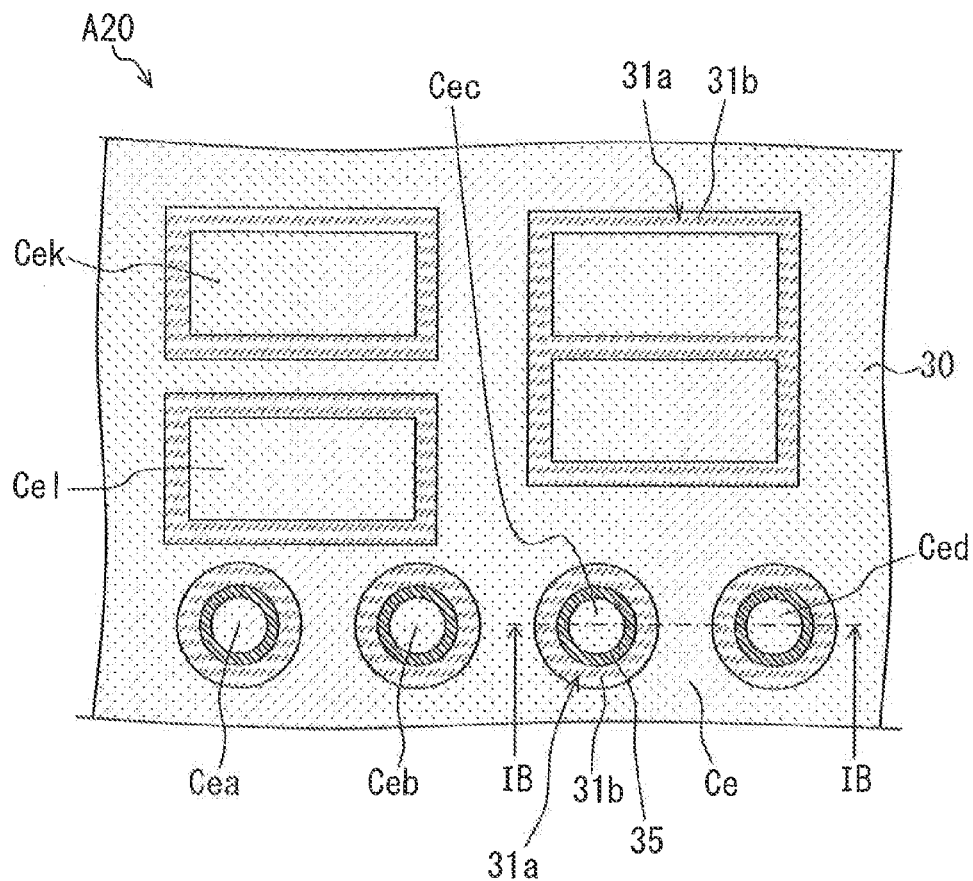
Figure 1B:
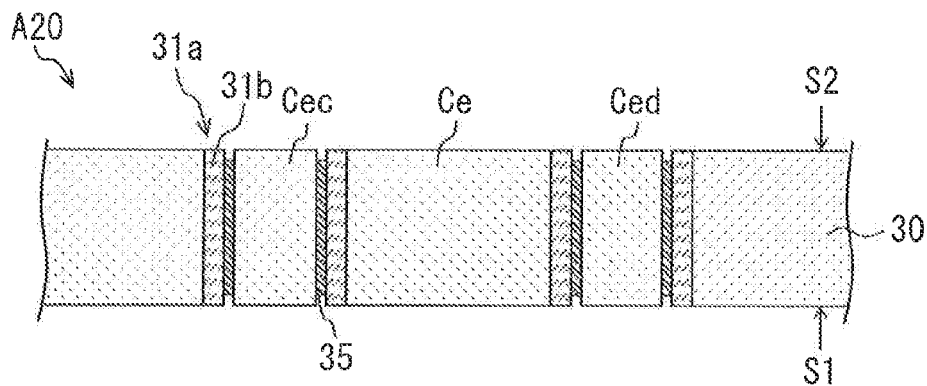

FIGS. 1A and 1B are views showing an example of a region-divided substrate according to the present disclosure, of which FIG. 1A is a partial top view of a region-divided substrate A20 and FIG. 1B is a cross-sectional view along a dash-dot line IIB-IIB in FIG. 1A. Note that, in the region-divided substrate A20 shown in FIGS. 1A and 1B, the same portions as those of the region-divided substrate A11 used as the cap substrate of the semiconductor device 100 shown in FIGS. 35A and 35B are provided with the same reference numerals.

As shown in FIG. 1B, in the region-divided substrate A20 shown in FIGS. 1A and 1B, a substrate 30 made of single-crystal silicon is divided into a plurality of partial regions Ce by trenches 31a formed to extend through the substrate 30 from a first surface S1 of the substrate 30 to a second surface S2 thereof. Also, as shown in FIG. 1A, partial regions Cea to Ced, which are some of the plurality of partial regions Ce formed by the trenches 31a, have conductive layers 35 having electrical conductivity higher than that of the substrate 30 and formed on the side walls thereof to be continuous from the first surface S1 side to the second surface S2 side, resulting in a configuration in which insulators 31b are buried in the trenches 31a. As will be described later, the partial regions Cea to Ced where the conductive layers 35 are formed to be continuous from the first surface S1 side to the second surface S2 side are usable as extraction conductive regions in a semiconductor device using the region-divided substrate A20 as a cap substrate.

In the region-divided substrate A20 shown in FIGS. 1A and 1B, unlike in the related-art region-divided substrate (cap substrate C1) which is merely divided into the plurality of partial regions (cap conductive regions Ce) by the trenches (dielectric isolation trenches 31) in the semiconductor device 91 shown in FIGS. 32A and 32B, the partial regions Cea to Ced, which are some of the partial regions formed by the trenches 31a, have the conductive layers 35 having electrical conductivity higher than that of the substrate 30 and formed on the sidewalls thereof to be continuous from the first surface S1 side to the second surface S2 side. Accordingly, when the partial regions Cea to Ced are used as, e.g., extraction conductive regions as will be described later, the conductive layers 35 having electrical conductivity higher than that of the substrate 30 and formed on the side walls can be used as main current paths, and the resistance values of the extraction conductive regions can be reduced to be smaller than in the related-art region-divided substrate (cap substrate C1) shown in FIGS. 32A and 32B.

In the region-divided substrate A20 of FIGS. 1A and 1B, as a substrate serving as a mother substrate, the single-crystal silicon substrate 30 is used. The single-crystal silicon substrate 30 is low cost and allows easy formation of the trenches 31a therein. Accordingly, the single-crystal silicon substrate 30 is a preferable material as a substrate serving as the mother substrate of the region-divided substrate A20. However, the configuration of the region-divided substrate A20 shown in FIGS. 1A and 1B allows the conductive layers 35 formed on the side walls of the partial regions Ce to be used as main current paths. Therefore, the material of the substrate serving as the mother substrate is not limited to the single-crystal silicon substrate 30, and may also be a polysilicon substrate or a SOI (Silicon On insulator) substrate having a buried oxide film described later. Alternatively, even when the single-crystal silicon substrate 30 having a low impurity concentration and a high specific resistance is used, it is possible to cause the partial regions Cea to Ced, which are some of the partial regions formed with the conductive layers 35, to function as the extraction conductive regions having small resistance values. The material of the substrate serving as the mother substrate is not also limited to a conductive or semi-conductive material. Even when the substrate serving as the mother substrate is formed of an insulating material, using the conductive layers 35, the partial regions Cea to Ced can be used as the extraction conductive regions.

As in the region-divided substrate A20 shown in FIGS. 1A and 1B, when the conductive layers 35 formed on the side walls of the partial regions Cea to Ced are used as the main current paths of the extraction conductive regions, a material having higher electrical conductivity is more preferred for the conductive layers 35. However, as long as a material having electrical conductivity higher than that of the substrate 30 is used, a predetermined resistance-value reducing effect can be obtained therefrom so that it is also possible to select a material having an excellent junction property with the material of the substrate 30 serving as the mother substrate. For example, each of the conductive layers 35 in the region-divided substrate A20 of FIGS. 1A and 1B can be formed as a metal layer having high electrical conductivity of, e.g., aluminum (Al) or the like, a silicon layer heavily doped with an impurity having an excellent junction property with silicon (Si), a metal silicide layer formed by causing tungsten (W), titanium (Ti), platinum (Pt), or the like to react with silicon (Si), or a laminated structure thereof. The thickness of the conductive layer 35 can also be set arbitrarily. For example, if the conductive layer 35 is formed thick, the resistance value can be reduced. Conversely, the conductive layer 35 can also be formed thin to allow a reduction in the stress applied to the surroundings.

Unlike the region-divided substrate A11 of the semiconductor device 100 shown in FIGS. 35A and 35B, the region-divided substrate A20 shown in FIGS. 1A and 1B is characterized in that the conductive layers 35 are formed on the sidewalls of only the partial regions Cea to Ced, which are some of the plurality of partial regions formed in separate relation by the trenches 31a, not all the partial regions. Accordingly, the region-divided substrate A20 has a configuration in which the conductive layers 35 are formed only in the partial regions Cea to Ced used as the extraction conductive regions but not in those partial regions which may exert stress-related adverse effects resulting from, e.g., the formation of the conductive layers 35 such as, e.g., partial regions Cek and Cel shown in the upper portion of FIG. 1A, which occupy large areas and where IC circuits can be formed, and the partial region surrounding the partial regions Cek and Cel.

In the region-divided substrate A20 of FIGS. 1A and 1B, the buried insulators 31b buried in the trenches 31a can be made of, e.g., silicon dioxide ($SiO_2$) typically used in a semiconductor manufacturing process. As shown in FIG. 1B, the insulators 31b are preferably buried in the trenches 31a to be continuous from the first surface 51 side to the second surface S2 side in terms of ensuring the strength of the region-divided substrate A20, but the configurations thereof are not limited thereto. For example, to reduce parasitic capacitances using the insulators 31b as dielectric layers, the insulators 31b may also be buried only on the first surface S1 side or the second surface S2 side, as will be described later.

Thus, the region-divided substrate A20 illustrated in FIGS. 1A and 1B is the region-divided substrate in which the substrate 30 is divided into the plurality of partial regions Ce by the trenches 31a extending through the substrate 30, and the partial regions Ce are usable as the extraction conductive regions. The region-divided substrate A20 can be provided as a region-divided substrate which is smaller in resistance value than the related-art region-divided substrate (cap substrate C1) shown in FIGS. 32A and 32B when the partial regions Ce are used as the extraction conductive regions, can use any substrate material that is conductive, semi-conductive, or insulating, and has reduced application restrictions.

Also, in the region-divided substrate A20 shown in FIGS. 1A and 1B, as can be seen from a comparison with the region-divided substrate A11 of the semiconductor device 100 shown in FIGS. 35A and 35B, the conductive layers 35 are formed only on the side walls of the partial regions Cea to Ced, which are some of the partial regions. Therefore, the region-divided substrate A20 only benefits from advantages provided by forming the conductive layers 35 on the side walls of the partial regions, such as a reduced resistance value when the conductive layers 35 are used as extraction conductive regions as described above and an ability to use any substrate material that is conductive, semi-conductive, or insulating, while allowing removal of stress-related adverse effects resulting from the formation of the conductive layers and the like.

Figure 2A:
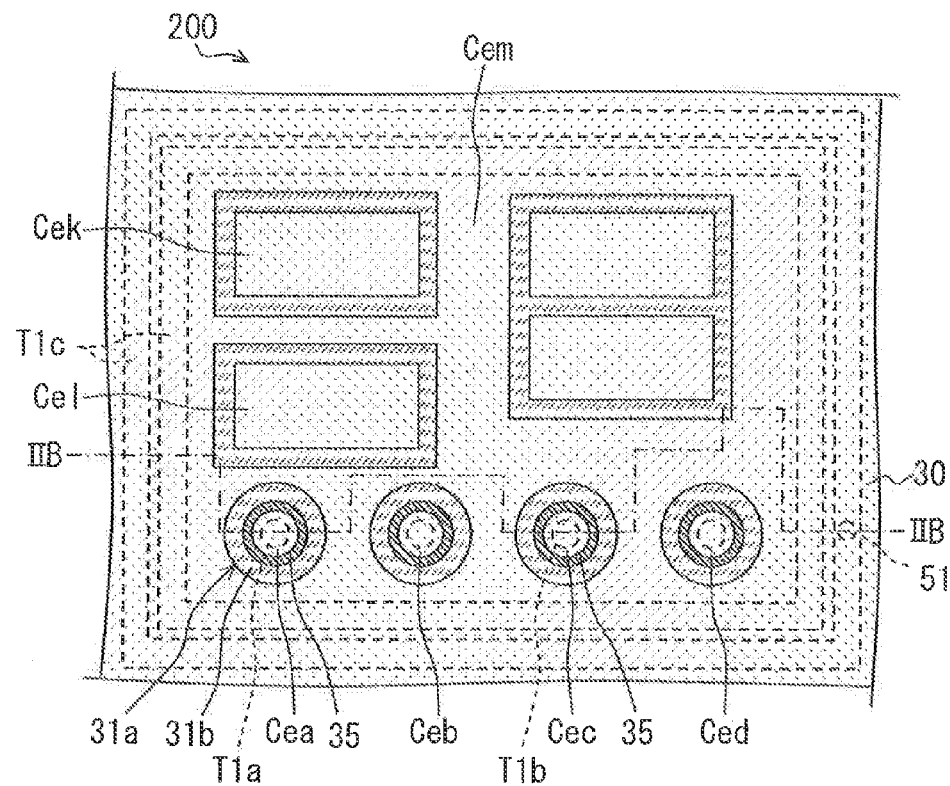
Figure 2B:
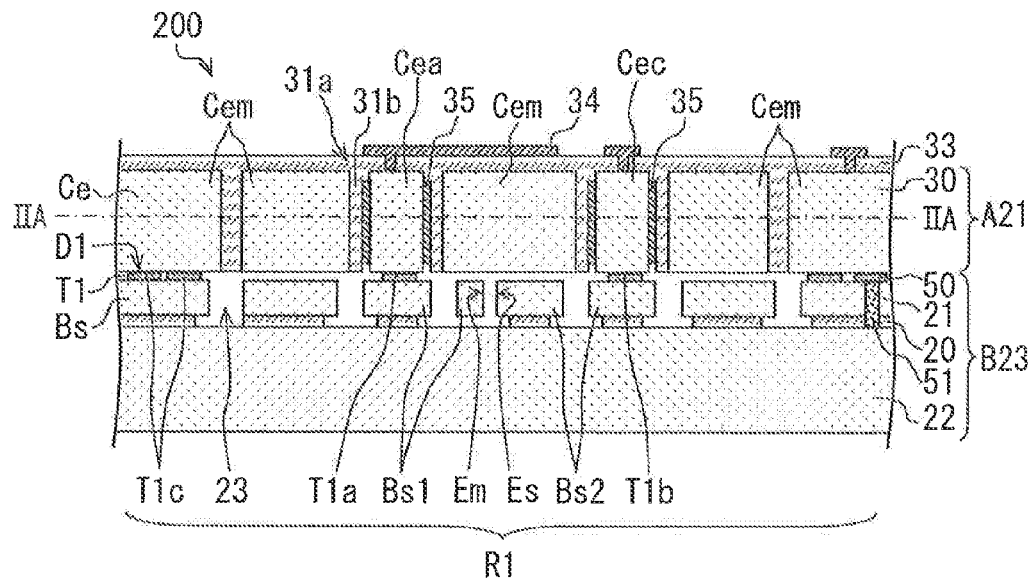

FIGS. 2A and 2B are views showing an example of the semiconductor device according to the present disclosure using a region-divided substrate A21 similar to the region-divided substrate shown in FIGS. 1A and 1B, of which FIG. 2A is a partial plan view schematically showing a semiconductor device 200 and FIG. 2B is a cross-sectional view schematically showing the semiconductor device 200. Note that the cross-sectional view of FIG. 2B shows a cross section along a dash-dot line IIB-IIB of FIG. 2A, which is arbitrarily extended/contracted along the section line and simplified for clear illustration. FIG. 2A is a view showing a cross section along a dash-dot line F-F in FIG. 2B. In the semiconductor device 200 shown in FIGS. 2A and 2B, the same portions as those of the semiconductor device 100 shown in FIGS. 35A and 35B are provided with the same reference numerals.

The semiconductor device 200 shown in FIGS. 2A and 2B is a semiconductor device using the region-divided substrate A21 similar to the region-divided substrate A20 shown in FIGS. 1A and 1B. The semiconductor device 200 of FIGS. 2A and 2B has a base substrate B23 made of a semiconductor and having a plurality of dielectrically isolated base semiconductor regions Bs formed in a surface layer portion thereof, and a cap substrate using the region-divided substrate A21 bonded to the base substrate B23. The region-divided substrate A21 as the cap substrate is bonded in opposing relation to a predetermined region R1 in the surface layer portion of the base substrate B23. The space formed by the foregoing predetermined region R1 and the region-divided substrate A21 as the cap substrate is sealed, and the partial regions Cea and Cec having the conductive layers 35 formed on the side walls thereof function as extraction conductive regions electrically connected to predetermined base semiconductor regions Bs1 and Bs2.

More specifically, the base substrate B23 in the semiconductor device 200 of FIGS. 2A and 2B is a SOI (Silicon On Insulator) substrate having a buried oxide film 20, and includes a SOI layer 21 and a support substrate 22 between which the buried oxide film 20 is interposed. The base substrate B23 has the plurality of dielectrically isolated base semiconductor regions Bs formed in the surface layer portion thereof. Each of the base semiconductor regions Bs in the semiconductor device 200 of FIGS. 2A and 2B is formed of the SOI layer 21 dielectrically isolated from the surroundings by trenches 23 reaching the buried oxide films 21. On the base semiconductor region Bs in the predetermined region R1 of the base substrate B23, a projecting portion T1 formed of a conductive film 50 of polysilicon of the same conductivity type as those of the base semiconductor regions Bs and the partial regions Ce, metal such as aluminum (Al), a conductive adhesive, or the like is formed. The conductive film 50 forming the projecting portion T1 is made of a gold (Au)-silicon (Si) alloy when the base substrate B23 and the region-divided substrate A21 as the cap substrate are bonded together by gold (Au)-silicon (Si) eutectic bonding. For the projecting portion T1, instead of forming the conductive film 50 on the base semiconductor region Bs, processing/forming may also be performed such that the surface of the base semiconductor region Bs made of single-crystal silicon has the projecting portion T1. Note that, in the base substrate B23, the portion denoted by the reference numeral 51 and extending through the buried oxide film 20 and the base semiconductor region Bs is a contact layer formed to provide electrical contact with the support substrate 22 from the surface side of the SOI layer 21, which is made of polysilicon or the like and used for fixing the potential of the support substrate 22 or like purpose.

Figure 33A:
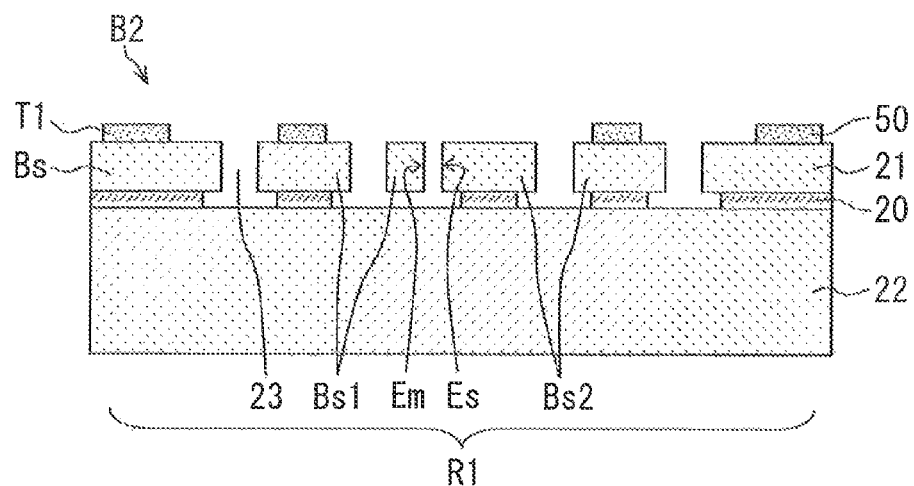
Figure 33B:
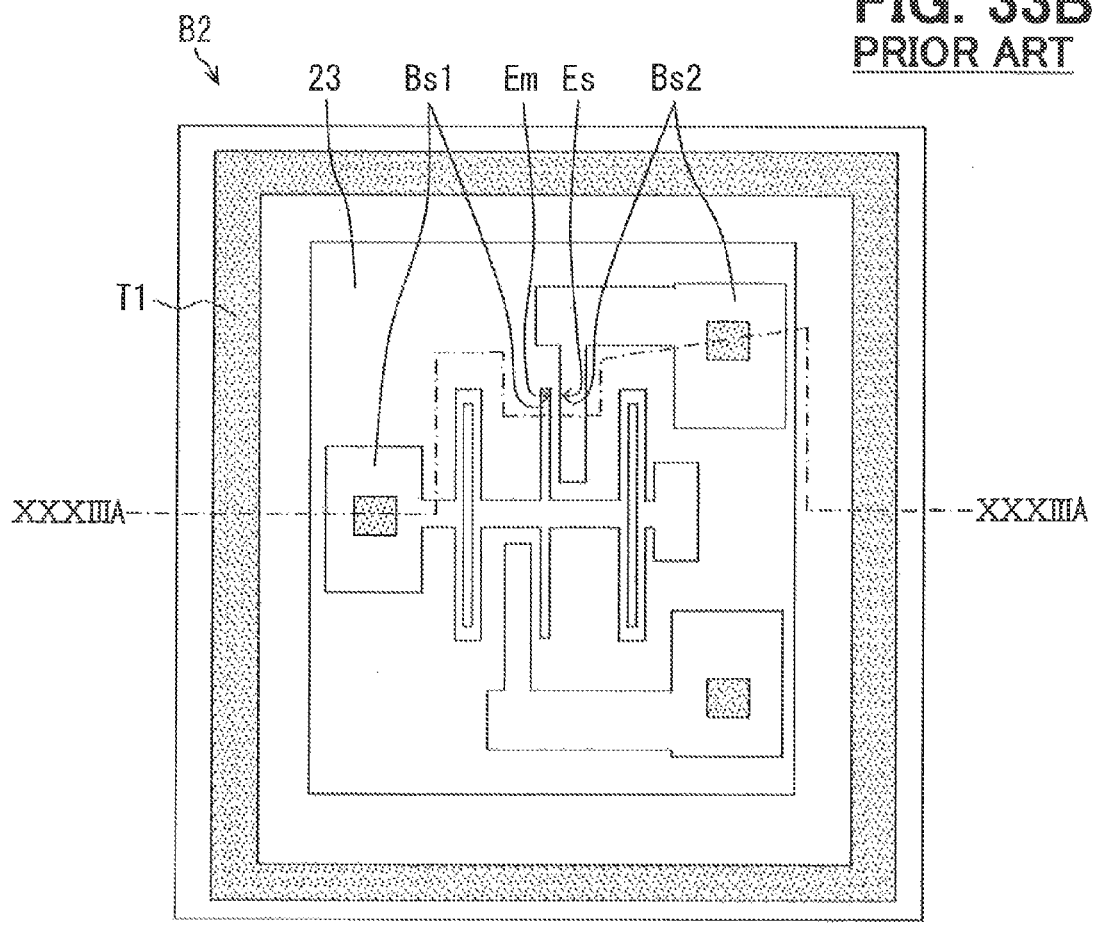
Figure 34A:
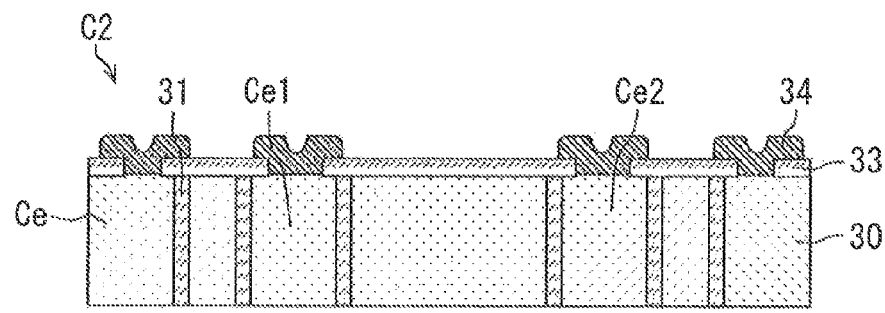
Figure 34B:
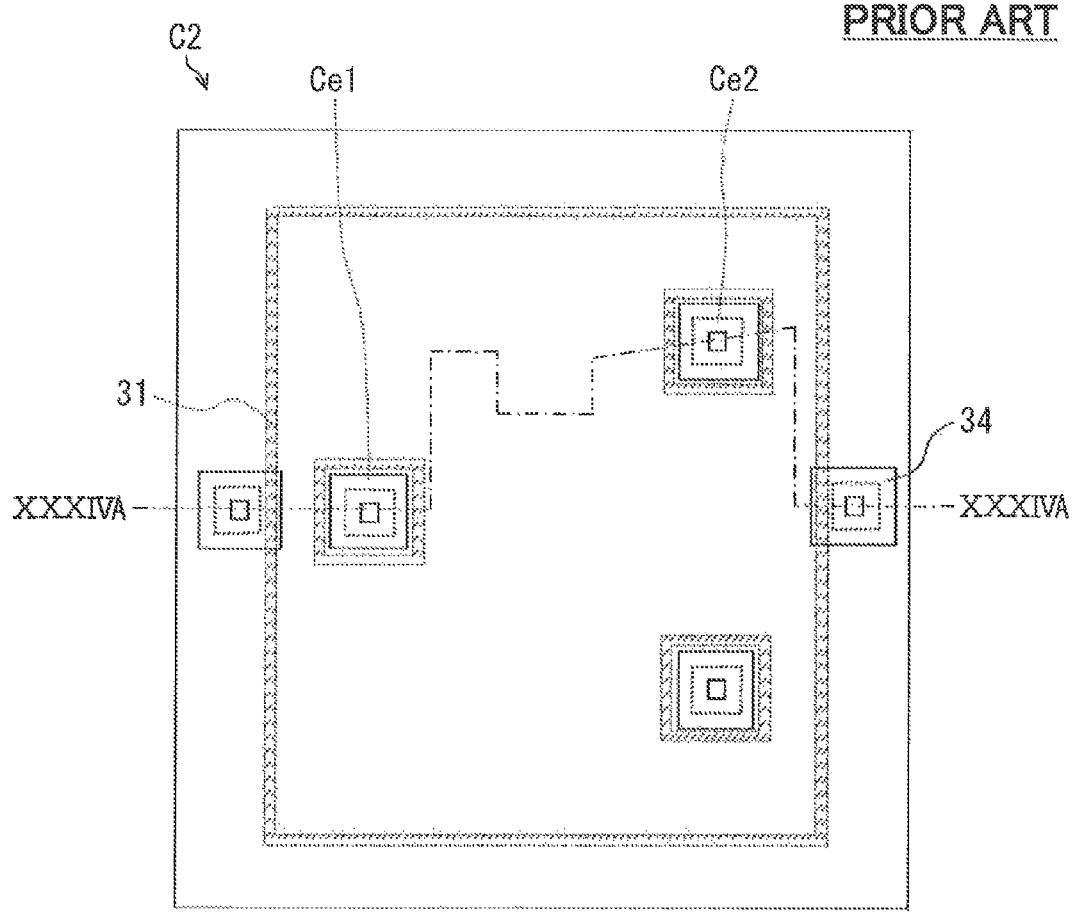

The semiconductor device 200 shown in FIGS. 2A and 2B has dynamic quantity sensor elements each using an inertial force, and the dynamic quantity sensor elements each for measuring an acceleration and an angular velocity are formed of the plurality of base semiconductor regions Bs formed in the surface layer portion of the base substrate B23. That is, of the plurality of base semiconductor regions Bs in the base substrate B23, base semiconductor regions Bs1 shown in the drawings serve as movable semiconductor regions having movable electrodes Em formed to be displaceable by sacrificially etching part of the buried oxide film 20. On the other hand, the other base semiconductor regions Bs2 shown in the drawings serve as stationary semiconductor regions having stationary electrodes Es opposing the movable electrodes Em. Note that a two-dimensional configuration associated with the dynamic quantity sensor elements of the semiconductor device 200 is the same as that of the base substrate B2 of FIGS. 33A and 33B so that a description thereof is omitted. However, the two movable semiconductor regions Bs1 and the two stationary semiconductor regions Bs2 which are shown in the cross-sectional view of FIG. 2B form respective integrally coupled regions in a two-dimensional configuration. In the semiconductor device 200, the opposing surfaces of the movable electrode Em of the movable semiconductor regions Bs1 and the stationary electrode Es of the stationary semiconductor regions Bs2 form an electrostatic capacitance. The movable electrode Em is displaced in a direction perpendicular to the opposing surfaces in accordance with a dynamic quantity applied thereto to measure a change in the electrostatic capacitance resulting from a distance change between the movable electrode Em and the stationary electrode Es, and detect the applied dynamic quantity. Note that, in the region of the base substrate B23 other than the predetermined region R1, another element or circuit may also be formed.

The region-divided substrate A21 as the cap substrate of the semiconductor device 200 of FIGS. 2A and 2B is formed of the single-crystal silicon substrate 30, and formed with the plurality of partial regions Ce. The individual partial regions Ce are a plurality of regions into which the single-crystal silicon substrate 30 is divided by the trenches 31a extending through the single-crystal silicon substrate 30. The region-divided substrate A21 of the semiconductor device 200 of FIGS. 2A and 2B is characterized in that the conductive layers 35 having electrical conductivity higher than that of the substrate 30 are formed on the side walls of only the partial regions Cea to Ced, which are some of the plurality of partial regions Ce formed by the trenches 31a. That is, in the region-divided substrate A21 of the semiconductor device 200, the conductive layers 35 are formed on the side walls of only the partial regions Cea to Ced used as the extraction conductive regions, while the conductive layers 35 are not formed on the side walls of the rectangular partial regions Cek and Cel shown in the upper portion of FIG. 2A, where IC circuits can be formed, and a partial region Cem surrounding the partial regions Cek and Cel. If the conductive layers 35 are formed in advance on the side walls of the partial regions Cek and Cel where the IC circuits are formed, when the conductive layers 35 undergo a large number of heat treatments in the manufacturing of the IC circuits, crystal defects or the like may occasionally be likely to occur therein to degrade the flexibility of a manufacturing process.

Note that, in FIG. 2B, the portion shown by a reference numeral 33 over the region-divided substrate A21 is a surface protective layer made of a silicon dioxide ($SiO_2$) film or the like, and the portions each shown by a reference numeral 34 thereover are a wire and an electrode pad made of aluminum (Al) or the like.

In the semiconductor device 200, as shown in FIG. 2B, one flat surface of the region-divided substrate A21 used as the cap substrate is bonded to the projecting portion T1 of the base substrate B23 to form a junction surface D1. A projecting portion T1c is set such that the junction surface D1 between the base substrate B23 and the region-divided substrate A21 is annular in the predetermined region R1 of the base substrate B23. By the bonding together of the base substrate B23 and the region-divided substrate A21, the space formed by the surface of the predetermined region R1 in the base substrate B23 and the surface of the region-divided substrate A21 is sealed in a high vacuum state. Also, by the bonding together mentioned above, the partial regions Cea and Cec of the region-divided substrate A21 having the conductive layers 35 formed on the side walls thereof are electrically connected respectively to the base semiconductor regions Bs1 and Bs2 via projecting portions T1a and T1b to function as the extraction conductive regions. That is, the configuration is such that, to the movable semiconductor region Bs1 and the stationary semiconductor region Bs2, the extraction conductive regions Cea and Cec are connected respectively. Note that, to the electrode pads 34 of the semiconductor device 200, wires may be bonded without any modification but, it may also be possible to form passivation films as necessary and provide ball bonding connection using flip-chip bumps or the like. In this case, dummy bumps which do not provide electrical connection can also be placed as necessary to balance the stresses of chips.

In the semiconductor device 200 shown in FIGS. 2A and 2B, the cap substrate using the region-divided substrate A21 bonded to the base substrate 1323 functions as a sealing cap for protecting various elements formed in the predetermined region R1 of the surface layer portion of the base substrate B23. Also, in the cap substrate, the plurality of dielectrically isolated partial regions Ce are formed, and the partial regions Cea to Ced having the conductive layers 35 formed on the side walls thereof are electrically connected to the predetermined electrically isolated base semiconductor regions Bs1, Bs2, and the like formed in the base substrate B23 to function as the extraction conductive regions.

In the semiconductor device 200 using the foregoing region-divided substrate A21 as the cap substrate, unlike in the related-art semiconductor device 91 using the cap substrate C2 merely divided into the plurality of partial regions Ce by the trenches (dielectric isolation trenches 31) shown in FIGS. 32A and 32B, the conductive layers 35 having high electrical conductivity are formed on the side walls of the partial regions Cea to Ced, which are some of the plurality of partial regions Ce separated by the trenches 31a in the region-divided substrate A21 used as the cap substrate. Accordingly, the partial regions Cea to Ced functioning as the extraction conductive regions in the foregoing semiconductor device 200 can have resistance values smaller than those in the related-art semiconductor device 91.

In addition, in the semiconductor device 200 of FIGS. 2A and 2B, the areas occupied by the extraction conductive regions formed of the partial regions Cea to Ced having the conductive layers 35 formed on the side walls thereof can normally be reduced to be smaller than those occupied by the rectangular partial regions Cek and Cel shown in the upper portion of FIG. 2A, in which, e.g., IC circuits are formed in a semiconductor device described later, and the partial region Cem surrounding the partial regions Cek and Cel. Therefore, even when the conductive layers 35 are formed on the side walls in the extraction conductive regions, stress-related adverse effects can be ignored.

In general, to remove stress-related adverse effects resulting from the formation of the conductive layers 35 on the side walls, it is preferable to provide a configuration in which the conductive layers 35 are formed on the side walls of those of the plurality of partial regions Ce in the region-divided substrate which occupy areas smaller than a predetermined occupied area.

In the foregoing semiconductor device 200, the material of the base substrate of the region-divided substrate A21 used as the cap substrate may be any substrate material that is conductive, semi-conductive, or insulating since the conductive layers 35 formed on the side walls of the partial regions Cea to Ced are used as the main current paths, as described above. Even when, e.g., the single-crystal silicon substrate 30 in the region-divided substrate A21 or a SOI substrate described later is used, the cap substrate may have any impurity concentration. Therefore, as will be described later, the cap substrate in the foregoing semiconductor device 200 can be used for various applications by forming various elements or IC circuits therein without being limited to the use thereof as the extraction conductive regions.

It will be appreciated that, in the semiconductor device 200 of FIGS. 2A and 2B, electrical connection using wire bonding or face-down bonding (ball bonding) can be made to the electrodes 34 connected to the extraction conductive regions Cea and Cec exposed at the outside surface of the cap substrate formed of the region-divided substrate A21 bonded to the base substrate B23 which is opposite to the bonded surface thereof.

Thus, the semiconductor device 200 shown in FIGS. 2A and 2B is a semiconductor device using the region-divided substrate A21 in which the substrate 30 is divided into the plurality of partial regions Ce by the trenches 31a extending through the substrate 30 and the partial regions Cea to Ced as the extraction conductive regions. Accordingly, a small-size and low-cost semiconductor device can be provided in which various elements formed in the surface layer portion of the base substrate B23 are protected by the cap substrate using the region-divided substrate A21, the resistance values of the extraction conductive regions Cea to Ced in the cap substrate are small, face-down bonding is also possible, and mounting restrictions have been reduced.

As can also be seen from a comparison with the semiconductor device 100 shown in FIGS. 35A and 35B, the foregoing semiconductor device 200 only benefits from advantages provided by forming the conductive layers 35 on the side walls of the partial regions in the cap substrate formed of the region-divided substrate A21, while allowing removal of adverse effects resulting from the formation of the conductive layers 35 in the other partial regions.

Next, a method of manufacturing the region-divided substrate A20 shown in FIGS. 1A and 1B will be described using the cross-sectional portion shown in FIG. 1B.

FIGS. 3A to 4D are cross-sectional views showing the individual steps of an example of the method of manufacturing the region-divided substrate A20.

Figure 3A:
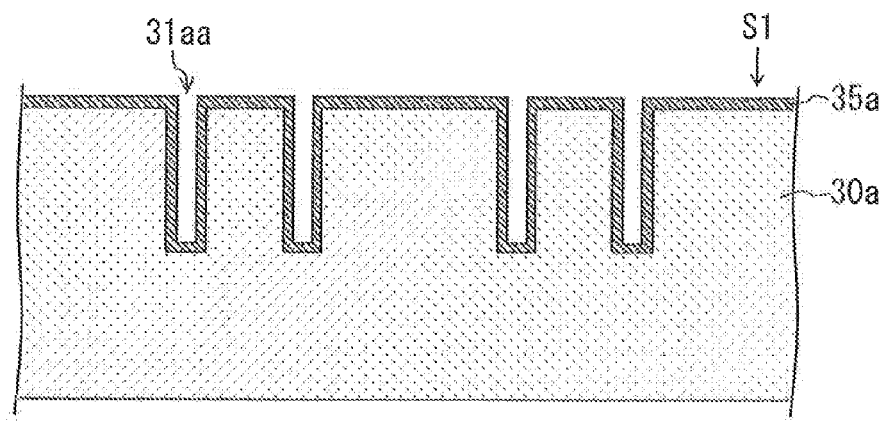
FIGS. 3A to 3C are cross-sectional views showing the individual steps of an example of a method of manufacturing the region-divided substrate.

First, as shown in FIG. 3A, in a primary trench forming step, primary trenches 31aa serving as the trenches 31a and not extending through a primary substrate 30a serving as the substrate 30 of the region-divided substrate A20 are formed at a predetermined depth in the first surface S1 of the primary substrate 30a. As the primary substrate 30a, for example, an $N^+$-type single-crystal silicon substrate having a (100) crystal orientation and a specific resistance of 0.001 to 1 $\Omega$cm and containing arsenic (As), phosphorus (P), or the like at a high concentration is used. The primary trenches 31aa are formed at a predetermined depth of 10 to 500 μm.

Next, in a primary conductive layer forming step, a primary conductive layer 35a serving as the conductive layers 35 of the region-divided substrates A20 is formed over the entire first surface S1 of the primary substrate 30a so as to cover the side walls of the primary trenches 31aa. The primary conductive layer 35a is formed by forming a metal film of, e.g., aluminum (Al), gold (Au), tungsten (W), or the like by vapor deposition, sputtering, CVD, or the like to a thickness of 0.1 to 2 μm.

Figure 3B:
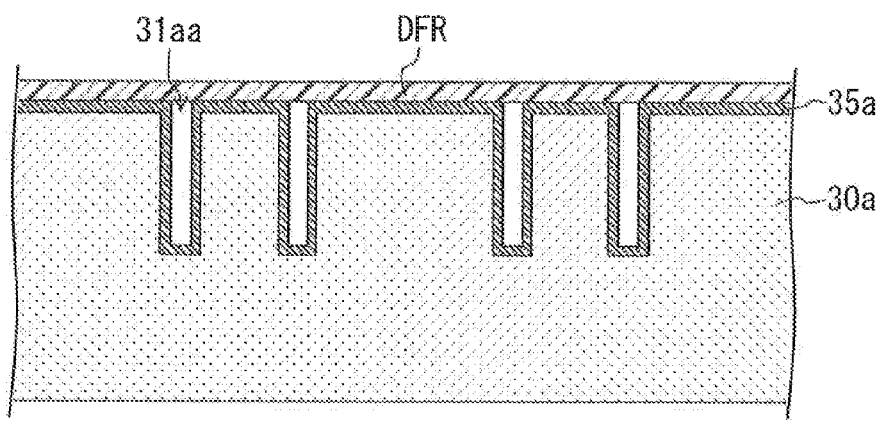
Figure 3C:
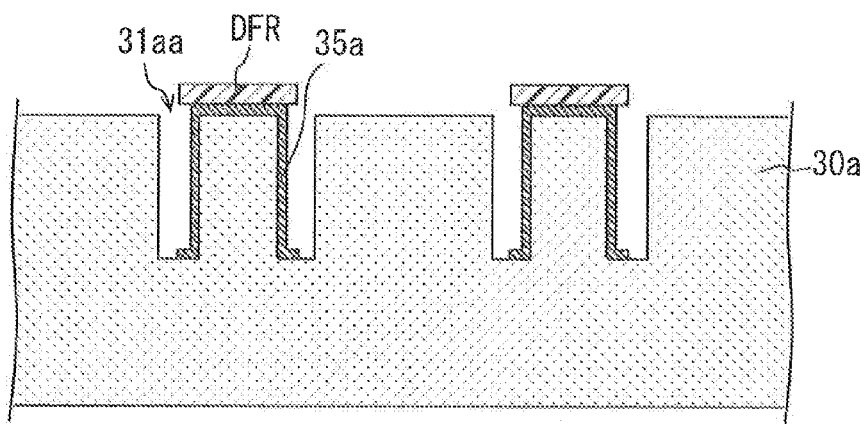

Next, in a primary conductive layer patterning step shown in FIGS. 3B and 3C, part of the primary conductive layer 35a formed on the side walls of the primary trenches 31aa is removed to be patterned. In the primary conductive layer patterning step shown in FIGS. 3B and 3C, using a dry film resist DFR having a thickness of 5 to 100 μm as a mask, part of the primary conductive layer 35a formed on the side walls of the primary trenches 31aa is removed to remain only on the predetermined side walls.

As shown in FIG. 3B, the dry film resist DFR is bonded to the first surface S1 side of the primary substrate 30a formed with the primary conductive layer 35a. The dry film resist DFR is a film thicker than a coated resist, and has a higher strength. Therefore, as subsequently shown in, e.g., FIG. 3C, the dry film resist DFR can be patterned so as to protrude like eaves in the openings of the primary trenches 31aa. As the dry film resist DFR, a dry film resist having a predetermined thickness is selected appropriately in accordance with the sizes of the openings of the primary trenches 31aa and used. Next, using an exposure mask, the dry film resist DFR is formed into a predetermined pattern.

As shown in FIG. 3C, after the dry film resist DFR is patterned so as to protrude like eaves in the openings of the primary trenches 31aa, using the patterned dry film resist DFR as a mask, the primary conductive layer 35a formed in the primary trenches 31aa is anisotropically etched by, e.g., an Ar ion beam milling method or the like. In this manner, part of the primary conductive layer 35a formed on the sidewalls of the primary trenches 31aa and part thereof formed on a silicon oxide film 36 are removed to leave the conductive layers 35 only on the predetermined side walls.

A combination of the dry film resist DFR thus patterned so as to protrude like eaves in the openings of the primary trenches 31a and the anisotropic etching allows reliable protection of the primary conductive layer 35a on the side walls intended to be left. Therefore, it is possible to finally form the conductive layers 35 only on the side walls of the predetermined partial regions or form the conductive layers 35 on part of the side walls with high accuracy, as will be described later.

Figure 4A:
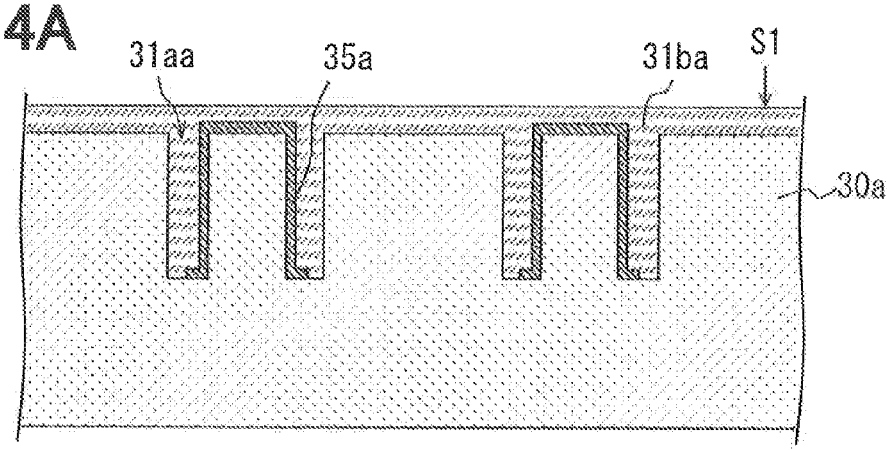
FIGS. 4A to 4D are cross-sectional views showing the individual steps of the example of the method of manufacturing the region-divided substrate.

Next, in a primary insulator burying step shown in FIG. 4A, a primary insulator 31ba serving as the insulators 31b of the region-divided substrate A20 is deposited on the entire first surface S1 to be buried in the primary trenches 31aa. The primary insulator 31ba is formed by depositing a silicon dioxide ($SiO_2$) film by, e.g., vapor deposition, sputtering, CVD, or the like so as to be buried in the primary trenches 31aa. When the parasitic capacitances resulting from the insulators 31b of the region-divided substrate A20 are to be reduced, FSG (SiOF), a carbon-containing $SiO_2$ film (SiOC), or the like having a low dielectric constant may also be buried. The primary insulator 31ba may also be a laminate film of the FSG (SiOF) or carbon-containing $SiO_2$ film and a $SiO_2$ film.

Figure 4B:
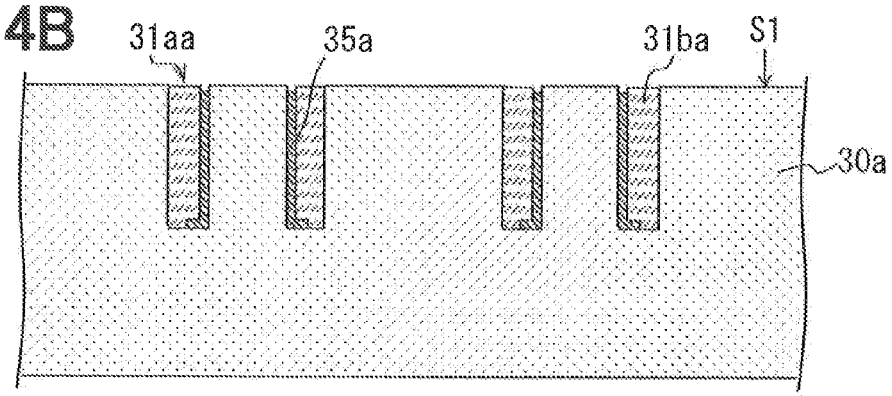

Next, in a first surface forming step shown in FIG. 4B, grinding/polishing is performed from the first surface S1 side to expose the primary substrate 30a serving as the substrate 30 of the region-divided substrate A20 or the primary conductive layer 35a formed on the primary substrate 30a and form the first surface S1 of the substrate 30 in the region-divided substrate A20. For example, after the primary insulator 31ba is removed by CMP or the like using the primary conductive layer 35a formed on the first surface S1 of the primary substrate 30a as a stopper, the primary conductive layer 35a is subsequently etched to be left in the primary trenches 31aa, while being removed from over the primary substrate 30a.

Figure 4C:
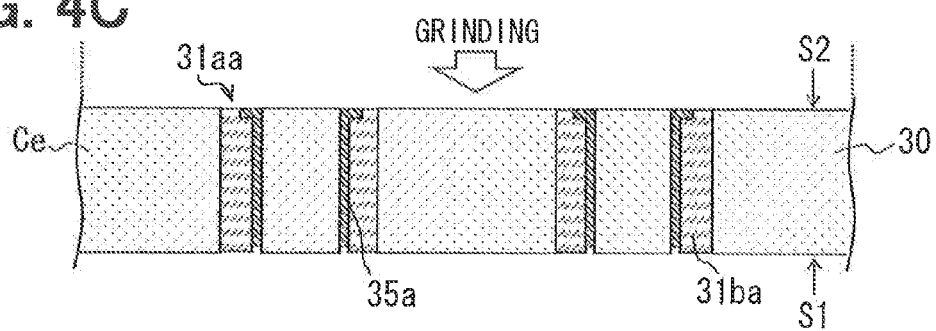
Figure 4D:
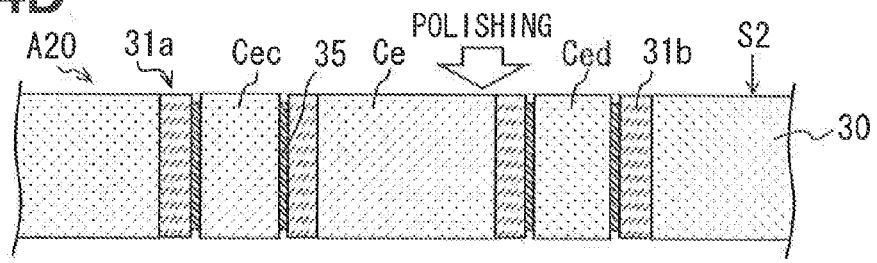

Next, a second surface forming step shown in FIGS. 4C and 4D is performed.

As shown in FIG. 4C, the primary substrate 30a shown in FIG. 4B is inverted and ground from the second surface S2 side. For example, the primary substrate 30a is roughly removed from the second surface S2 side by grinding, etching, or the like, and subsequently removed by CMP using the primary conductive layer 35a as a stopper. As a result, the primary substrate 30a is divided into the plurality of partial regions Ce.

Next, as shown in FIG. 4D, the primary substrate 30a is further polished to form the second surface 52 of the substrate 30 in the region-divided substrate A20. The primary conductive layer 35a is further etched from the second surface S2 of the substrate 30 so as to be recessed, resulting in the conductive layers 35.

By the foregoing process steps, the region-divided substrate A20 shown in FIGS. 1A and 1B can be manufactured.

Next, a method of manufacturing the semiconductor device 200 shown in FIGS. 2A and 2B will be described.

In the method of manufacturing the semiconductor device 200 of FIGS. 2A and 2B, the base substrate preparing step of preparing the base substrate B23 is the same as the base substrate preparing step described in Japanese Patent Application No. 2010-176742 under patent pending described above, so that a description thereof is omitted.

Figure 5A:
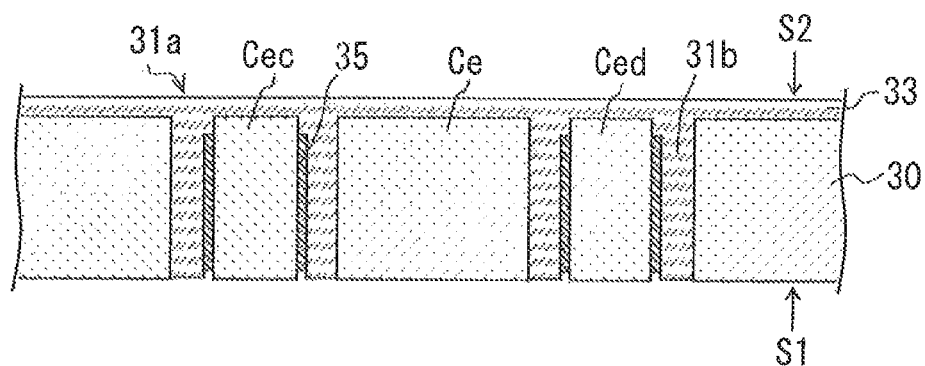
FIGS. 5A and 5B are views illustrating the step of preparing a cap substrate (region-divided substrate) in the semiconductor device of FIGS. 2A and 2B, which show the step subsequently performed based on the manufacturing method of the region-divided substrate illustrated in FIGS. 3A to 4D.
Figure 5B:
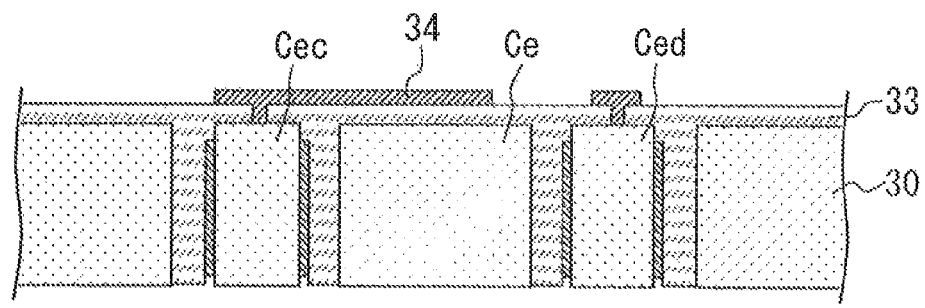

FIGS. 5A and 5B are views illustrating the step of preparing the cap substrate (region-divided substrate A21) in the semiconductor device 200 of FIGS. 2A and 21B, which illustrate the step subsequently performed based on the method of manufacturing the region-divided substrate A20 illustrated in FIGS. 3A to 4D.

As shown in FIG. 5A, on one surface of the region-divided substrate A20 shown in FIG. 4D and corresponding to the region-divided substrate prepared in the manufacturing method illustrated in FIGS. 3A to 4D, the surface protective layer 33 made of a silicon dioxide ($SiO_2$) film or the like is formed by CVD or the like. Next, as shown in FIG. 5B, contact holes are formed at predetermined positions. Subsequently, a film made of aluminum (Al) or the like is formed over the entire surface, and then patterned by photolithoetching to form the wires and the electrode pads.

By the foregoing process steps illustrated in FIGS. 3A to 5B, the cap substrate (region-divided substrate A21) in the semiconductor device 200 of FIGS. 2A and 2B can be prepared.

Figure 6A:
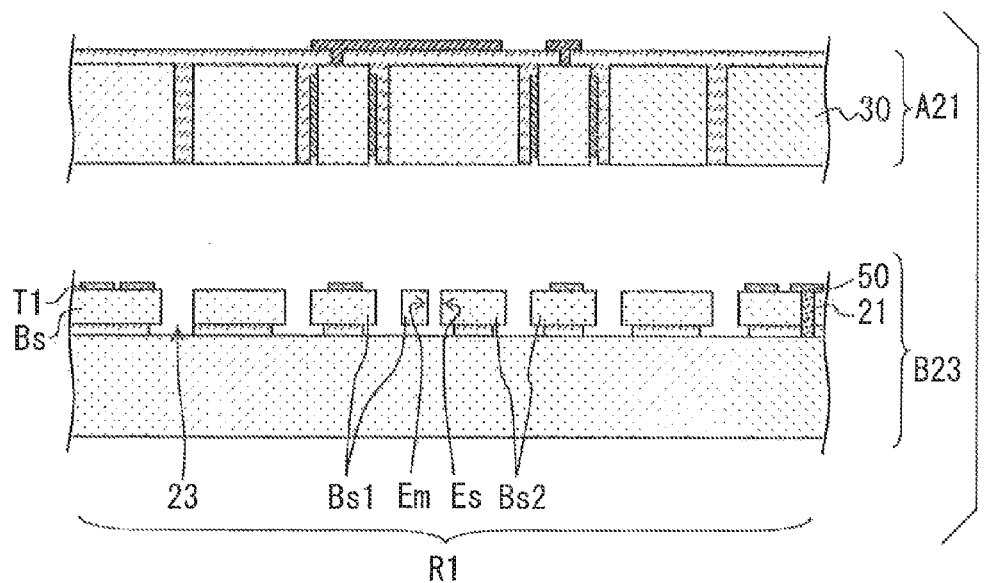
FIGS. 6A and 6B are step-by-step cross-sectional views showing an example of a substrate bonding step of bonding together a prepared base substrate and the cap substrate (region-divided substrate) prepared by the steps of FIGS. 3A to 5B.
Figure 6B:
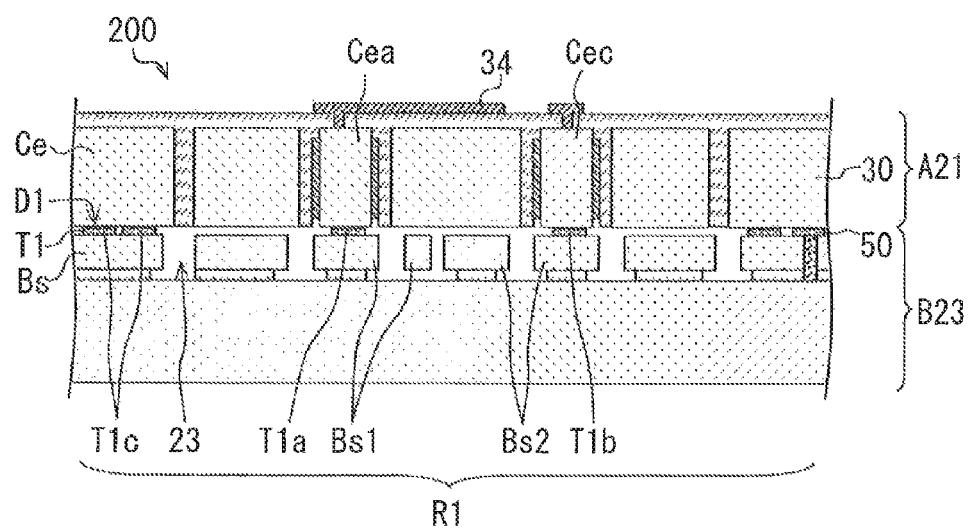

FIGS. 6A and 6B are step-by-step cross-sectional views showing an example of a substrate bonding step of bonding together the prepared base substrate B23 and the cap substrate (region-divided substrate A21) prepared by the steps of FIGS. 3A to 5B.

As shown in FIG. 6A, the cap substrate using the region-divided substrate A21 is aligned so as to oppose the predetermined region R1 of the base substrate B23 formed with the dynamic quantity sensor elements, and then the cap substrate is stacked on the base substrate B23.

Next, as shown in FIG. 6B, the region-divided substrate A21 is bonded to the base substrate B23. For the bonding, e.g., gold (Au)-silicon (Si) eutectic bonding can be used. The Au—Si eutectic bonding includes preliminarily forming gold (Au) films as the conductive films 50, and causing a so-called Au—Si eutectic reaction in inert gas such as nitrogen ($N_2$) gas to carry out bonding. By the bonding using the Au—Si eutectic bonding, the base substrate B23 and the region-divided substrate A21 are solidly bonded together at the junction surface D1 in a state where conductivity is ensured, while the space formed of the trenches 23 formed by the predetermined region R1 of the base substrate B23 and the region-divided substrate A21 or the like is completely sealed. By the solid bonding together of the foregoing base substrate B23 and the region-divided substrate A21, the extraction conductive regions Cea and Cec of the region-divided substrate A21 are electrically connected to the predetermined base semiconductor regions Bs1 and Bs2 and, from the electrode pads 34 formed on the surface of the cap substrate (region-divided substrate A21), outputs of the dynamic quantity sensor elements formed on the base substrate B23 can be extracted to the outside.

Note that, when the SOI layer 21 of the base substrate B23 and the single-crystal silicon substrate 30 as the mother substrate of the region-divided substrate A21 are each made of silicon (Si), for the bonding together of the base substrate B23 and the region-divided substrate A21, not only the Au—Si eutectic bonding, but also Si direct bonding, which will be described later, can also be used. Alternatively, it may also be possible to provide aluminum (Al) layers on the respective bonded surfaces of the region-divided substrate and the base substrate, laminate a germanium (Ge) layer on at least one of the Al layers, and carry out bonding using an aluminum (Al)-germanium (Ge) eutectic alloy. It will be appreciated that another eutectic alloy may also be used. Otherwise, the region-divided substrate and the base substrate may also be bonded together using a conductive adhesive such as a silver (Ag) paste. The conductive adhesive can also be applied to the case where the base substrate and the cap substrate are made of materials other than silicon (Si).

By the foregoing steps shown in FIGS. 6A and 6B, the semiconductor device 200 of FIGS. 2A and 2B can be manufactured. Note that, in actual manufacturing of the semiconductor device 200, the steps prior to and including the substrate bonding are performed while each of the base substrate B23 and the region-divided substrate A21 as the cap substrate is in a wafer state. From the bonded wafer, the manufactured semiconductor devices 200 are cut into a large number of chips.

Next, variations of the region-divided substrate A20 shown in FIGS. 1A and 1B and manufacturing methods thereof will be described.

Figure 7:
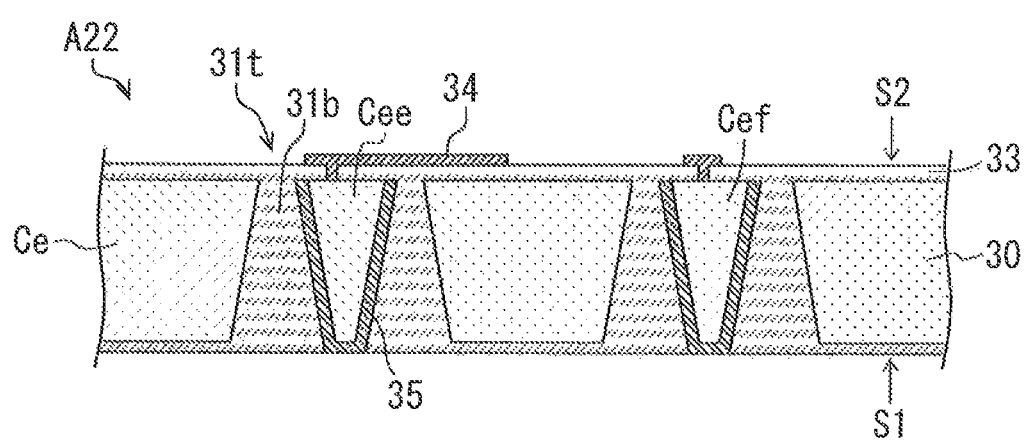
FIG. 7 is a schematic cross-sectional view of a region-divided substrate, which is a variation of the region-divided substrate shown in FIGS. 1A and 1B.

FIG. 7 is a schematic cross-sectional view of a region-divided substrate A22, which is a variation of the region-divided substrate A20 shown in FIGS. 1A and 1B. Note that, in each of the variations of the region-divided substrate A20 shown hereinafter, the same portions as in the region-divided substrate A20 shown in FIGS. 1A and 1B are provided with the same reference numerals.

The trenches 31a in the region-divided substrate A20 of FIGS. 1A and 1B or in the region-divided substrate A21 of FIGS. 2A and 2B are formed perpendicular to the substrate 30. By contrast, trenches 31t in the region-divided substrate A22 shown in FIG. 7 are formed to be tapered relative to the substrate 30. This allows easy formation of the conductive layers 35 on the side walls of the partial regions Ce separated by the trenches 31t and easy burying of the insulators 31b into the trenches 31t, as shown below.

Also, the conductive layers 35 in the region-divided substrate A20 of FIGS. 1A and 1B or in the region-divided substrate A21 of FIGS. 2A and 2B are formed only on the side walls of the partial regions Cea to Ced. By contrast, the conductive layers 35 in the region-divided substrate A22 shown in FIG. 7 are formed so as to cover not only the side walls of partial regions Cee and Cef, but also the first surface S1.

As described above, the conductive layers 35 may also be formed so as to cover not only the side walls of the partial regions, but also at least one of the first surface S1 and the second surface S2. This allows easier electrical bonding to the conductive layers 35 covering at least one of the first surface S1 and the second surface S2 than in the case where the conductive layers 35 are formed only on the side walls as in the region-divided substrate A20 of FIGS. 1A and 1B or in the region-divided substrate A21 of FIGS. 2A and 2B and, when the partial regions are used as, e.g., the extraction conductive regions, the resistance values can further be reduced.

The region-divided substrate A22 shown in FIG. 7 can be manufactured by basically the same steps as the steps of manufacturing the region-divided substrate A20 illustrated in FIGS. 3A to 5B.

FIGS. 8A to 8C and 9A to 9C are cross-sectional views showing the individual steps of an example of a method of manufacturing the region-divided substrate A22 shown in FIG. 7.

Figure 8A:
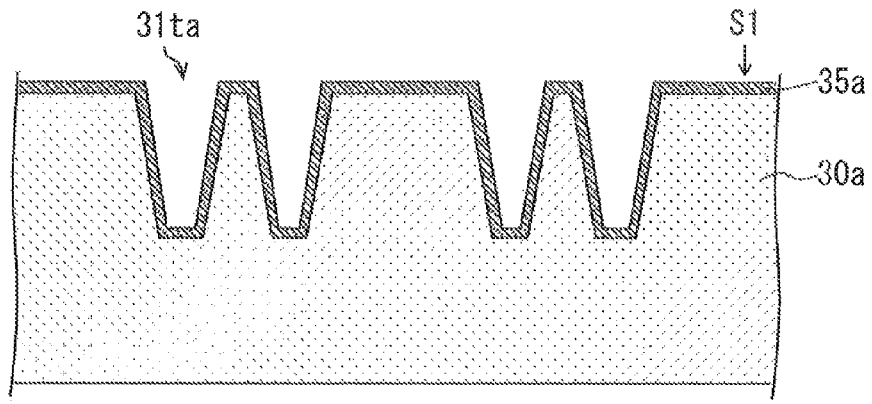
FIGS. 8A to 8C are cross-sectional views showing the individual steps of an example of a method of manufacturing the region-divided substrate shown in FIG. 7.

First, as shown in FIG. 8A, primary trenches 31ta serving as the trenches 31t of the region-divided substrate A22 are formed into tapered shapes on the first surface S1 side so as not to extend through the primary substrate 30a. Then, the primary conductive layer 35a is formed over the entire surface S1 so as to cover the side walls of the tapered primary trenches 31ta. Since the sidewalls of the primary trenches 31ta are tapered, the formation of the primary conductive layer 35a into the primary trenches 31ta shown in FIG. 8A is easier than the formation thereof into the primary trenches 31aa shown in FIG. 3A, and can provide a more uniform film thickness.

Figure 8B:
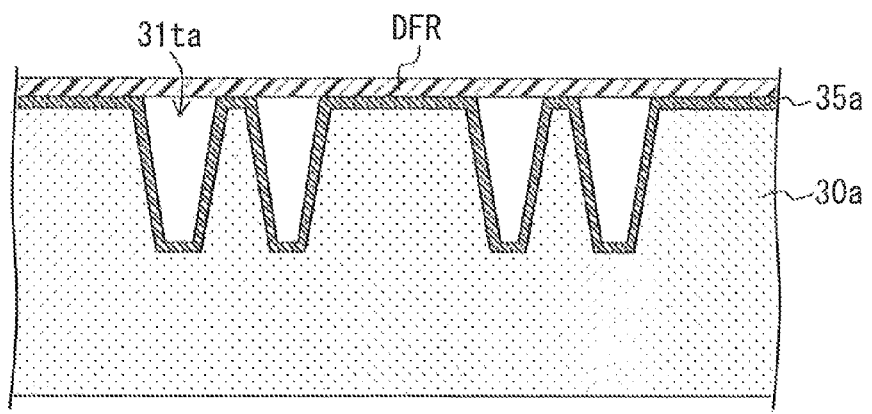

Next, as shown in FIG. 8B, the dry film resist DFR is bonded to the primary conductive layer 35a.

Figure 8C:
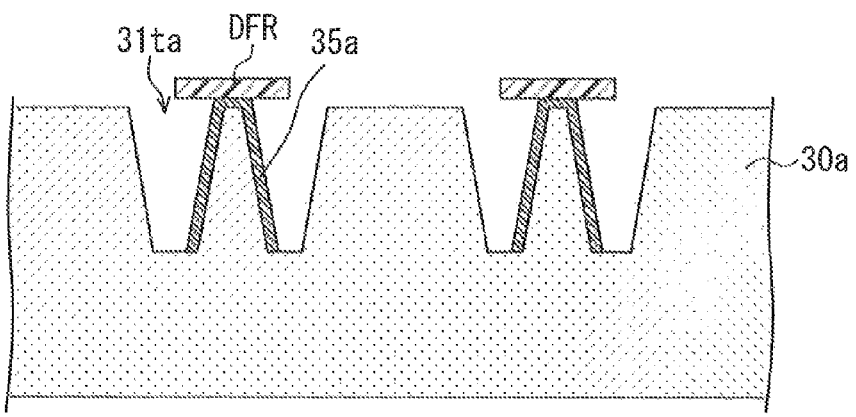

Next, as shown in FIG. 8C, the dry film resist DFR is patterned so as to protrude like eaves in the openings of the primary trenches 31a, thereby forming an etching mask for the primary conductive layer 35a. Then, using the dry film resist DFR patterned as described above as a mask, the primary conductive layer 35a formed in the primary trenches 31ta is anisotropically etched to remain only on some of the side walls and the first surface S1 of the primary substrate 30a.

Figure 9A:
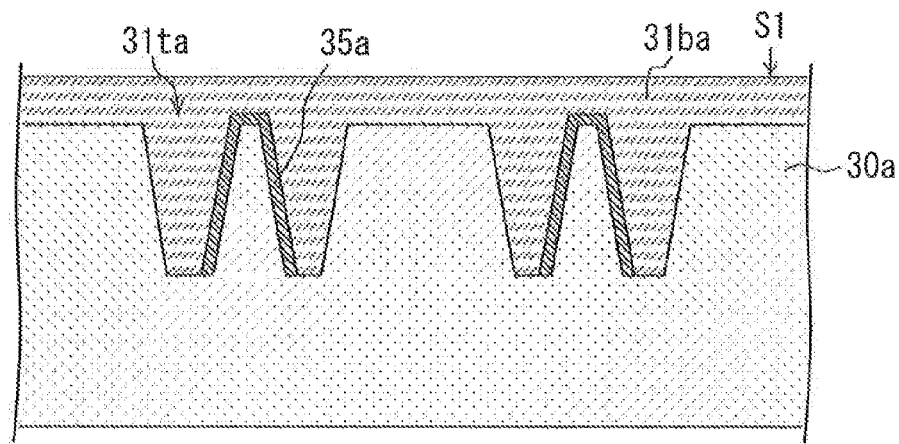
FIGS. 9A to 9C are cross-sectional views showing the individual steps of the example of the method of manufacturing the region-divided substrate shown in FIG. 7.

Next, as shown in FIG. 9A, the primary insulator 31ba is deposited over the entire first surface S1 to be buried in the primary trenches 31ta. Since the side walls of the primary trenches 31ta are tapered, the burying of the primary insulator 31ba into the primary trenches 31ta shown in FIG. 9A can be performed more easily and reliably than the burying thereof into the primary trenches 31aa shown in FIG. 4A.

Figure 9B:
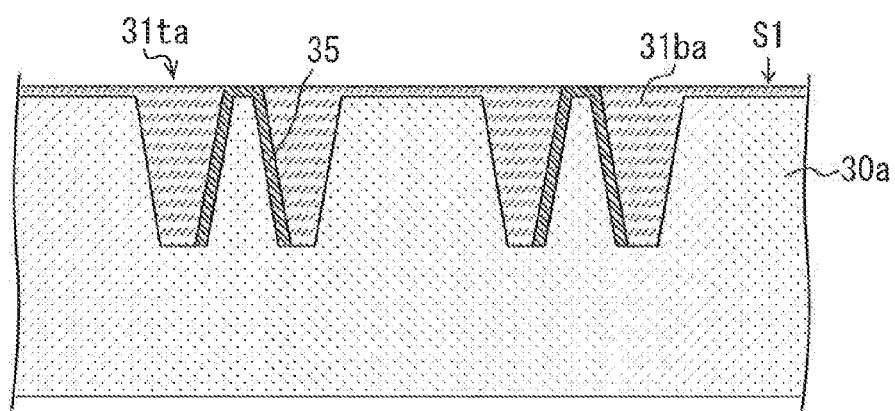

Next, as shown in FIG. 9B, grinding/polishing is performed from the first surface S1 side to expose the primary conductive layer 35a left on the first surface S1 of the primary substrate 30a, thereby forming the conductive layers 35.

Figure 9C:
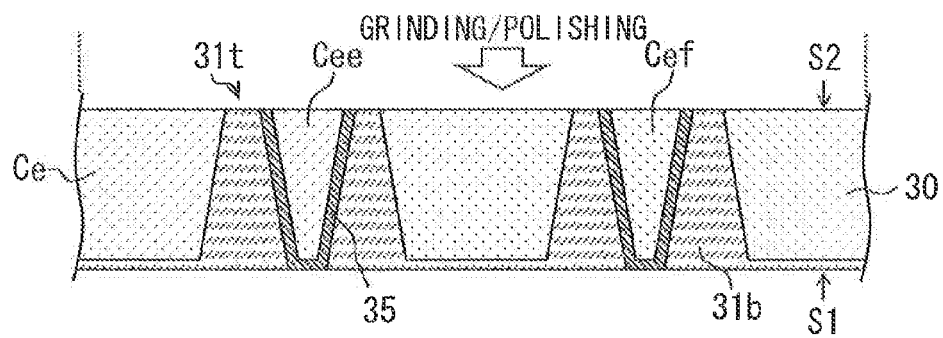

Next, as shown in FIG. 9C, the primary substrate 30a shown in FIG. 9B is inverted and ground/polished from the second surface S2 side, thereby providing the second surface S2 of the substrate 30. As a result, by the tapered trenches 31t formed so as to extend through the substrate 30, the substrate 30 is divided into the plurality of partial regions Ce.

By further forming the surface protective layer 33 by the step illustrated in FIG. 5A and forming the contact holes and the electrode pads 34 by the step illustrated in FIG. 5B, the region-divided substrate A22 shown in FIG. 7 can be manufactured.

Figure 10:
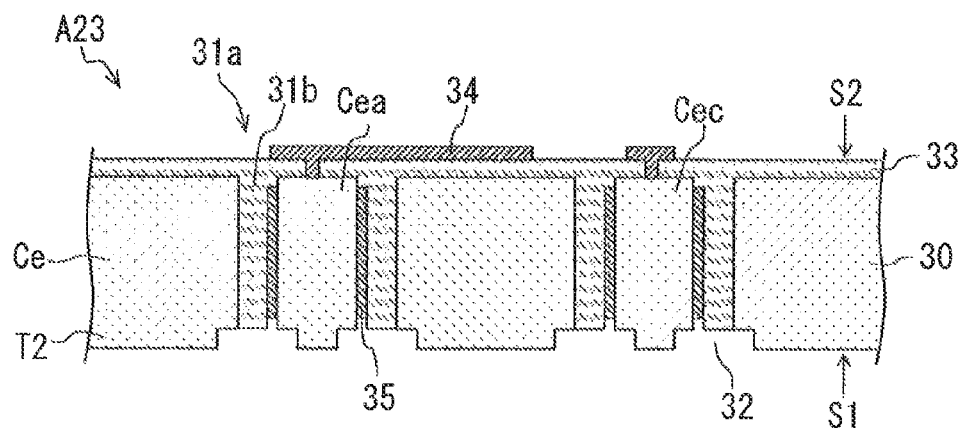
FIG. 10 is a schematic cross-sectional view of a region-divided substrate, which is another variation.

FIG. 10 is a schematic cross-sectional view of a region-divided substrate A23, which is another variation.

As can be seen from, e.g., the region-divided substrate A21 used as the cap substrate of FIG. 2B, each of the region-divided substrates A20 to A22 described above has one surface thereof formed flat. The flat surface is bonded to the projecting portion T1 made of the conductive film 50 of polysilicon, metal, or the like formed on the base substrate B3 to form the junction surface D1.

By contrast, in the region-divided substrate A23 shown in FIG. 10, in the portion opposing the predetermined region of the base substrate formed with the dynamic quantity sensor elements, recessed portions 32 are formed. In other words, around the recessed portions 32 in the region-divided substrate A23, a projecting portion T2 is formed integrally from the single-crystal silicon substrate 30. Then, the surface of the projecting portion 12 in the region-divided substrate A23 and the flat-formed surface of the base substrate are bonded together using silicon (Si) direct bonding.

The Si direct bonding may be performed either at a high temperature of 800 to 1200° C. or a low temperature (ranging from a room temperature to 450° C.), but is preferably performed at a low temperature. In particular, when a dynamic quantity sensor element which processes an extremely small amount of signal output as in the semiconductor device 200 shown in FIGS. 2A and 2B, a capacitance change based on a displacement between the opposing electrodes Em and Es is used as an output of an acceleration or angular velocity. Accordingly, to manufacture a high-accuracy dynamic quantity sensor element, it is required to minimize a thermal stress produced in the base substrate through the bonding thereof to the region-divided substrate A23 and, to satisfy the requirement, bonding at a temperature close to a room temperature is preferred. In the case where the base substrate and the region-divided substrate A23 are bonded together by low-temperature Si direct bonding, temperature restraints associated with a manufacturing process are smaller than in the case of performing high-temperature bonding. Therefore, it is possible to, e.g., form various elements in the base substrate and the region-divided substrates A23 before the base substrate and the region-divided substrate A23 are bonded together.

Specifically, the bonding together of the base substrate and the region-divided substrate A23 by low-temperature Si direct bonding is performed as follows. The base substrate and the region-divided substrate A23 that have been prepared are placed in a vacuum chamber, and the surface of the region-divided substrate A23 formed with the projecting portion T2 and the surface of the base substrate formed with the dynamic quantity sensor elements, which form a junction surface, are lightly etched by sputter etching using inert gas of argon (Ar) or the like or ion beam etching. In this manner, natural oxide films formed on the foregoing surfaces, water and organic molecules (contamination) adsorbed thereto, and the like are removed. As a result, each of the silicon surfaces is activated by a plasma, and Si atoms having bonds are exposed to be brought into an active state with large bonding forces to other Si atoms. Then, the base substrate and the region-divided substrate A23 are aligned with each other; and the surfaces thereof are brought into contact with each other at a low temperature in vacuum or in an atmosphere under a predetermined reduced pressure. As a result, the silicon (Si) atoms in the surfaces are bonded to and integrated with each other to be able to form a solid junction.

The Si direct bonding allows the base substrate and the region-divided substrate A23 to be solidly bonded together, while ensuring conductivity at a junction surface, and also allows spaces formed by the trenches 23 in the predetermined region of the base substrate and the recessed portions 32 in the region-divided substrate A23 to be completely sealed.

Note that, in the region-divided substrate A23 of FIG. 10 used as the cap substrate as described above also, the conductive layers 35 having high conductivity are formed on the side walls of the partial regions Cea and Cec used as the extraction conductive regions separated by the trenches 31a, in the same manner as in the region-divided substrate A21 of the semiconductor devices 200 shown in FIGS. 2A and 2B. Therefore, needless to say, in the partial regions Cea and Cec used as the extraction conductive regions of the region-divided substrate A23, the resistance values can be reduced to be smaller than in the extraction conductive regions Ce1 and Ce1 of the related-art semiconductor devices 91 shown in FIGS. 32A and 32B.

On the other hand, in the region-divided substrate A23 of FIG. 10, the conductive layers 35 are not formed on the side walls of the partial region Ce around the extraction conductive regions (partial regions Cea and Cec), in contrast to the region-divided substrate A11 shown in FIGS. 35A and 35B. Accordingly, in the region-divided substrate A23 of FIG. 10, it is possible to only benefit from advantages provided by forming the conductive layers 35 on the side walls of the partial regions, while allowing removal of adverse effects resulting from the formation of the conductive layers 35 in the other partial regions.

The region-divided substrate A23 shown in FIG. 10 can be manufactured by basically the same steps as the steps of manufacturing the region-divided substrate A20 illustrated in FIGS. 3A to 5B.

Figure 11A:
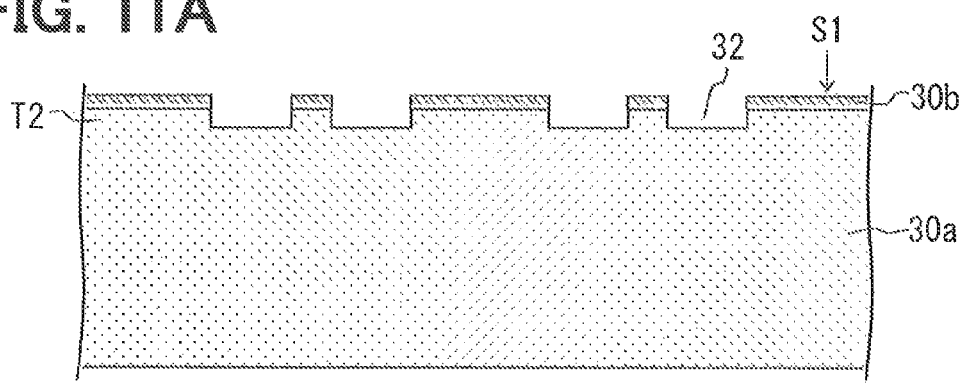
FIGS. 11A and 11B are cross-sectional views showing the individual steps of an example of a method of manufacturing the region-divided substrate shown in FIG. 10.
Figure 11B:
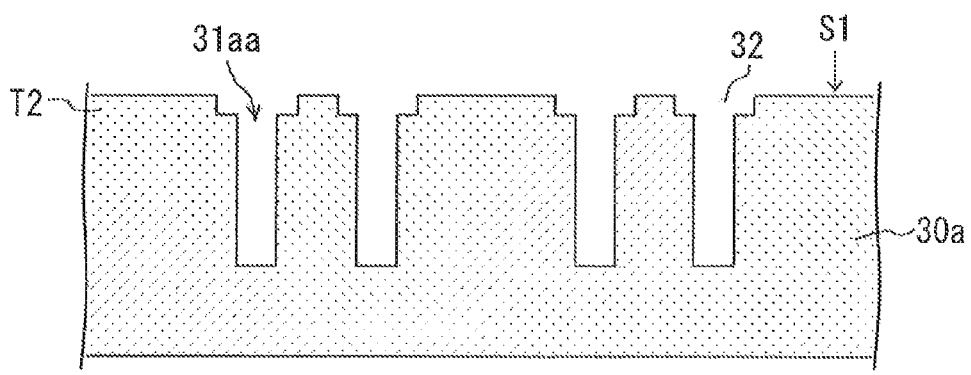

FIGS. 11A and 11B are cross-sectional views showing the individual steps of an example of a method of manufacturing the region-divided substrate A23 shown in FIG. 10.

First, as shown in FIG. 11A, the primary substrate 30a made of single-crystal silicon is prepared. Then, on the first surface S1 side, a silicon dioxide (SiO$_2$) film 30b is formed by thermal oxidation to a thickness of 0.1 to 1 μm. Next, by photolithography and etching, the SiO$_2$ film 30b is partially removed and processed into a predetermined pattern. Then, using the SiO$_2$ film 30b in the predetermined pattern as a mask, the primary substrate 30a is dry-etched to form the recessed portions 32 at depths of 0.1 to 10 μm. In this manner, the projecting portion T2 of the region-divided substrate A23 to be bonded to the base substrate is formed.

Next, as shown in FIG. 11B, the SiO$_2$ film 30b used as a mask is removed. Then, a mask in a predetermined pattern is formed again on the first surface S1 side of the primary substrate 30a and, by photolithography and deep reactive ion etching, the primary trenches 31aa having generally perpendicular walls and not extending through the primary substrate 30a are formed.

Thereafter, by performing the individual steps illustrated in FIGS. 3 to 5, the region-divided substrate A23 of FIG. 10 can be manufactured.

Figure 12:
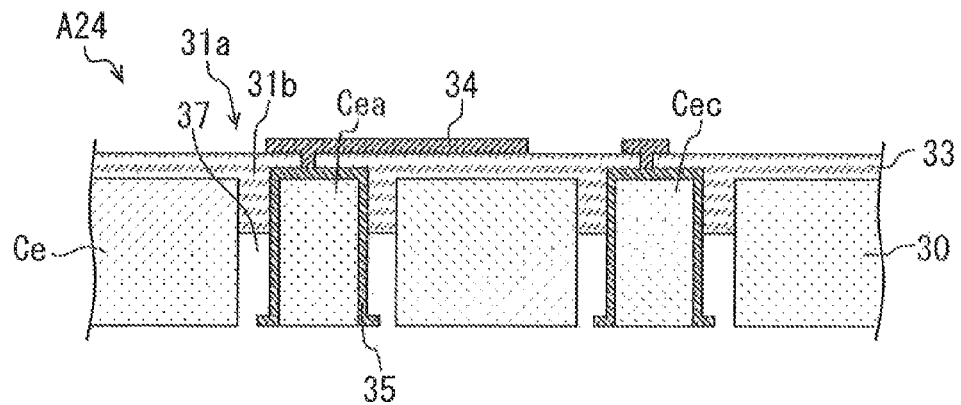
FIG. 12 is a schematic cross-sectional view of a region-divided substrate, which is still another variation.

FIG. 12 is a schematic cross-sectional view of a region-divided substrate A24, which is still another variation.

In each of the region-divided substrates A20 to A23 described above, the insulators 31b are buried in the trenches 31a or 31t to be continuous from one surface side of the region-divided substrate A20, A21, A22, or A23 to the other surface side thereof. By contrast, in the region-divided substrate A24 of FIG. 12, the insulators 31b are buried only in the upper portions of the trenches 31a, and the lower portions of the trenches 31 are vacant spaces 37. Therefore, in the region-divided substrate A24 of FIG. 12, in comparison with the region-divided substrates A20 to A23 described above, the parasitic capacitances using the insulators 31b as the dielectric layers can be reduced, and the stress resulting from the insulators 31*b* can be reduced.

Figure 13A:
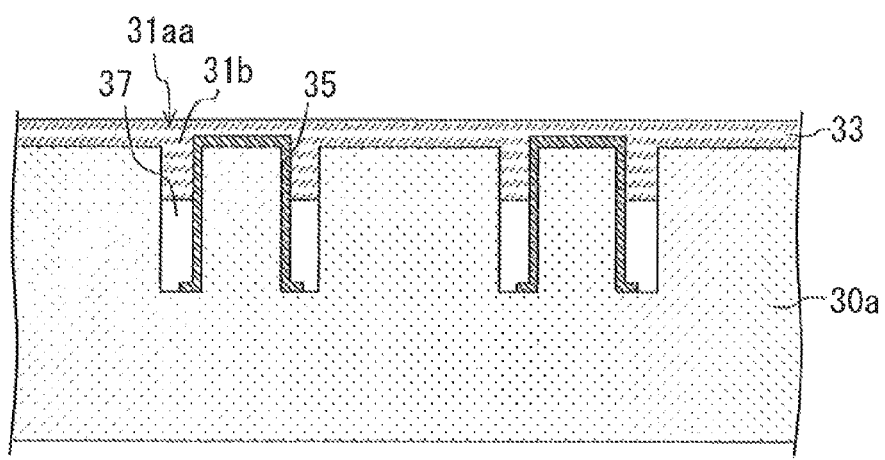
FIGS. 13A and 13B are views illustrating an example of a method of manufacturing the region-divided substrate shown in FIG. 12, which are cross-sectional views of the characteristic manufacturing steps thereof.
Figure 13B:
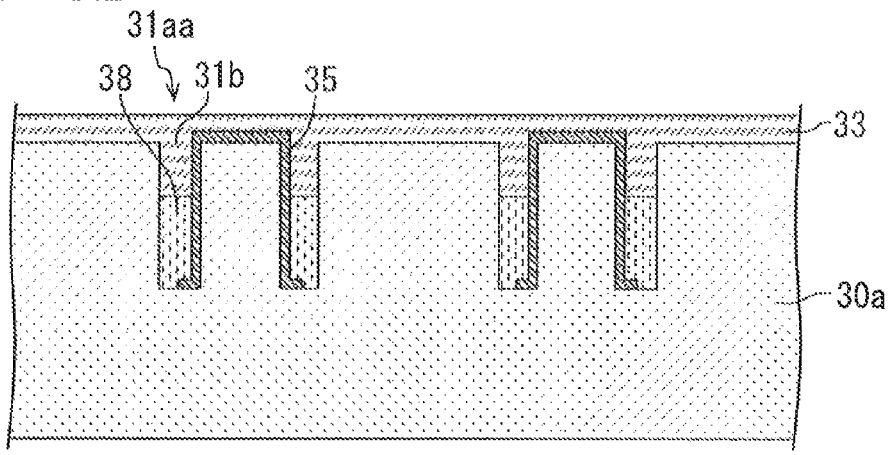

FIGS. 13A and 13B are views illustrating an example of a method of manufacturing the region-divided substrate A24 shown in FIG. 12, which are cross-sectional views of the characteristic manufacturing steps thereof.

The region-divided substrate A24 shown in FIG. 12 can be manufactured by using the steps of manufacturing the region-divided substrate A20 illustrated in FIGS. 3A to 5B, and partly modifying the steps.

In manufacturing the region-divided substrate A24 of FIG. 12, the individual steps illustrated in FIGS. 3A to 3C are performed first. That is, after the primary trenches 31*aa* are formed in one surface layer portion of the primary substrate 30*a*, the primary conductive layer 35*a* is deposited, and the primary conductive layer 35*a* formed on the side walls of the primary trenches 31*aa* is partly removed to be patterned.

Next, as shown in FIG. 13A, by a CVD method, sputtering film deposition, or the like, a $SiO_2$ film is rapidly deposited to form the insulators 31*b* buried in the upper portions of the primary trenches 31*aa* and the surface protective layer 33 over the primary substrate 30*a*. By thus performing the rapid film deposition, the openings of the primary trenches 31*aa* are closed first, while the vacant spaces 37 are left in the lower portions thereof. This allows a configuration to be formed in which the insulators 31*b* are buried only in the upper portions of the primary trenches 31*aa*.

Subsequently, the contact holes are formed at predetermined positions in the surface protective layer 33, and a film made of aluminum (Al) or the like is formed on the entire surface and then patterned by photolitho-etching to form the wires and the electrode pads 34 shown in FIG. 12.

Next, the primary substrate 30*a* is ground by cutting, CMP, or the like from the lower surface side thereof until the vacant spaces 37 shown in FIG. 13A are exposed.

By the foregoing steps, the region-divided substrate A24 shown in FIG. 12 can be manufactured.

FIG. 13B is a view illustrating another method of manufacturing the region-divided substrate A24 shown in FIG. 12.

As described above, the individual steps illustrated in FIGS. 3A to 3C are performed first to form the primary trenches 31*aa* in one surface layer portion of the primary substrate 30*a*. Then, the primary conductive layer 35*a* is deposited and patterned by removing the part thereof formed on the side walls of the primary trenches 31*aa*.

Next, as shown in FIG. 13B, the insulators 38 of PSG or the like as sacrificial layers showing a high etching speed are buried in the lower portions of the primary trenches 31*aa*. Then, by a CVD method, sputtering film deposition, or the like, a $SiO_2$ film is deposited to form the insulators 31*b* over the insulators 38 and the surface protective layer 33 over the primary substrate 30*a*.

Subsequently, the contact holes are formed at predetermined positions in the surface protective layer 33, and a film made of aluminum (Al) or the like is formed on the entire surface and then patterned by photolitho-etching to form the wires and the electrode pads 34 shown in FIG. 12.

Next, the primary substrate 30*a* is ground by cutting, CMP, or the like from the lower surface side thereof until the insulators 38 shown in FIG. 13B are exposed.

Finally, using an aqueous HF-based solution, etching is performed to remove the insulators 38 showing a high etching speed. In this manner, the vacant spaces 37 of the trenches 31*a* shown in FIG. 12 are formed.

By the foregoing steps, the region-divided substrate A24 shown in FIG. 12 can be manufactured.

In manufacturing the region-divided substrate A24 of FIG. 12 in which the insulators 31*b* are buried only on one surface side thereof, in the manufacturing step of FIG. 13B, the step of grinding the primary substrate 30*a* from the lower surface side thereof can be performed in a state where the insulators 38 have been buried in the trenches 31*a*. Therefore, in comparison with the manufacturing step of FIG. 13A, it is possible to reliably suppress the cracking or chipping of the substrate resulting from the grinding.

Figure 14A:
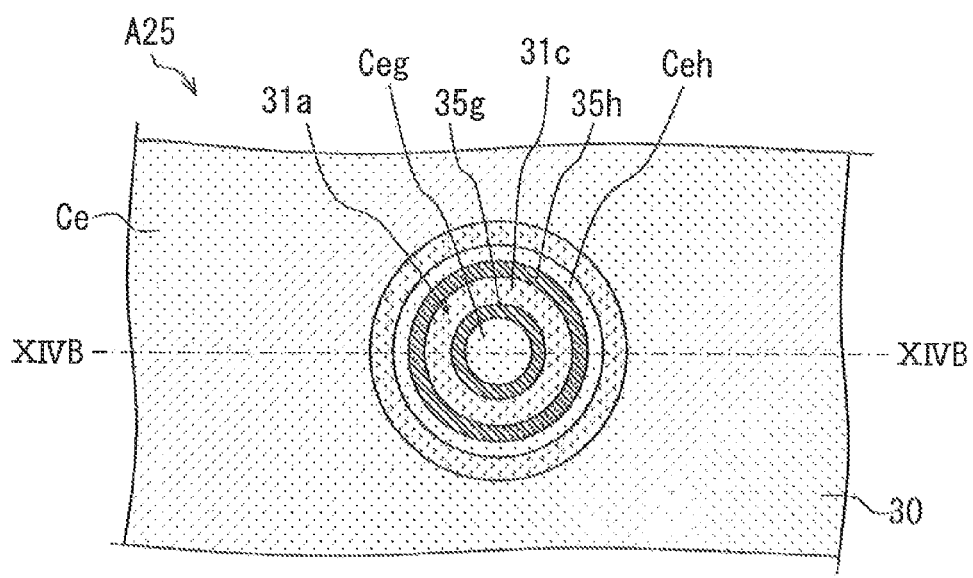
Figure 14B:
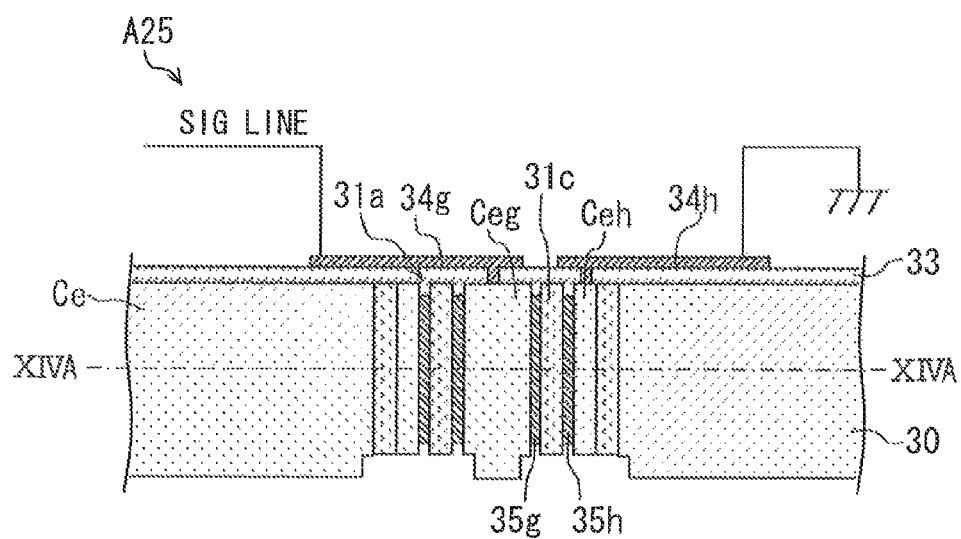

FIGS. 14A and 14B are views showing an example of another region-divided substrate, of which FIG. 14A is a partial plan view schematically showing a region-divided substrate A25 and FIG. 14B is a cross-sectional view schematically showing the region-divided substrate A25. Note that, the cross-sectional view of FIG. 14B shows a cross section along a dash-dot line G-G of FIG. 14A, and FIG. 14A shows a cross section along a dash-dot line H-H in FIG. 14B.

In the region-divided substrate A25 shown in FIGS. 14A and 14B, partial regions Ceg and Ceh having conductive layers 35*g* and 35*h* formed on the side walls thereof are arranged adjacent to each other to form a feedthrough capacitor with an insulator 31*c* buried in the trench 31*a* being interposed therebetween. That is, the feedthrough capacitor has the insulator 31*c* buried in the trench 31*a* as a dielectric layer, has the conductive layer 35*g*, the partial region Ceg, and an electrode pad 34*g* as one electrode, and has the conductive layer 35*h*, the partial region Ceh, and an electrode pad 34*h* as the other electrode.

The foregoing region-divided substrate in which the conductive layers are formed on the side walls of some of the partial regions may also have a configuration formed with a feedthrough capacitor, like the region-divided substrate A25 shown in FIGS. 14A and 14B. The feedthrough capacitor can be used for an anti-noise purpose in a sensor which mostly processes an extremely weak signal or the like.

The feedthrough capacitor of the region-divided substrate A25 shown in FIGS. 14A and 14B has a configuration in which, e.g., around a signal line, the insulator 31*c* formed of a $BaTiO_3$ film, a $SiO_2$ film, or a laminate film thereof is formed as a dielectric material, and surrounded by a ground region located outside thereof. In the example of FIGS. 14A and 14B, the configuration is such that the wire 34*g* of the signal line and the ground wire 34*h* come in contact with the respective partial regions Ceg and Ceh made of silicon. However, as in the example shown below, the configuration may also be such that the entire partial regions Ceg and Ceh are covered with conductive layers 35*g* and 35*h*, and the wires 34*g* and 34*h* come in contact with the respective conductive layers 35*g* and 35*h*.

Also, in the example of FIGS. 14A and 14B, the partial region Ceh as the independent ground region is disposed around the partial region Ceg as the through electrode, but it may also be possible to cause the entire partial region surrounding the partial region Ceg to serve as the ground region.

Figure 15:
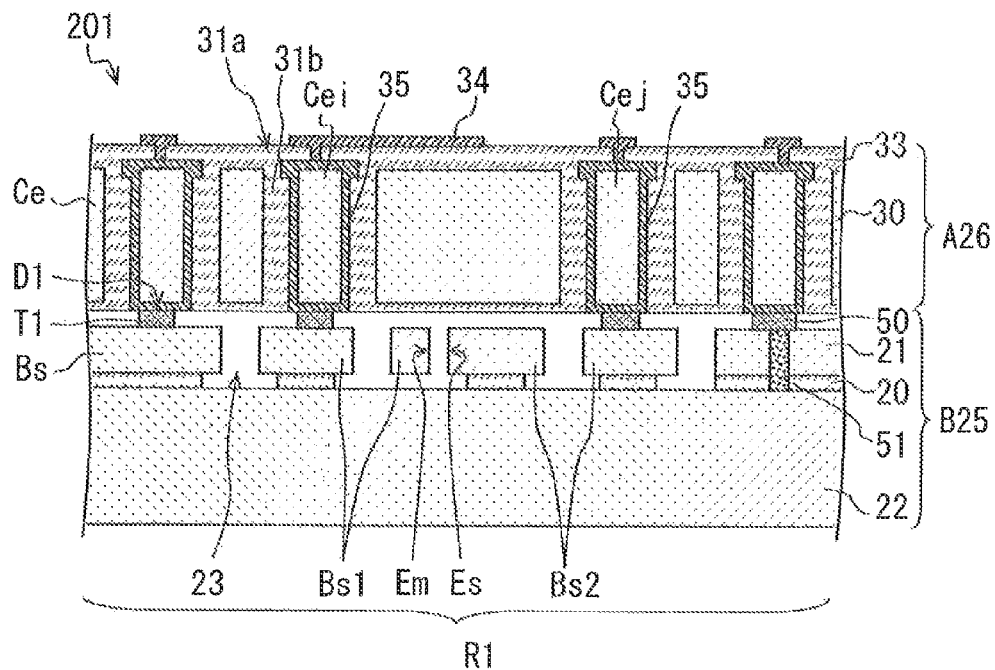
FIG. 15 is a view showing a variation of the semiconductor device shown in FIGS. 2A and 2B, which is a schematic cross-sectional view of a semiconductor device.
Figure 16:
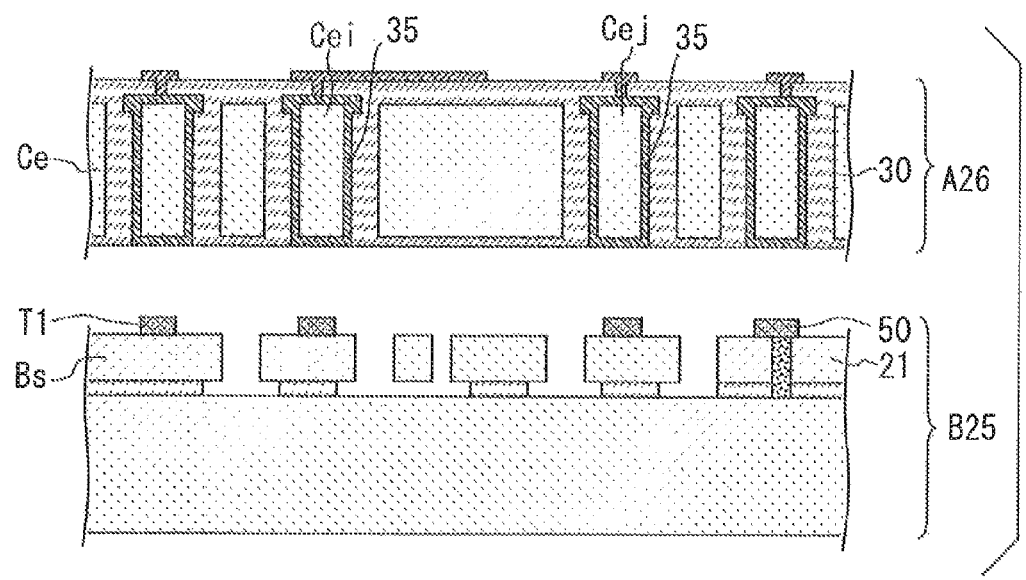
FIG. 16 is a view showing a base substrate and a region-divided substrate which form the semiconductor device of FIG. 15 in exploded relation, which shows the aligning and stacking of the region-divided substrate with and on the base substrate before the bonding together thereof.

FIG. 15 is a view showing a variation of the semiconductor device 200 shown in FIGS. 2A and 2B, which is a schematic cross-sectional view of a semiconductor device 201. FIG. 16 is a view showing a base substrate B25 and a region-divided substrate A26 which form the semiconductor device 201 of FIG. 15 in exploded relation, which shows the aligning and stacking of the region-divided substrate A26 with and on the base substrate B25 before the bonding together thereof.

The base substrate B25 of the semiconductor device 201 shown in FIG. 15 has the same configuration as that of the base substrate B23 of the semiconductor device 200 shown in FIGS. 2A and 2B. On the other hand, in the region-divided substrate A21 used as the cap substrate in the semiconductor device 200 of FIGS. 2A and 2B, the conductive layers 35 having high electrical conductivity are formed only on the side walls of the partial regions Cea to Ced separated by the trenches 31a. By contrast, in the region-divided substrate A26 used as the cap substrate in the semiconductor device 201 of FIG. 15, the conductive layers 35 having high electrical conductivity are formed so as to cover not only the side walls of partial regions Cei and Cej used as the extraction conductive regions, but also the surfaces of both of the partial regions Cei and Cej.

In the semiconductor device 201 shown in FIG. 15, electrical bonding to the conductive layers 35 covering both of the surfaces is easier than in the semiconductor device 200 of FIGS. 2A and 2B, and the resistance values when the partial regions Cei and Cej are used as the extraction conductive regions can further be reduced. Note that, as shown in the region-divided substrate A22 of FIG. 7, in the semiconductor device 201 of FIG. 15, the conductive layer 35 having high electrical conductivity may also be formed so as to cover the surface of only either one of the partial regions Cei and Cej used as the extraction conductive regions. Also, as shown in FIG. 15, in each of the partial regions Cei and Cej of the region-divided substrate A26, the conductive layer 35 having high electrical conductivity is formed over the lower surface for connection to the base substrate B25, the side walls, and the upper surface for connection to the outside so as to integrally cover the entire surfaces of the partial region Cei or Cej. Therefore, in the configuration of the region-divided substrate A26 shown in FIG. 15, as the substrate serving as the mother substrate, not only a conductive substrate such as the single-crystal silicon substrate 30 or a polysilicon substrate, but also an insulator substrate of glass, quartz glass, ceramic, or the like having a thermal expansion coefficient equal to that of silicon can be used.

FIGS. 17A to 18D are views illustrating a method of manufacturing the region-divided substrate A26 used as the cap substrate in the semiconductor device 201 of FIG. 15, which are cross-sectional views of the characteristic manufacturing steps thereof.

The region-divided substrate A26 shown in FIG. 15 can be manufactured by using the steps of manufacturing the region-divided substrate A20 illustrated in FIGS. 3A to 5B, and partly modifying the steps.

Figure 17A:
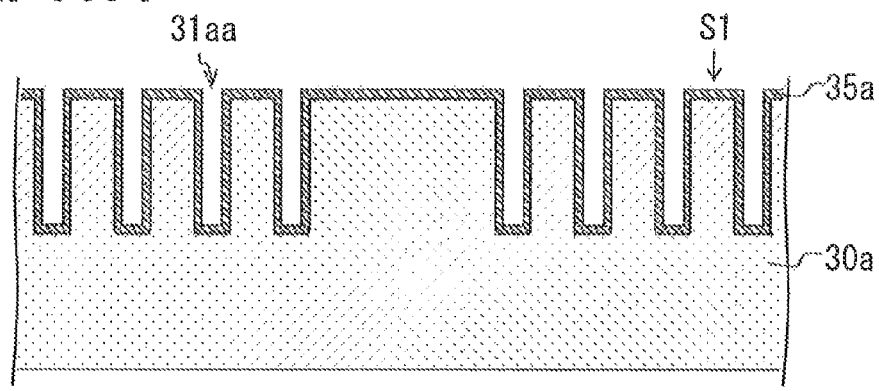
FIGS. 17A to 17C are views illustrating a method of manufacturing the region-divided substrate used as a cap substrate in the semiconductor device of FIG. 15, which are cross-sectional views of the characteristic manufacturing steps thereof.

First, as shown in FIG. 17A, the primary substrate 30a made of single-crystal silicon is prepared, and a mask in a predetermined pattern is formed. Then, by photolithography and deep reactive ion etching, the primary trenches 31aa having generally perpendicular walls and not extending through the primary substrate 30a are formed. Then, the primary conductive layer 35a is formed over the entire first surface S1 so as to cover the side walls of the primary trenches 31aa and the upper surface of the primary substrate 30a.

Next, by performing the step illustrated in FIG. 3B, the dry film resist DFR is bonded to the first surface S1 side of the primary substrate 30a formed with the primary conductive layer 35a.

Figure 17B:
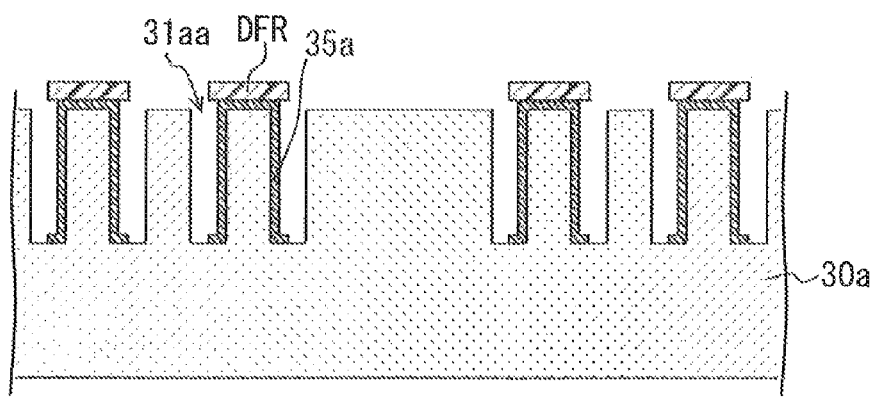

Next, as shown in FIG. 17B, the dry film resist DFR is patterned so as to protrude like eaves in the openings of the primary trenches 31aa and, using the dry film resist DFR as a mask, the primary conductive layer 35a formed in the primary trenches 31aa is anisotropically etched. In this manner, part of the primary conductive layer 35a formed on the side walls of the primary trenches 31aa and part thereof formed on the primary substrate 30a are removed to leave the conductive layers 35 only on the predetermined side walls.

Figure 17C:
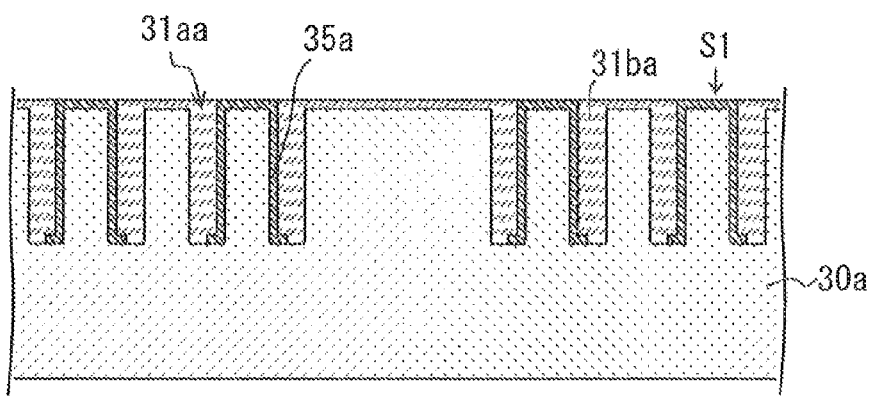

Next, as shown in FIG. 17C, the primary insulator 31ba serving as the insulators 31b of the region-divided substrate A26 is deposited on the entire first surface S1 to be buried in the primary trenches 31aa formed with the primary conductive layer 35a. Next, using the primary conductive layer 35a formed on the first surface S1 of the primary substrate 30a as a stopper, the primary insulator 31ba is removed by CMP or the like until the primary conductive layer 35a formed on the first surface S1 is exposed.

Figure 18A:
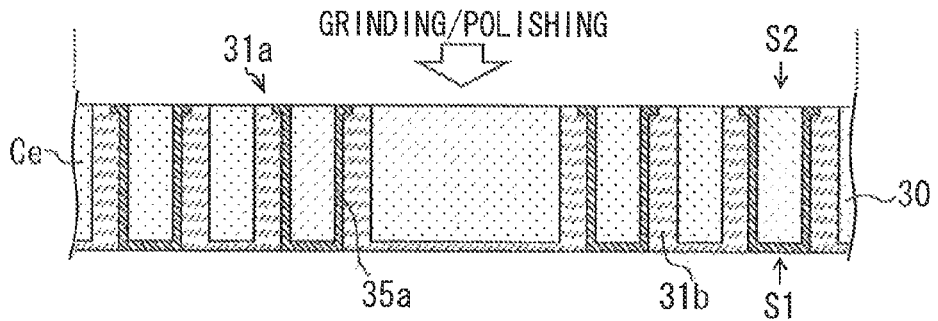
FIGS. 18A to 18D are views illustrating the method of manufacturing the region-divided substrate used as the cap substrate in the semiconductor device of FIG. 15, which are cross-sectional views of the characteristic manufacturing steps thereof.

Next, as shown in the inverted view of FIG. 18A, grinding/polishing is performed from the second surface S2 side to expose the primary insulator 31ba buried in the primary trenches 31aa to provide the second surface S2 of the substrate 30, the trenches 31a, and the insulators 31b in the region-divided substrate A26. In this manner, the substrate 30 is divided into the plurality of partial regions Ce.

Figure 18B:
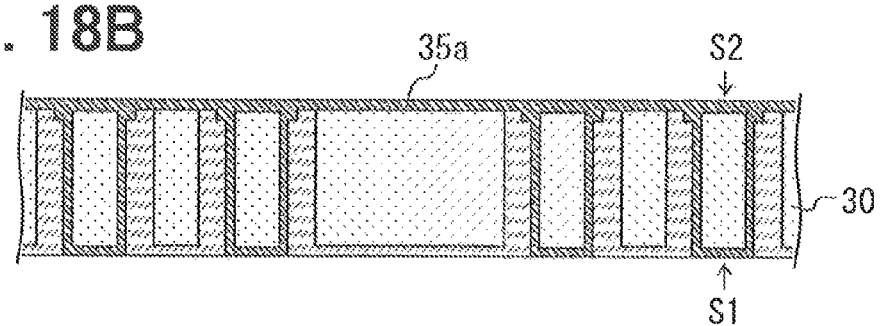

Next, as shown in FIG. 18B, over the entire second surface S2, the primary conductive layer 35a is deposited again.

Figure 18C:
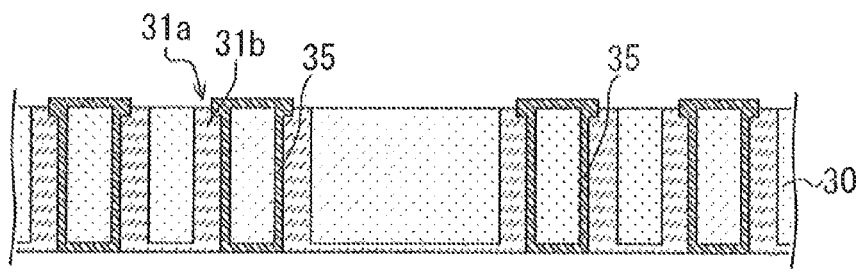

Next, as shown in FIG. 18C, on the second surface S2 side of the substrate 30 also, by photolithography and etching, the primary conductive layer 35a formed on the second surface S2 is patterned into a predetermined pattern to provide the conductive layers 35 in the region-divided substrate A26.

Figure 18D:
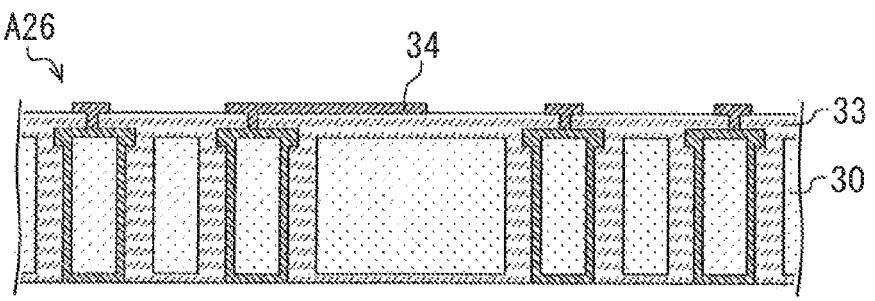

Finally, by performing the steps illustrated in FIGS. 5A and 5B, as shown in FIG. 18D, the surface protective layer 33 formed of a silicon dioxide ($SiO_2$) film or the like, and the wires and the electrode pads 34 each made of aluminum (Al) or the like are formed.

By the foregoing steps shown in FIGS. 17A to 18D, the region-divided substrate A26 used as the cap substrate in the semiconductor device 201 of FIG. 15 can be manufactured.

Further, the region-divided substrate A26 thus manufactured is aligned with respect to the base substrate B25 separately prepared as shown in FIG. 16, stacked thereon, and bonded thereto, whereby the semiconductor device 201 of FIG. 15 can be manufactured.

Figure 19:
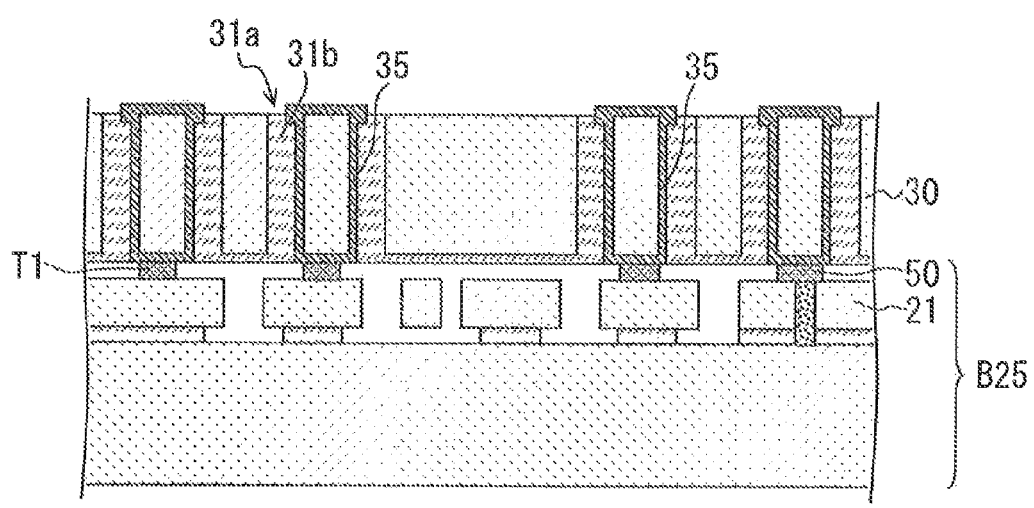
FIG. 19 is a view illustrating another method of manufacturing the semiconductor device shown in FIG. 15, which is a cross-sectional view of the step of preliminarily bonding together the region-divided substrate and the base substrate separately prepared prior to the formation of a surface protective layer, wires, and electrode pads each shown in FIG. 18C.

FIG. 19 is a view illustrating another method of manufacturing the semiconductor device 201 shown in FIG. 15, which is a cross-sectional view of the step of preliminarily bonding together the region-divided substrate shown in FIG. 18C before the surface protective layer 33, the wires, and the electrode pads 34 are formed and the base substrate B25 separately prepared.

In the case of manufacturing the semiconductor device 201 of FIG. 15, as shown in FIG. 19, it may also be possible that the region-divided substrate shown in FIG. 18C and the base substrate B25 separately prepared are bonded together first, and then the surface protective layer 33 the wires, and the electrode pads 34 are formed.

Figure 20A:
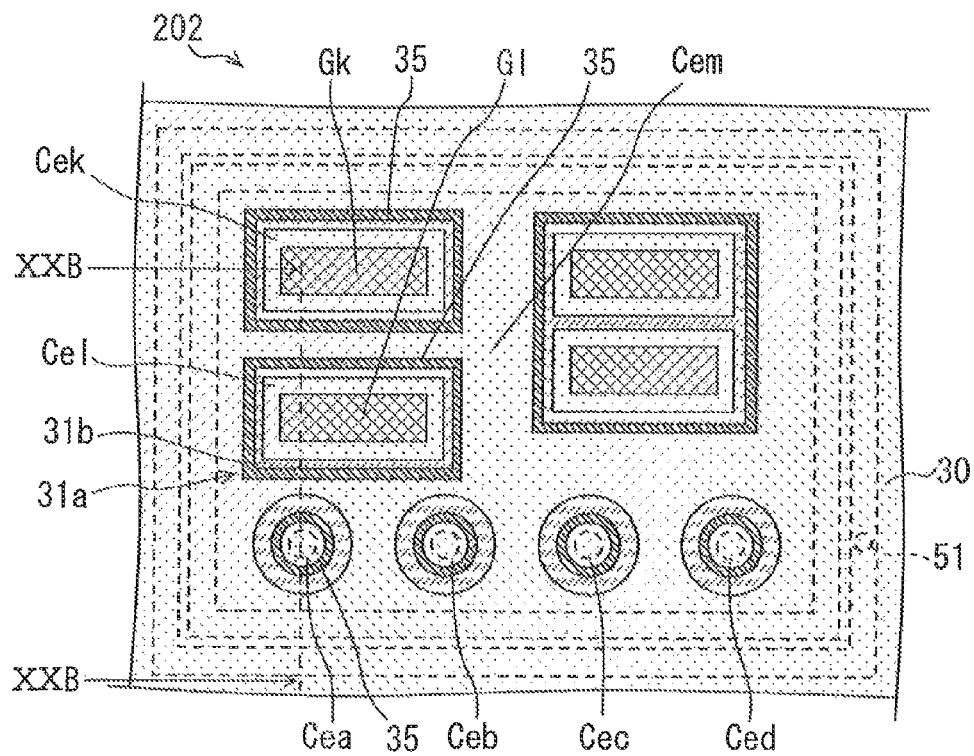
Figure 20B:
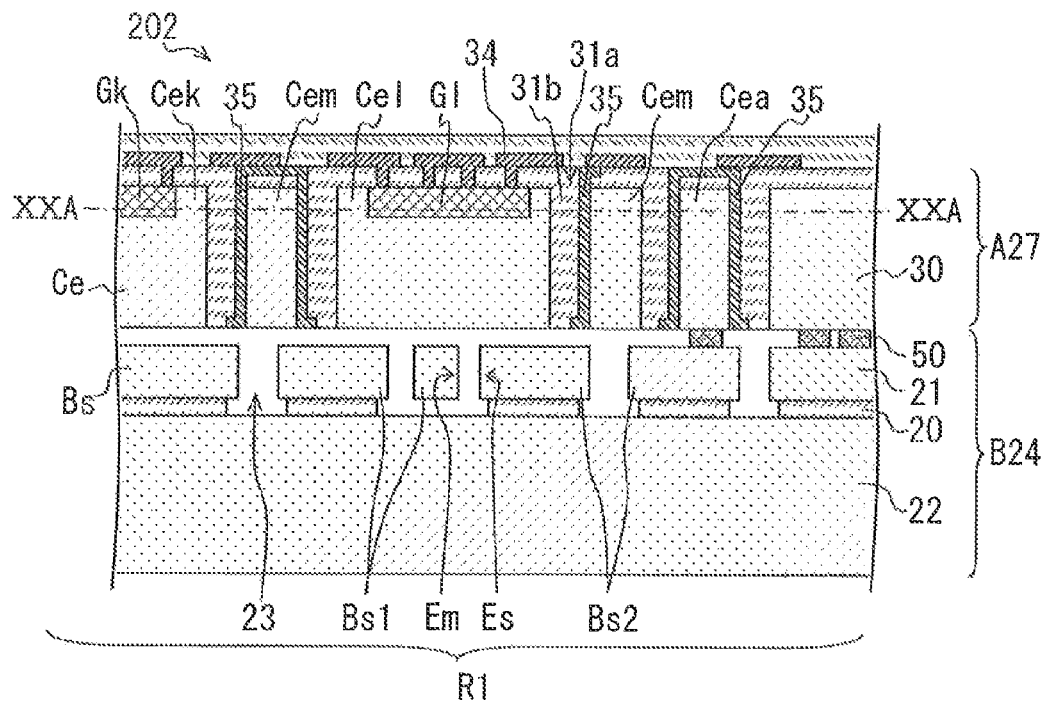

FIGS. 20A and 20B are views showing another variation of the semiconductor device 200 shown in FIGS. 2A and 2B, of which FIG. 20A is a partial plan view schematically showing a semiconductor device 202 and FIG. 20B is a cross-sectional view schematically showing the semiconductor device 202. The cross-sectional view of FIG. 20B shows a cross section along a dash-dot line XXB-XXB of FIG. 20A, which is arbitrarily extended/contracted along the section line and simplified for clear illustration. FIG. 20A is a view showing a cross section along a dash-dot line XXA-XXA in FIG. 20B.

In the region-divided substrate A21 of the semiconductor device 200 shown in FIGS. 2A and 2B, the conductive layers 35 are formed on the side walls of the partial regions Cea to Ced functioning as the extraction conductive regions, while the conductive layers 35 are not formed on the respective side walls of the rectangular partial regions Cek and Cel each occupying a large area and shown in the upper portion of FIG. 2A and the partial region Cem surrounding the partial regions Cek and Cel.

On the other hand, in the semiconductor device shown in FIGS. 20A and 20B, the single-crystal silicon substrate 30 is used as the mother substrate of a region-divided substrate A27, and IC circuits Gk and Gl such as a bipolar circuit and a CMOS circuit are formed in, e.g., the rectangular partial regions Cek and Cel each occupying a large area and shown in the upper portion of FIG. 20A. On the side walls of the partial regions Cek and Cel formed with the IC circuits Gk and Gl, the conductive layers 35 are not formed while, on the side walls of the partial region Cem surrounding the partial regions Cek and Cel formed with the IC circuits Gk and Gl, the conductive layers 35 are formed with the insulators 31b buried in the trenches 31a being interposed between the conductive layers 35 and the partial regions Cek and Cel.

In the region-divided substrate A27 of the semiconductor device 202 shown in FIGS. 20A and 20B, the conductive layers 35 are not formed on the side walls of the partial regions Cek and Cel formed with the IC circuits Gk and Gl. Therefore, it is possible to remove adverse defects resulting from, e.g., the formation of the conductive layers 35 such as electric leakage from the IC circuit Gk or Gl or adverse effects such as easier occurrence of crystal defects or the like in the manufacturing of the IC circuits described above and the resulting degradation of the flexibility of the manufacturing process. On the other hand, since the conductive layers 35 are formed on the side walls of the partial region Cem surrounding the partial regions Cek and Cel formed with the IC circuits Gk and Gl, it is possible to cause the conductive layers 35 to function as a noise shield for the IC circuits Gk and Gl. Note that, since the partial region Cem occupies a large area, it is preferable to select a soft metal material for the conductive layers 35 formed on the side walls of the partial region Cem or reduce the thicknesses thereof, and thereby reduce a stress resulting from the formation of the conductive layers 35.

On the other hand, in the semiconductor device 202 shown in FIGS. 20A and 20B also, in the same manner as in the semiconductor device 200 shown in FIGS. 2A and 2B, the partial regions Cea to Ced having the conductive layers 35 formed on the side walls thereof and occupying small areas are connected to the predetermined base semiconductor regions Bs in a base substrate B24 and function as the extraction conductive regions. As described above, the partial regions Cea to Ced occupy small areas. Accordingly, even if the conductive layers 35 are formed on the side walls thereof, it is possible to ignore stress-related adverse effects and only benefit from advantages provided by forming the conductive layers 35 on the side walls.

Note that, when the semi-conductive single-crystal silicon substrate, SOI substrate, or compound semiconductor substrate is used as the mother substrate of the region-divided substrate, various semiconductor elements and IC circuits can be formed not only on the base substrate, but also in the predetermined ones of the plurality of partial regions Ce formed in the region-divided substrate used as the cap substrate, as in the semiconductor device 202 shown in FIGS. 20A and 20B.

In the region-divided substrate A21 of FIGS. 2A and 2B in which no IC circuit is formed, it is possible to use the single-crystal silicon substrate 30 having a specific resistance (impurity concentration) in a wide range of, e.g., 0.001 to 100 Ωm. Alternatively, when the IC circuits Gk and Gl are formed in the predetermined partial regions Cek and Cel as in the region-divided substrate A27 of the semiconductor device 202 shown in FIGS. 20A and 20B, it is possible to use the single-crystal silicon substrate 30 having an impurity concentration appropriate for the formation of the IC circuits Gk and Gl. In particular, for the single-crystal silicon substrate 30 in which semiconductor elements, especially the IC circuits Gk and Gl, are formed, a single-crystal silicon substrate having a specific resistance of 0.1 to 20 Ωcm is desirable. Note that the conductivity type of each of the single-crystal silicon substrates 30 may be either an N-conductivity type or a P-conductivity type.

In the case where the substantial portions of the dynamic quantity sensor elements are formed in the base substrate B24 as in the semiconductor device 202 of FIGS. 20A and 20B, the IC circuits Gk and Gl formed in the region-divided substrate A27 are used as peripheral circuits for processing outputs from the dynamic quantity sensor elements. By thus placing the IC circuits Gk and Gl over the substantial portions of the dynamic quantity sensor elements which need large areas, it is possible to efficiently use the region-divided substrate A27 used as the cap substrate and reduce the size of the entire semiconductor device 202. Note that, in this case, the IC circuits Gk and Gl may also be formed either before or after the bonding together of the base substrate B24 and the region-divided substrate A27.

FIGS. 21A to 22C are views illustrating a method of manufacturing the region-divided substrate A27 used as the cap substrate in the semiconductor device 202 of FIGS. 20A and 20B, which are cross-sectional views of the manufacturing steps thereof when the IC circuits Gk and Gl shown above are formed before the region-divided substrate A27 is bonded to the base substrate B24.

The region-divided substrate A27 shown in FIGS. 20A and 20B can be manufactured by using the steps of manufacturing the region-divided substrate A20 illustrated in FIGS. 3A to 5B, and partly modifying the steps.

Figure 21A:
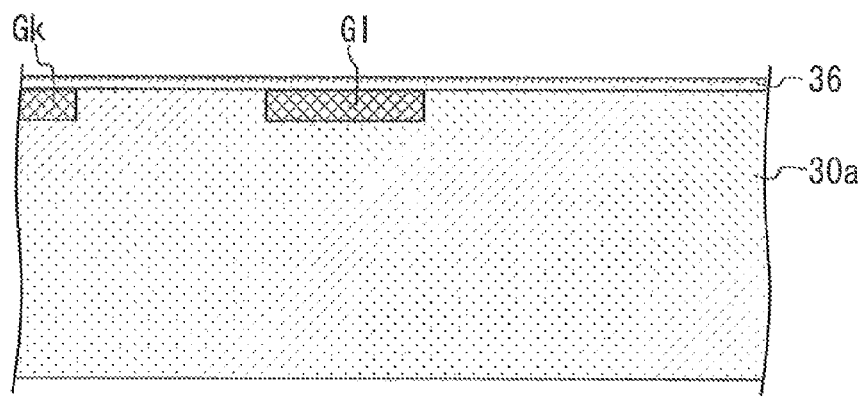
FIGS. 21A to 21C are views illustrating a method of manufacturing a region-divided substrate of FIGS. 20A and 20B, which are cross-sectional views of the manufacturing steps thereof when IC circuits shown above are formed before the region-divided substrate is bonded to a base substrate.

First, as shown in FIG. 21A, the primary substrate 30a made of single-crystal silicon is prepared and, at predetermined positions on one surface layer portion thereof, the IC circuits Gk and Gl are formed. Then, as an interlayer insulating film and a protective film in the subsequent steps, a silicon dioxide ($SiO_2$) film 36 is formed.

Figure 21B:
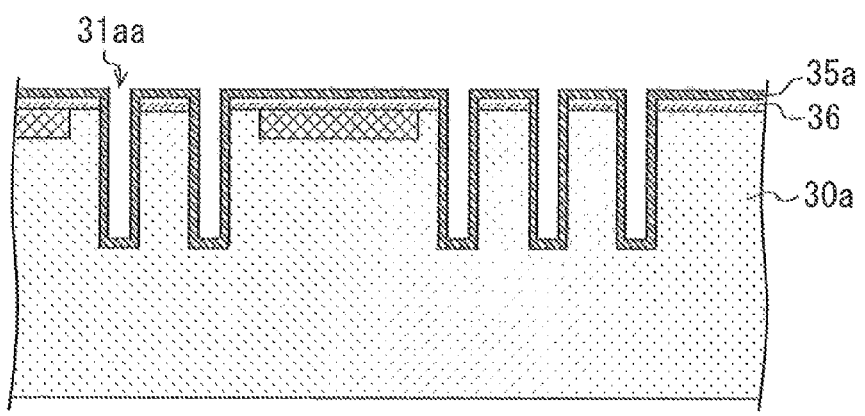

Next, as shown in FIG. 21B, by photolithography and deep reactive ion etching, the primary trenches 31aa not extending through the primary substrate 30a are formed. Thereafter, the primary conductive layer 35a is formed over the entire surface so as to cover the side walls of the primary trenches 31aa and the silicon oxide film 36 over the primary substrate 30a.

Next, by performing the step described in FIG. 3B, the dry film resist DFR is bonded to the primary substrate 30a formed with the primary conductive layer 35a.

Figure 21C:
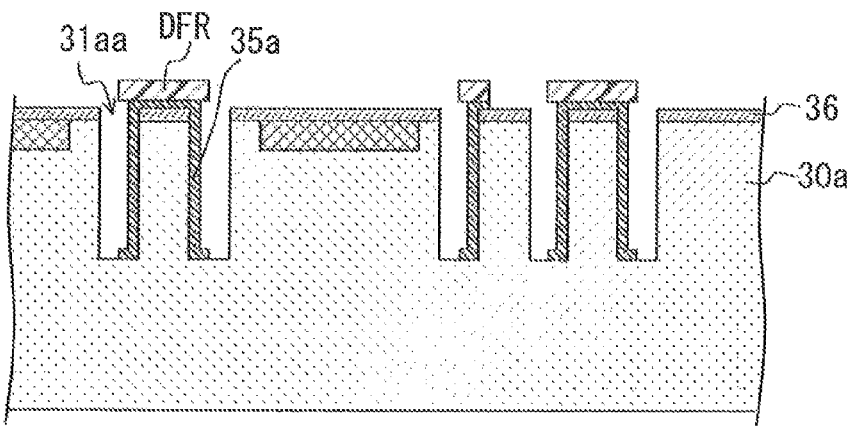

Next, as shown in FIG. 21C, the dry film resist DFR is patterned so as to protrude like eaves in the openings of the primary trenches 31aa and, using the dry film resist DFR as a mask, the primary conductive layer 35a formed in the primary trenches 31aa is anisotropically etched. In this manner, part of the primary conductive layer 35a formed on the side walls of the primary trenches 31aa and part thereof formed on the silicon oxide film 36 are removed to leave the conductive layers 35 only on the predetermined side walls.

Figure 22A:
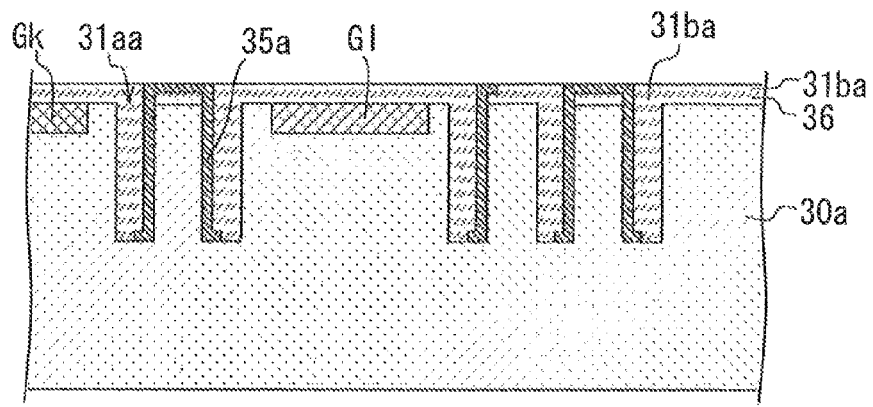
FIGS. 22A to 22C are views illustrating the method of manufacturing the region-divided substrate of FIGS. 20A and 20B, which are cross-sectional views of the manufacturing steps thereof when the IC circuits shown above are formed before the region-divided substrate is bonded to the base substrate.

Next, as shown in FIG. 22A, the primary insulator 31ba (silicon oxide film) serving as the insulators 31b of the region-divided substrate A27 is deposited on the entire first surface S1 to be buried in the primary trenches 31aa formed with the primary conductive layer 35a. Next, using the primary conductive layer 35a formed on the silicon oxide film 36 as a stopper, the primary insulator 31ba is removed by CMP or the like until the primary conductive layer 35a is exposed.

Figure 22B:
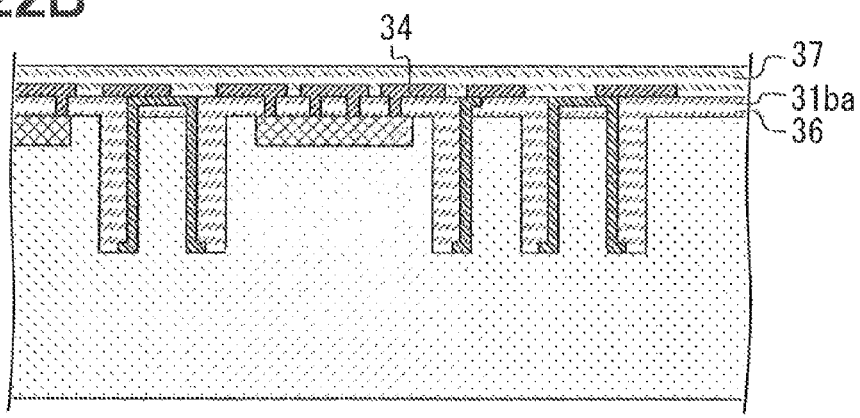

Next, as shown in FIG. 22B, contact holes to the IC circuits Gk and Gl are formed. Then, the wires and the electrode pads 34 are formed, and a protective film 37 is further formed.

Figure 22C:
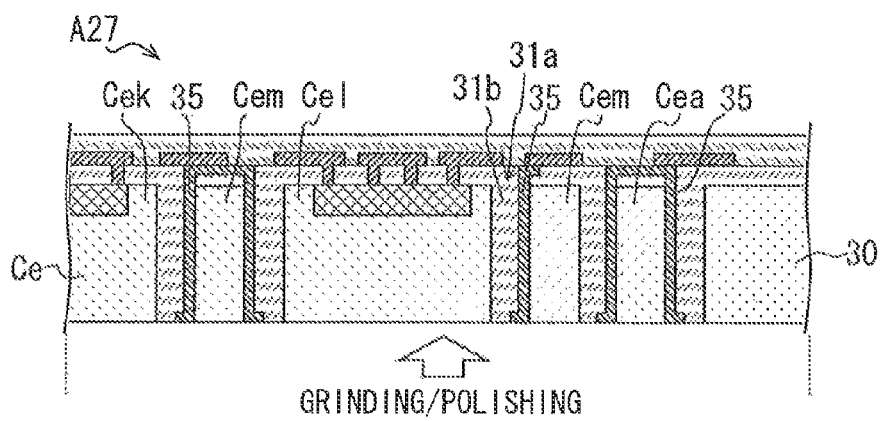

Finally, as shown in FIG. 22C, grinding/polishing is performed from the lower surface side in the drawing to expose the primary insulator 31ba buried in the primary trenches 31aa and provide the substrate 30, the trenches 31a, and the insulators 31b of the region-divided substrate A27. By the grinding/polishing, the substrate 30 is also divided into the plurality of partial regions Ce.

By the foregoing steps shown in FIGS. 21A to 22C, the region-divided substrate A27 used as the cap substrate in the semiconductor device 202 of FIGS. 20A and 20B can be manufactured.

Figure 23:
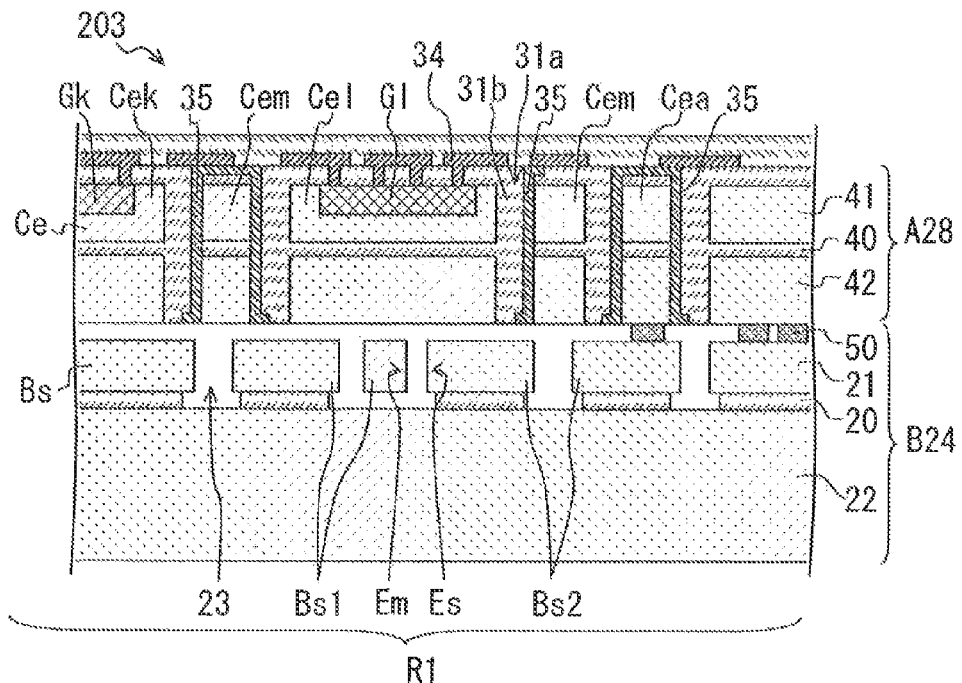
FIG. 23 is a view showing a variation of the semiconductor device shown in FIGS. 20A and 20B, which is a schematic cross-sectional view of a semiconductor device.
Figure 24:
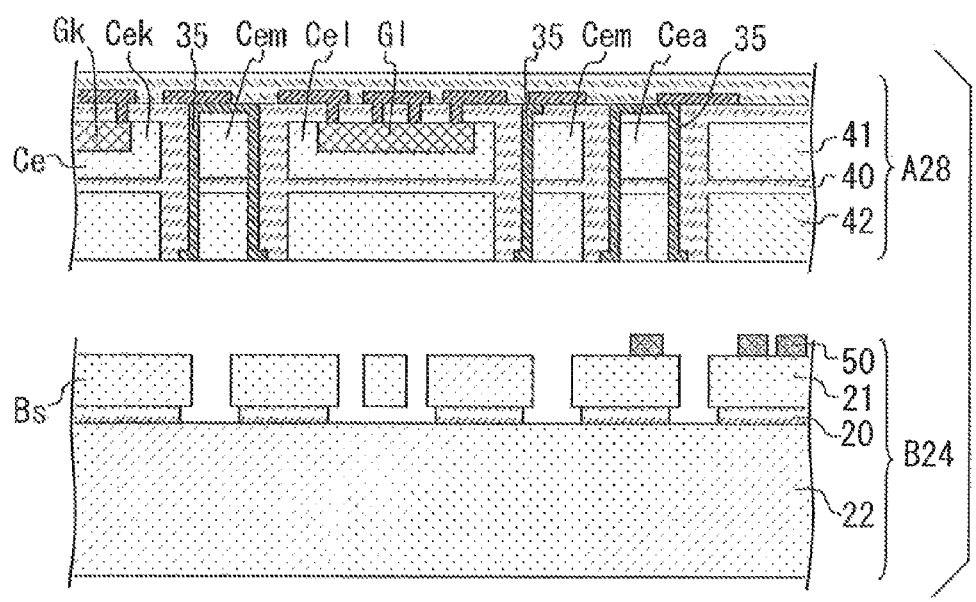
FIG. 24 is a view showing the base substrate and a region-divided substrate which form the semiconductor device of FIG. 23 in exploded relation, which is a view showing the aligning and stacking of a region-divided substrate with and on the base substrate before the bonding together thereof.
Figure 25A:
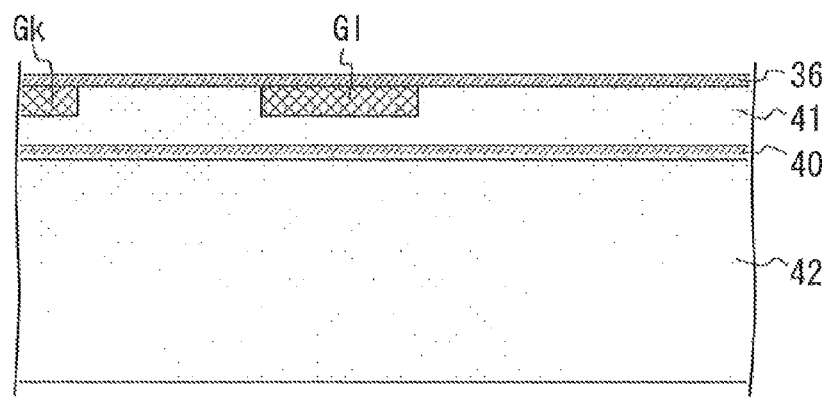
FIGS. 25A to 25C are views illustrating a method of manufacturing the region-divided substrate of FIG. 23, which are cross-sectional views of the manufacturing steps thereof when the IC circuits are formed before the region-divided substrate is bonded to the base substrate.
Figure 25B:
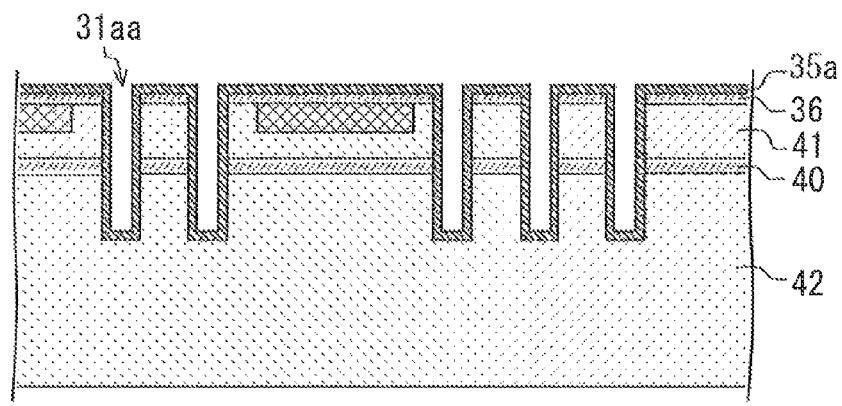
Figure 25C:
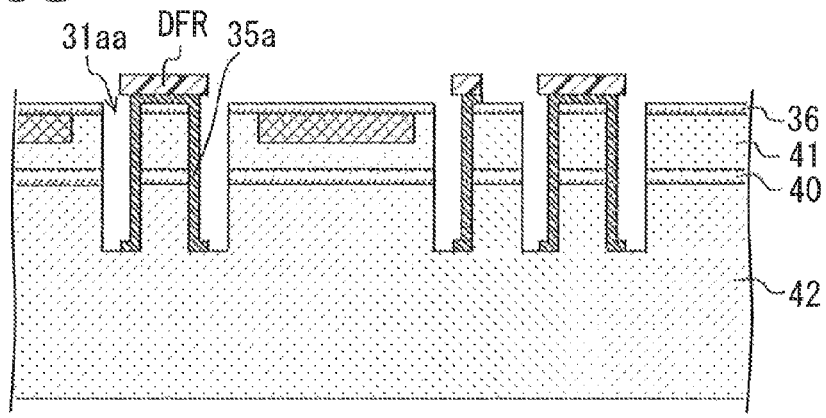
Figure 26A:
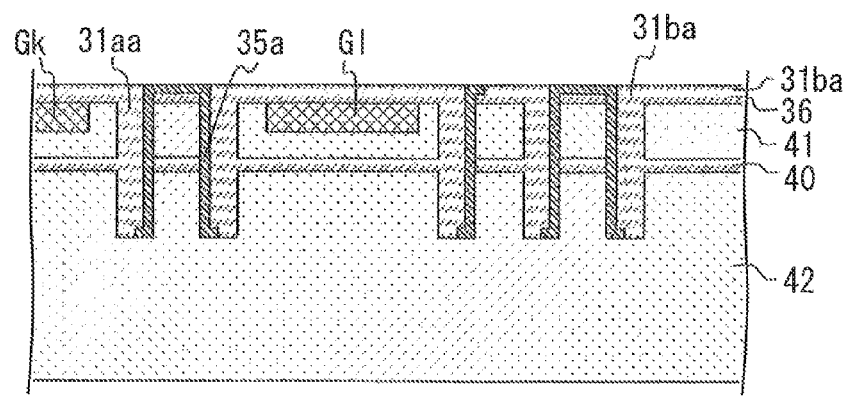
FIGS. 26A to 26C are views illustrating the method of manufacturing the region-divided substrate of FIG. 23, which are cross-sectional views of the manufacturing steps thereof when the IC circuits are formed before the region-divided substrate is bonded to the base substrate.
Figure 26B:
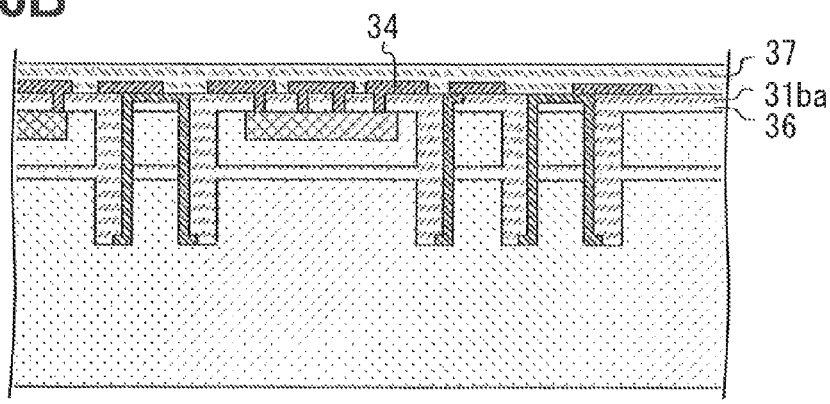
Figure 26C:
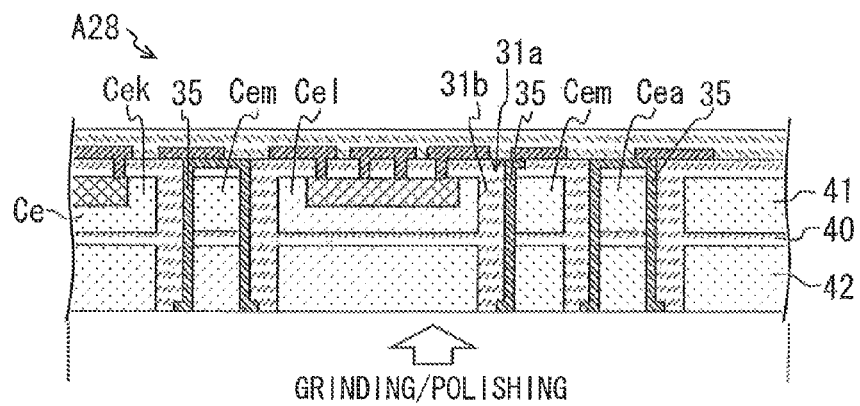

FIG. 23 is a view showing a variation of the semiconductor device 202 shown in FIGS. 20A and 20B, which is a schematic cross-sectional view of a semiconductor device 203. FIG. 24 is a view showing the base substrate B24 and a cap substrate using a region-divided substrate A28 which form the semiconductor device 203 of FIG. 23 in exploded relation, which is a view showing the aligning and stacking of the region-divided substrate A28 with and on the base substrate B24 before the bonding together thereof.

In the semiconductor device 202 shown in FIGS. 20A and 20B, as the mother substrate of the region-divided substrate A27, the single-crystal silicon substrate 30 is used. By contrast, in the semiconductor device 203 shown in FIG. 23, as the mother substrate of the region-divided substrate A28, the SOI (Silicon On Insulator) substrate having the buried oxide film 40 is used. The SOI substrate includes a SOI layer 41 and a support substrate 42 with a buried oxide film 40 being interposed therebetween, and the IC circuits Gk and Gl are formed in the surface layer portion of the SOI layer 41 over the buried oxide film 40. The IC circuits Gk and Gl formed in the region-divided substrate A28 formed of the SOI substrate of FIG. 23 can be generally provided with higher performance than that of the IC circuits Gk and Gl formed in the region-divided substrate A27 formed of the single-crystal silicon substrate 30 of FIGS. 20A and 20B.

Note that, in the region-divided substrate A28 shown in FIG. 23 also, the trenches 31a and the insulators 31b buried in the trenches 31a are formed so as to extend through the SOI layer 41 of the foregoing SOI substrate, the buried oxide film 40, and the support substrate 42. As a result, the foregoing SOI substrate is divided into the plurality of partial regions Ce. In addition, the partial region Cea having the conductive layer 35 formed on the side wall thereof is connected to the predetermined base semiconductor region Bs in the base substrate B24 to function as the extraction conductive region.

FIGS. 25A to 26C are views illustrating a method of manufacturing the region-divided substrate A28 used as the cap substrate in the semiconductor device 203 of FIG. 23, which are cross-sectional views of the manufacturing steps thereof when the IC circuits Gk and Gl are formed before the region-divided substrate A28 is bonded to the base substrate B24.

The individual manufacturing steps of the region-divided substrate A28 shown in FIGS. 25A to 26C correspond to the individual manufacturing steps of the region-divided substrate A27 shown in FIGS. 21A to 22C. Therefore, the region-divided substrate A28 can be manufactured in the same manner by the individual manufacturing steps described previously, so that a description thereof is omitted.

Figure 27:
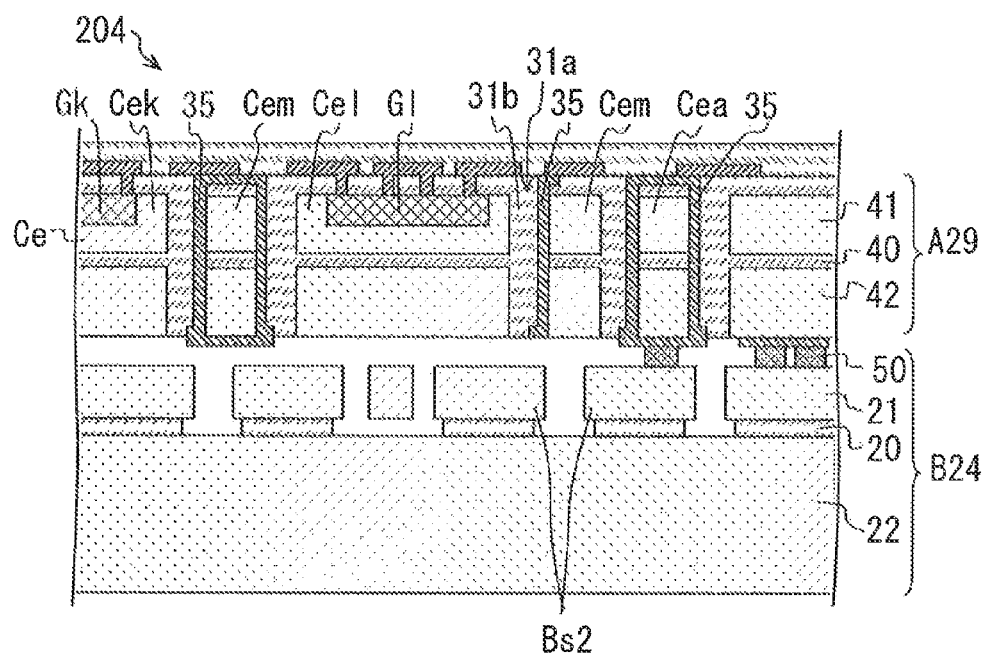
FIG. 27 is a view showing a variation of the semiconductor device shown in FIG. 23, which is a schematic cross-sectional view of a semiconductor device.

FIG. 27 is a view showing a variation of the semiconductor device 203 shown in FIG. 23, which is a schematic cross-sectional view of a semiconductor device 204.

In the region-divided substrate A28 in the semiconductor device 203 of FIG. 23, the conductive layer 35 is not formed under the partial region Cea functioning as the extraction conductive region and on the base substrate B24 side, but is formed only over the partial region Cea and the side wall thereof. By contrast, in a region-divided substrate A29 in the semiconductor device 204 of FIG. 27, the conductive layer 35 is formed not only over the partial region Cea functioning as the extraction conductive region and the side wall thereof, but also under the partial region Cea and on the base substrate B24 side so that the conductive layer 35 is formed so as to wrap around the partial region Cea. Accordingly, the resistance in the extraction conductive region in the semiconductor device 204 shown in FIG. 27 can be reduced to be lower than in the extraction conductive region in the semiconductor device 203 shown in FIG. 23.

Figure 28:
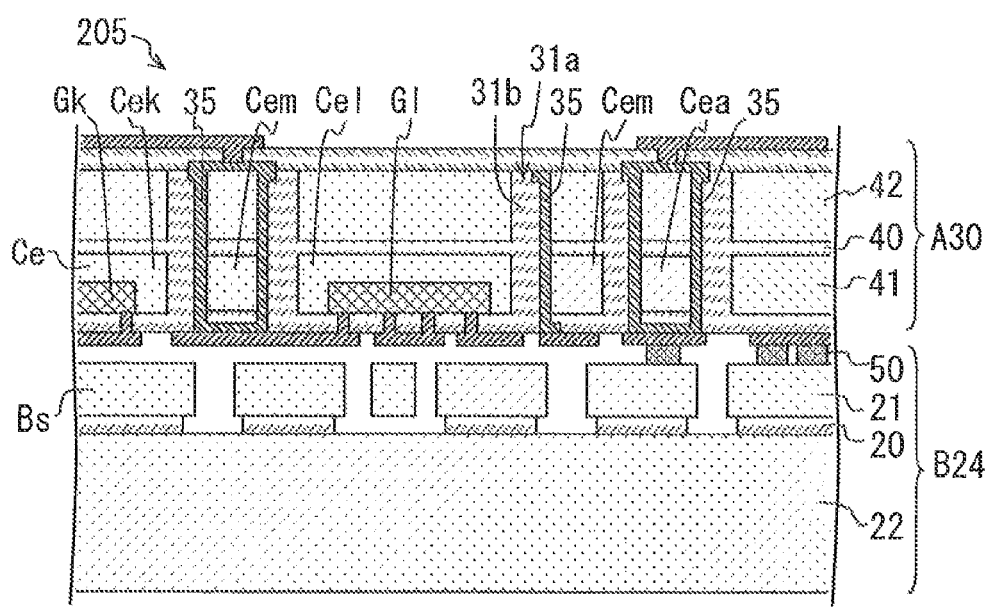
FIG. 28 is a view showing a variation of the semiconductor device shown in FIG. 27, which is a schematic cross-sectional view of a semiconductor device.

FIG. 28 is a view showing a variation of the semiconductor device 204 shown in FIG. 27, which is a schematic cross-sectional view of a semiconductor device 205.

A region-divided substrate A30 in the semiconductor device 205 of FIG. 28 basically has a configuration in which the region-divided substrate A29 of the semiconductor device 204 shown in FIG. 27 is inverted and bonded to the base substrate B24. Accordingly, in the semiconductor device 205 shown in FIG. 28, the IC circuits Gk and Gl formed in the region-divided substrate A30 are sealed in an inner portion thereof to oppose the bonded surface with the base substrate B24. This results in a configuration in which the IC circuits Gk and Gl in the semiconductor device 205 of FIG. 28 are more reliably protected than the IC circuits Gk and Gl in the semiconductor device 204 shown in FIG. 27.

Note that methods of manufacturing the foregoing region-divided substrates A29 and A30 each having the extraction conductive region in which the conductive layer 35 is formed so as to wrap around the partial region Cea have the same manufacturing steps as the individual manufacturing steps of the region-divided substrate A26 illustrated in FIGS. 17 and 18.

Figure 29A:
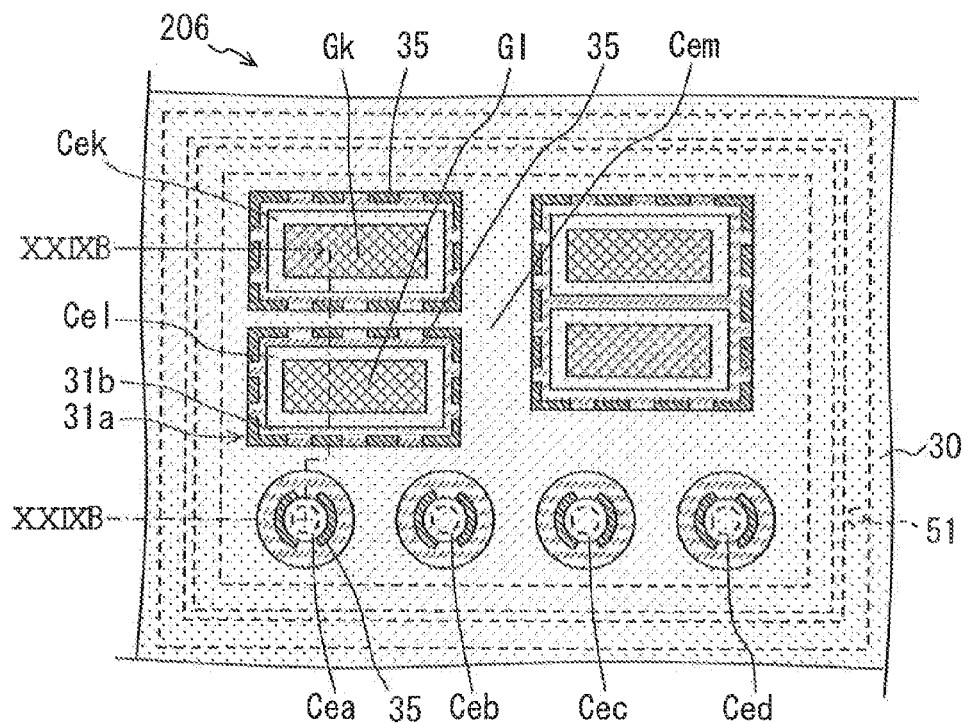
Figure 29B:
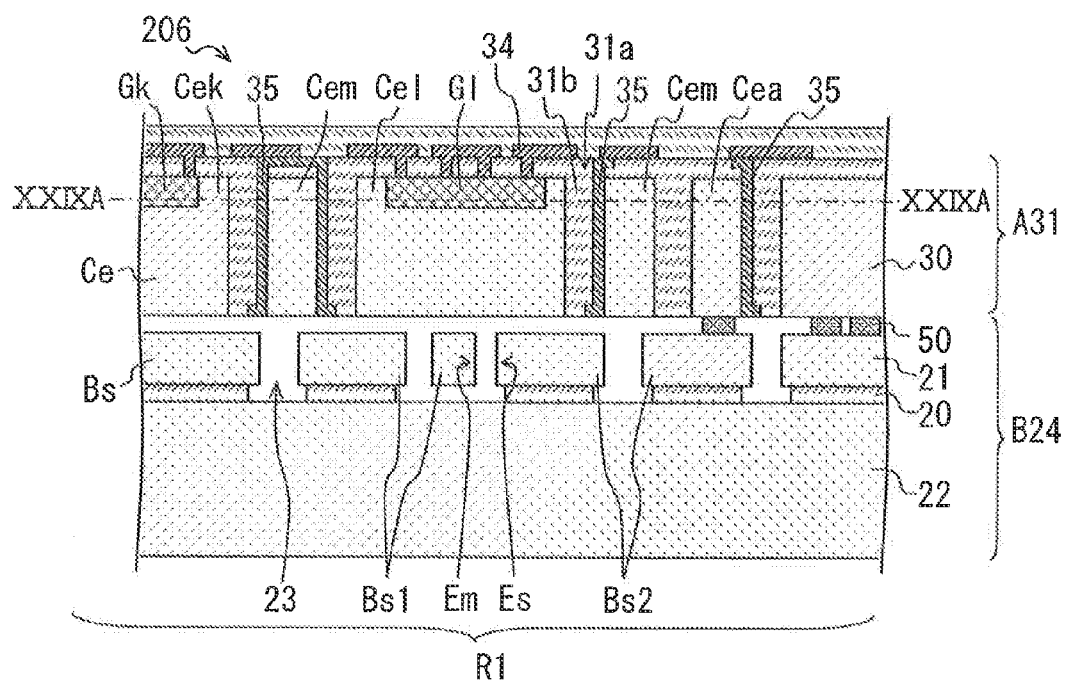
Figure 30A:
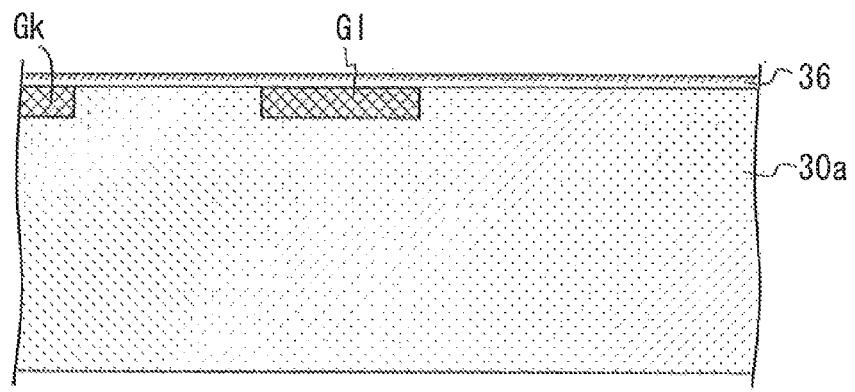
FIGS. 30A to 30C are views illustrating a method of manufacturing a region-divided substrate of FIGS. 29A and 29B, which are cross-sectional views of the manufacturing steps thereof when the IC circuits are formed before the region-divided substrate is bonded to the base substrate.
Figure 30B:
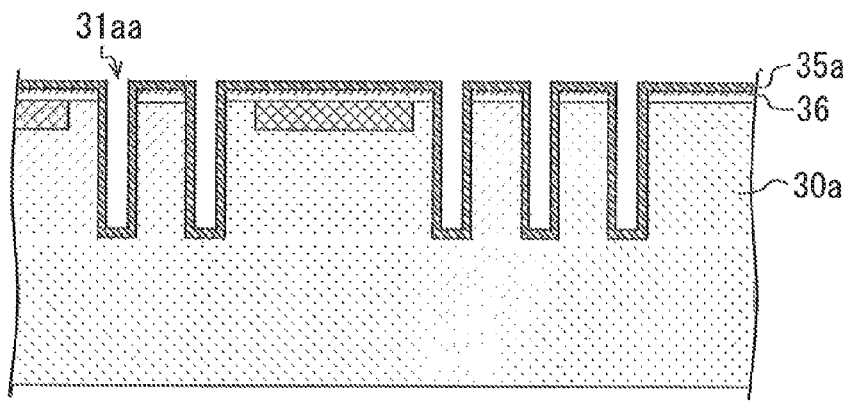
Figure 30C:
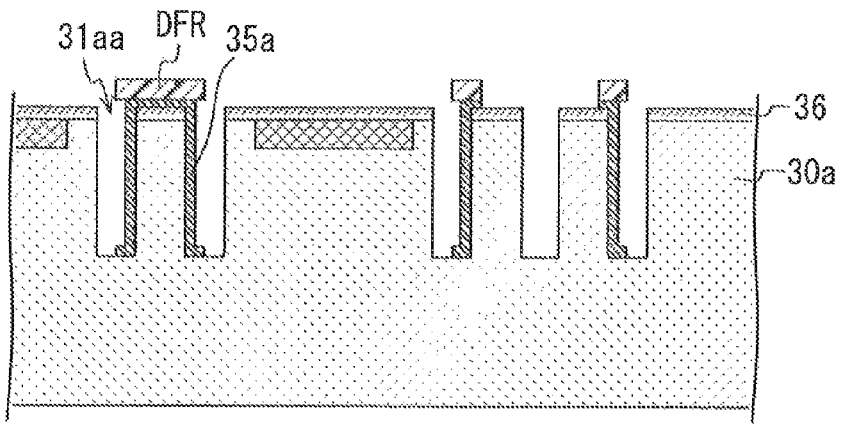
Figure 31A:
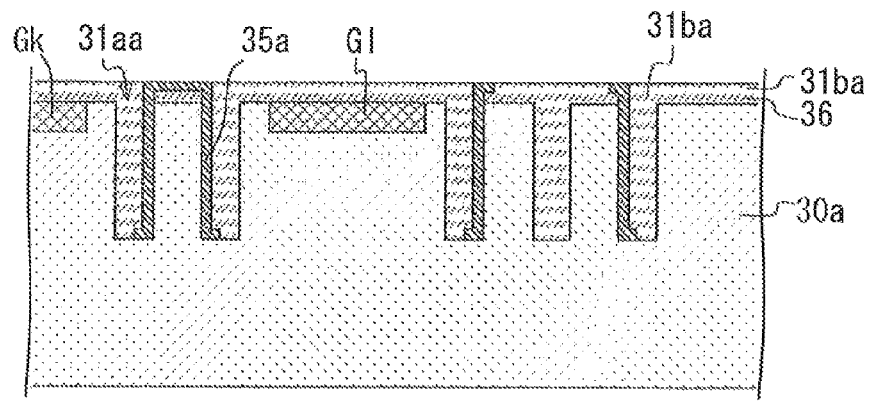
FIGS. 31A to 31C are views illustrating the method of manufacturing the region-divided substrate of FIGS. 29A and 29B, which are cross-sectional views of the manufacturing steps thereof when the IC circuits are formed before the region-divided substrate is bonded to the base substrate.
Figure 31B:
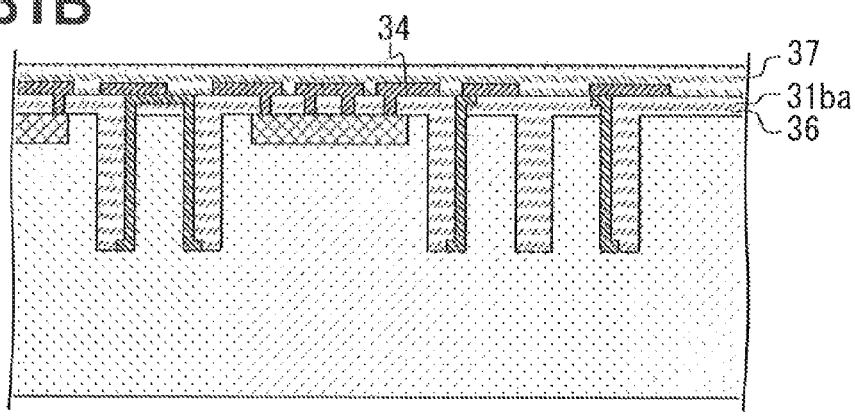
Figure 31C:
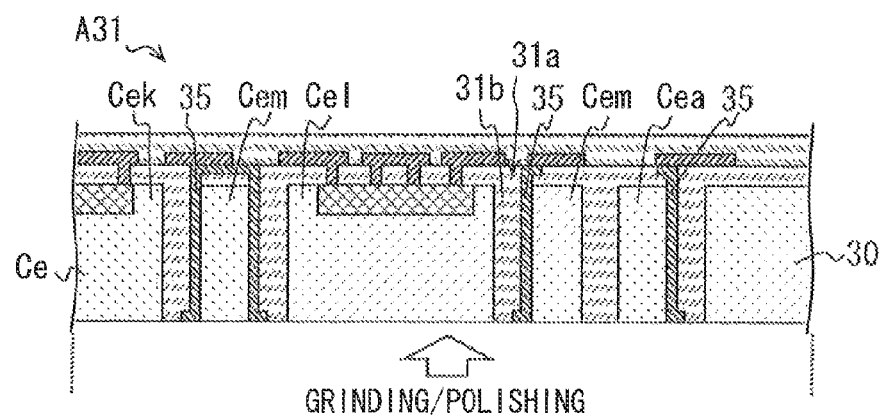

FIGS. 29A and 29B are views showing another variation of the semiconductor device 202 shown in FIGS. 20A and 20B, of which FIG. 29A is a partial plan view schematically showing a semiconductor device 206 and FIG. 29B is a cross-sectional view schematically showing the semiconductor device 206. Note that the cross-sectional view of FIG. 29B shows a cross section along a dash-dot line XXIXB-XXIXB of FIG. 29A, which is arbitrarily extended/contracted along the section line and simplified for clear illustration. FIG. 29A is a view showing a cross section along a dash-dot line XXIXA-XXIXA in FIG. 29B.

In the region-divided substrate A27 in the semiconductor device 202 of FIGS. 20A and 20B, the conductive layers 35 are formed around the entire peripheries of the side walls of the partial regions Cea to Ced functioning as the extraction conductive regions and around the entire peripheries of the side walls of the partial region Cem surrounding the partial regions Cek and Cel formed with the IC circuits Gk and Gl. By contrast, in a region-divided substrate A31 in the semiconductor device 206 of FIGS. 29A and 29B, the conductive layers 35 are formed in a slit pattern on part of the side walls of the partial regions Cea and Ced functioning as the extraction conductive regions and on part of the side was of the partial region Cem surrounding the partial regions Cek and Cel formed with the IC circuits Gk and Gl to be continuous from one surface side thereof where the region-divided substrate A31 is bonded to the base substrate B24 to the other surface side thereof opposite thereto. Accordingly, in comparison with the region-divided substrate A27 of the semiconductor device 202 shown in FIGS. 20A and 20B, the region-divided substrate A27 of the semiconductor device 206 shown in FIGS. 29A and 29B allows reliable removal of stress-related adverse effects resulting from the formation of the conductive layers 35. In particular, the effects achieved by forming the foregoing conductive layers 35 in the slit pattern on part of the side walls are generally effective to the side wall of the partial region which needs to occupy a large area, such as the partial region Cem surrounding the partial regions Cek and Cel formed with the IC circuits Gk and Gl. With the conductive layers 35 formed on part of the side walls of the partial region Cem, it is possible to remove stress-related adverse effects in the partial region Cem resulting from the formation of the conductive layers 35 without inhibiting the noise shield effect for the IC circuits Gk and Gl.

FIGS. 30A to 31C are views illustrating a method of manufacturing the region-divided substrate A31 used as the cap substrate in the semiconductor device 206 of FIGS. 29A and 29B, which are cross-sectional views of the manufacturing steps thereof when the IC circuits Gk and Gl are formed before the region-divided substrate A31 is bonded to the base substrate B24.

The individual manufacturing steps of the region-divided substrate A31 shown in FIGS. 30A to 31C correspond to the individual manufacturing steps of the region-divided substrate A27 shown in FIGS. 21A to 22C. As can be seen from a comparison between the individual manufacturing steps shown in FIGS. 30A to 31C and the individual manufacturing steps shown in FIGS. 21A to 22C, the manufacturing of the region-divided substrate A31 in which the conductive layers 35 are formed in the slit pattern on part of the side walls is the same as the manufacturing of the region-divided substrate A27 in which the conductive layers 35 are formed around the entire peripheries of the side walls, except that the configuration into which the dry film resist DFR shown in FIG. 30C and used as the etching mask is patterned is different.

Thus, the region-divided substrates A20 to A31 described above, the semiconductor devices 200 to 206 using the region-divided substrates A20 to A31, and the manufacturing methods thereof provide further improvements in the region-divided substrate A11 and the semiconductor device 100 illustrated in FIGS. 35A and 35B, which are under patent pending. The present disclosure provides a region-divided substrate in which a substrate is divided into a plurality of partial regions by a trench extending through the substrate and the partial regions are usable as extraction conductive regions, a semiconductor device using the same, and manufacturing methods thereof, which are a region divided substrate capable of only benefiting from advantages provided by forming conductive layers on the side walls of the partial regions, while allowing removal of adverse effects resulting from the formation of the conductive layers, a semiconductor device using the same, and manufacturing methods thereof.

Note that, in the semiconductor devices 200 to 206 using the region-divided substrates A20 to A31 described above, examples of a semiconductor device having dynamic quantity sensor elements each for detecting an acceleration or an angular velocity are shown. However, the semiconductor device using the region-divided substrate of the present disclosure is not limited thereto, and may also be a semiconductor device having another semiconductor sensor element such as a Gyro sensor, another dynamic quantity sensor, a MEMS (Micro Electro Mechanical System) resonator, or an infrared sensor element.

The above disclosure has the following aspects.

According to a first aspect of the present disclosure, a region-divided substrate includes: a substrate having a first surface and a second surface opposite to the first surface and having a plurality of partial regions, which are divided by a plurality of trenches, wherein each trench penetrates the substrate from the first surface to the second surface; a conductive layer having an electrical conductivity higher than the substrate and disposed on a sidewall of one of the plurality of partial regions from the first surface to the second surface; and an insulator embedded in each trench.

In the foregoing region-divided substrate, unlike in a related-art region-divided substrate which is merely divided into a plurality of partial regions by a trench, the conductive layer having the electrical conductivity higher than that of the substrate is formed on the sidewall of any of the plurality of partial regions formed by the trench to be continuous from the first surface side to the second surface side. Therefore, when the foregoing partial region having the conductive layer formed on the side wall thereof is used as an extraction conductive region, the foregoing conductive layer can be used as a main current path. In comparison with the related-art region-divided substrate merely divided into the plurality of partial regions by the trench, the resistance value of the extraction conductive region can be reduced. In addition, in the foregoing region-divided substrate, the conductive layer can be used as the main current path. Accordingly, the material of the substrate serving as the base material is not limited to a conductive or semi-conductive material. Even when an insulating material is used, the foregoing partial region formed with the conductive layer is usable as the extraction conductive region.

When the foregoing conductive layer is used as the main current path of the extraction conductive region, a material having a higher electrical conductivity is more preferred for the foregoing conductive layer. However, as long as a material having an electrical conductivity higher than that of the substrate is used, a predetermined resistance-value reducing effect can be obtained so that it is also possible to select a material having an excellent junction property with the material of the substrate serving as the mother substrate. The thickness of the foregoing conductive layer can also be set arbitrarily. For example, if the conductive layer is formed thick, the resistance value can be reduced. Conversely, the conductive layer can also be formed thin to allow a reduction in the stress applied to the surroundings.

In the foregoing region-divided substrate, the foregoing conductive layer is formed on the side wall of only any of the plurality of partial regions formed by the trench, not all the partial regions. This allows the region-divided substrate to have a configuration in which the foregoing conductive layer is formed only in the foregoing partial region used as the extraction conductive region but not in the partial region which may exert stress-related adverse effects resulting from, e.g., the formation of the foregoing conductive layer such as, e.g., the partial region which occupies a large area or where an IC circuit is formed.

Thus, the foregoing region-divided substrate is the region-divided substrate in which the substrate is divided into the plurality of partial regions by the trench extending through the substrate and the foregoing partial regions are usable as the extraction conductive regions and which only benefits from advantages provided by forming the conductive layers on the side walls of the foregoing partial regions, while allowing removal of adverse effects resulting from the formation of the conductive layers.

Alternatively, the substrate may be a single-crystal silicon substrate or a SOI substrate having a buried oxide film. As described above, the material of the substrate serving as the mother substrate of the foregoing region-divided substrate may be any material that is conductive, semi-conductive, or insulating. The substrate may be a single-crystal silicon substrate or a SOI (Silicon On Insulator) substrate having a buried oxide film which is low cost and allows easy formation of a trench therein, while also allowing an IC or the like to be formed therein. In the foregoing region-divided substrate in which any of the partial regions has the conductive layer formed on the side wall thereof, even when, e.g., a single-crystal silicon substrate having a relatively high specific resistance is used, it is possible to cause the foregoing partial region formed with the conductive layer to function as the extraction conductive region having a small specific resistance value.

Alternatively, each trench may have a tapered shape. This facilitates the formation of the conductive layer on the side wall of the foregoing partial region and the burying of the insulator into the foregoing trench.

Alternatively, the one of the plurality of partial regions may have an area smaller than a predetermined area. This allows removal of stress-related adverse effects resulting from the formation of the conductive layers, as described above.

Alternatively, the conductive layer may be partially disposed on the sidewall, and the conductive layer may be continuously disposed on the sidewall from the first surface to the second surface. This also allows removal of stress-related adverse effects resulting from the formation of the conductive layers.

Alternatively, the conductive layer may be made of a metal layer, a silicon layer having an impurity concentration higher than a predetermined value, a metal silicide layer, or a multi-layered structure of at least two of the metal layer, the silicon layer, and the metal silicide layer.

Alternatively, the conductive layer may cover at least one of the first surface and the second surface of the one of the plurality of partial regions in addition to the sidewall. The configuration allows easier electrical bonding to the conductive layer covering at least one of the foregoing first surface and second surface than in the case where the conductive layer is formed only on the side wall and, when the partial region is used as, e.g., the extraction conductive region, the resistance value can further be reduced.

Alternatively, the insulator may be made of silicon oxide.

Alternatively, the insulator may be continuously disposed in each trench from the first surface to the second surface. However, the configuration is not limited thereto. For example, to reduce a parasitic capacitance, the foregoing insulator may also be buried only in the foregoing first surface or in the foregoing second surface.

Alternatively, the conductive layer may be further disposed on a sidewall of another one of the plurality of partial regions from the first surface to the second surface. The one of the plurality of partial regions is arranged adjacent to the another one of the plurality of partial regions, and the one of the plurality of partial regions and the another one of the plurality of partial regions sandwich the insulator in a corresponding trench so that a feedthrough capacitor is provided.

According to a second aspect of the present disclosure, a semiconductor device includes: the region-divided substrate according to the first aspect, which provides a cap substrate; and a base substrate made of semiconductor and having a plurality of base semiconductor regions, which are isolated from each other, and disposed in a surface portion of the base substrate. The cap substrate is bonded to the base substrate in such a manner that the cap substrate faces a predetermined region of the surface portion of the base substrate. Space between the predetermined region and the cap substrate is sealed, and the one of the plurality of partial regions is an extraction conductive region, which is electrically connected to a predetermined base semiconductor region.

In the foregoing semiconductor device, the cap substrate using the foregoing region-divided substrate bonded to the base substrate functions as a sealing cap for protecting various elements formed in the predetermined region of the surface layer portion of the base substrate. Also, in the foregoing cap substrate, the plurality of dielectrically isolated partial regions are formed, and the partial region having the conductive layer formed on the side wall thereof is electrically connected to the predetermined dielectrically isolated base semiconductor region to function as the extraction conductive region.

In the semiconductor device using the foregoing region-divided substrate as the cap substrate, unlike in a related-art semiconductor device using a cap substrate which is merely divided into a plurality of partial regions by a trench, the conductive layer having the high electrical conductivity is formed on the side wall of any of the plurality of partial regions separated by the trench in the cap substrate. Therefore, in the extraction conductive region formed of the partial region having the conductive layer formed on the side wall thereof in the foregoing semiconductor device, the resistance value can be reduced to be smaller than that in the related-art semiconductor device.

In addition, in the foregoing semiconductor device, an area occupied by the extraction conductive region formed of the partial region having the conductive layer formed on the side wall thereof can be generally reduced to be smaller than that occupied by another partial region where, e.g., an IC circuit is formed. Therefore, in the extraction conductive region, even if the conductive layer is formed on the side wall thereof, stress-related adverse effects can be ignored.

In the foregoing semiconductor device, the material of the substrate serving as the mother substrate of the region-divided substrate used as the cap substrate may be any substrate material that is conductive, semi-conductive, or insulating since, as described above, the conductive layer formed on the side wall of the partial region is used as the main current path. Even when, e.g., a single-crystal silicon substrate or a SOI substrate is used, the substrate serving as the mother substrate may have any impurity concentration. Therefore, as will be described later, the cap substrate in the foregoing semiconductor device can be used for various applications by forming various elements or IC circuits therein without being limited to the use thereof as the extraction conductive region.

Note that, needless to say, in the foregoing semiconductor device, an electrical connection using wire bonding or face-down bonding (ball bonding) can be made to the extraction conductive region exposed at the outside surface of the cap substrate bonded to the base substrate which is opposite to the bonded surface thereof.

Thus, the foregoing semiconductor device is the semiconductor device in which the substrate is divided into the plurality of partial regions by the trench extending through the substrate and the foregoing partial regions are usable as the extraction conductive regions. Accordingly, a small-size and low-cost semiconductor device can be provided in which various elements formed in the surface layer portion of the base substrate are protected by the cap substrate, the resistance value of the extraction conductive region in the cap substrate is small, face-down bonding is also possible, and mounting restrictions have been reduced.

In addition, the foregoing semiconductor device only benefits from advantages provided by forming the conductive layers on the side walls of the foregoing partial regions in the cap substrate formed of the region-divided substrate, while allowing removal of adverse effects resulting from the formation of the conductive layers.

Alternatively, the conductive layer may be partially disposed on the sidewall of the one of the plurality of partial regions as the extraction conductive region. This also allows removal of stress-related adverse effects resulting from the formation of the conductive layers, as described above.

Alternatively, the base substrate or the cap substrate may further include a convexity having an electrical conductivity. The convexity is electrically coupled to the predetermined base semiconductor region, and the base substrate and the cap substrate are bonded to each other via the convexity. Further, the convexity may be made of single crystal silicon, poly crystal silicon or metal.

Alternatively, the base substrate may be made of a SOI substrate having a buried oxide film. Each base semiconductor region is disposed in a SOI layer, and each base semiconductor region is electrically isolated from a surrounding region by a base substrate trench, which reaches the buried oxide film. The SOI layer may be made of either single-crystal silicon or polysilicon.

Alternatively, the semiconductor device may further include: a dynamic quantity sensor element. One of the plurality of base semiconductor regions is a movable semiconductor region having a movable electrode, which is displaceable and a part of the buried oxide film under the movable electrode is removed in a sacrifice etching. Another one of the base semiconductor regions is a fixed semiconductor region having a fixed electrode, which faces the movable electrode. An electrostatic capacitor is provided between the movable electrode and the fixed electrode, and has a dielectric layer provided space between the movable electrode and the fixed electrode. Each of the movable semiconductor region and the fixed semiconductor region is coupled with a respective extraction conductive region. The movable electrode is displaceable in a direction perpendicular to a facing surface of the movable electrode in accordance with a dynamic quantity applied to the semiconductor device. An electrostatic capacitance of the electrostatic capacitor is changeable in accordance with a distance change between the movable electrode and the fixed electrode, and the electrostatic capacitance is measured so that the dynamic quantity is detected. Further, the dynamic quantity may be acceleration or angular velocity. The foregoing semiconductor device having the dynamic quantity sensor element is a semiconductor device in which a sealing cap is disposed over the dynamic quantity sensor element formed in the surface layer portion of the base substrate formed of the semiconductor so as to protect the dynamic quantity sensor element of the foregoing base substrate, which can be manufactured in a small size at low cost. Accordingly, a semiconductor device can be formed in which face-down bonding is also possible, and mounting restrictions have been reduced.

Alternatively, the cap substrate may be made of a single-crystal silicon substrate or a SOI substrate having a buried oxide film, and another one of the plurality of partial regions includes an IC circuit. Further, the another one of the plurality of partial regions may have a sidewall, on which no conductive layer is disposed, and an adjacent one of the plurality of partial regions, which surrounds the another one of the plurality of partial regions, has a sidewall, on which the conductive layer is disposed in such a manner that the insulator is disposed between the conductive layer and the another one of the plurality of partial regions. According to the configuration, the conductive layer is not formed on the side wall of the partial region where the IC circuit is formed. This allows removal of adverse effects resulting from, e.g., the formation of the conductive layer such as electric leakage. On the other hand, on the side wall of the partial region surrounding the partial region where the IC circuit is formed, the conductive layer is formed. Therefore, it is possible to cause the conductive layer to function as a noise shield.

Alternatively, the conductive layer may be partially disposed on the sidewall of the adjacent one of the plurality of partial regions. This allows, in the partial region surrounding the partial region where the IC circuit is formed and which generally needs to occupy a large area, removal of stress-related adverse effects resulting from the formation of the conductive layer without inhibiting the noise shield effect of the conductive layer formed on the part of the side wall.

Alternatively, the base substrate and the cap substrate may be bonded together via a conductive adhesive.

According to a third aspect of the present disclosure, a method of manufacturing the region-divided substrate according to the first aspect, includes: forming a first trench on the first surface of the substrate, wherein the first trench has a predetermined depth, and does not penetrates the substrate; forming the conductive layer to cover a sidewall of the trench; removing a part of the conductive layer on the sidewall of the first trench so that the conductive layer is patterned; filling the first trench with the insulator; grinding the first surface of the substrate to expose the substrate or the conductive layer on the substrate so that the first surface of the substrate is prepared; and grinding the second surface of the substrate after the filling of the first trench so that the second surface of the substrate is prepared, and the insulator is exposed so that the conductive layer and the insulator are prepared. Thus, the foregoing region-divided substrate recited in the first aspect can be manufactured.

Alternatively, in the removing of the part of the conductive layer, a dry film resist may be used as a mask. The dry film resist is a film thicker than a coated resist, and has a higher strength. Therefore, the dry film resist can be patterned so as to protrude like eaves in the opening of the primary trench and used as an etching mask for the foregoing primary conductive layer formed in the primary trench. This allows the primary conductive layer on the side wall intended to be left can be reliably protected. Therefore, it is possible to finally form the conductive layer only on the side wall of the predetermined partial region or form the conductive layer on a part of the side wall with high accuracy.

Alternatively, the filling of the first trench may be performed after the removing of the part of the conductive layer, and the grinding of the first surface of the substrate may be performed after the filling of the first trench. Further, the filling of the first trench may include: burying a sacrificial layer on a bottom of the first trench; and burying the insulator on the sacrificial layer. The grinding of the second surface of the substrate may include: grinding the second surface of the substrate so that the sacrificial layer is exposed on the second surface; and removing the sacrificial layer by an etching method. As a result, in manufacturing the region-divided substrate in which, e.g., the insulator is buried only in the first surface, the grinding in the second surface forming step can be performed in a state where the sacrificial layer is buried in the trench. Therefore, it is possible to suppress the cracking or chipping of the substrate resulting from the grinding.

According to a fourth aspect of the present disclosure, a method of manufacturing the semiconductor device according to the second aspect, includes: preparing the base substrate having the plurality of base semiconductor regions isolated from each other and disposed in the surface portion of the base substrate; preparing the cap substrate provided by the region-divided substrate, which is to be bonded to the base substrate, wherein the plurality of partial regions are divided by the trench penetrating the cap substrate; and bonding the cap substrate and the base substrate in such a manner that the cap substrate faces the predetermined region of the surface portion of the base substrate. Space between the predetermined region and the cap substrate is sealed, and the extraction conductive region is electrically connected to the predetermined base semiconductor region. This allows the foregoing semiconductor device recited in the second aspect to be manufactured.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A region-divided substrate comprising:
a substrate having a first surface and a second surface opposite to the first surface and having a plurality of partial regions, which are divided by a plurality of trenches, wherein each trench penetrates the substrate from the first surface to the second surface;
a conductive layer having an electrical conductivity higher than the substrate and disposed on a sidewall of only one of the plurality of partial regions from the first surface to the second surface; and
an insulator embedded in each trench,
wherein the only one of the plurality of partial regions is an extraction conductive region, which is electrically connected to an electrode.

2. The region-divided substrate according to claim 1, wherein the substrate is a single-crystal silicon substrate or a SOI substrate having a buried oxide film.

3. The region-divided substrate according to claim 1 wherein each trench has a tapered shape.

4. The region-divided substrate according to claim 1, wherein the one of the plurality of partial regions has an area smaller than a predetermined area.

5. The region-divided substrate according to claim 1, wherein the conductive layer comprises a plurality of portions each continuously disposed on the sidewall from the first surface to the second surface in a slit pattern.

6. The region-divided substrate according to claim 1, wherein the conductive layer is made of a metal layer, a silicon layer having an impurity concentration higher than a predetermined value, a metal silicide layer, or a multi-layered structure of at least two of the metal layer, the silicon layer, and the metal silicide layer.

7. The region-divided substrate according to claim 1, wherein the conductive layer covers at least one of the first surface and the second surface of the one of the plurality of partial regions in addition to the sidewall.

8. The region-divided substrate according to claim 1, wherein the insulator is made of silicon oxide.

9. The region-divided substrate according to claim 1, wherein the insulator is continuously disposed in each trench from the first surface to the second surface.

10. The region-divided substrate according to claim 1, wherein the conductive layer is further disposed on a sidewall of another one of the plurality of partial regions from the first surface to the second surface,
wherein the one of the plurality of partial regions is arranged adjacent to the another one of the plurality of partial regions, and
wherein the one of the plurality of partial regions and the another one of the plurality of partial regions sandwich the insulator in a corresponding trench so that a feedthrough capacitor is provided.

11. A semiconductor device comprising:
the region-divided substrate according to claim 1, which provides a cap substrate; and
a base substrate made of semiconductor and having a plurality of base semiconductor regions, which are isolated from each other, and disposed in a surface portion of the base substrate,
wherein the cap substrate is bonded to the base substrate in such a manner that the cap substrate faces a predetermined region of the surface portion of the base substrate,
wherein space between the predetermined region and the cap substrate is sealed, and
wherein the extraction conductive region is electrically connected to a predetermined base semiconductor region.

12. The semiconductor device according to claim 11, wherein the conductive layer is partially disposed on the sidewall of the one of the plurality of partial regions as the extraction conductive region.

13. The semiconductor device according to claim 11, wherein the base substrate or the cap substrate further includes a convexity having an electrical conductivity,
wherein the convexity is electrically coupled to the predetermined base semiconductor region, and
wherein the base substrate and the cap substrate are bonded to each other via the convexity.

14. The semiconductor device according to claim 13, wherein the convexity is made of single crystal silicon, poly crystal silicon or metal.

15. The semiconductor device according to claim 11, wherein the base substrate is made of a SOI substrate having a buried oxide film,
wherein each base semiconductor region is disposed in a SOI layer, and
wherein each base semiconductor region is electrically isolated from a surrounding region by a base substrate trench, which reaches the buried oxide film.

16. The semiconductor device according to claim 15, further comprising:
a dynamic quantity sensor element,
wherein one of the plurality of base semiconductor regions is a movable semiconductor region having a movable electrode, which is displaceable and a part of the buried oxide film under the movable electrode is removed in a sacrifice etching,
wherein another one of the base semiconductor regions is a fixed semiconductor region having a fixed electrode, which faces the movable electrode,
wherein an electrostatic capacitor is provided between the movable electrode and the fixed electrode, and has a dielectric layer provided space between the movable electrode and the fixed electrode,
wherein each of the movable semiconductor region and the fixed semiconductor region is coupled with a respective extraction conductive region,
wherein the movable electrode is displaceable in a direction perpendicular to a facing surface of the movable electrode in accordance with a dynamic quantity applied to the semiconductor device,
wherein an electrostatic capacitance of the electrostatic capacitor is changeable in accordance with a distance change between the movable electrode and the fixed electrode, and
wherein the electrostatic capacitance is measured so that the dynamic quantity is detected.

17. The semiconductor device according to claim 16, wherein the dynamic quantity is acceleration or angular velocity.

18. The semiconductor device according to claim 11,
wherein the cap substrate is made of a single-crystal silicon substrate or a SOI substrate having a buried oxide film, and
wherein another one of the plurality of partial regions includes an IC circuit.

19. The semiconductor device according to claim 18,
wherein the another one of the plurality of partial regions has a side a on which no conductive layer is disposed, and,
wherein an adjacent one of the plurality of partial regions, which surrounds the another one of the plurality of partial regions, has a sidewall, on which the conductive layer is disposed in such a manner that the insulator is disposed between the conductive layer and the another one of the plurality of partial regions.

20. The semiconductor device according to claim 19, wherein the conductive layer is partially disposed on the sidewall of the adjacent one of the plurality of partial regions.

21. The semiconductor device according to claim 11, wherein the base substrate and the cap substrate are bonded together via a conductive adhesive.

* * * * *